United States Patent
Toyotaka et al.

(10) Patent No.: US 11,948,515 B2
(45) Date of Patent: Apr. 2, 2024

(54) DISPLAY DEVICE AND ELECTRONIC DEVICE

(71) Applicant: Semiconductor Energy Laboratory Co., Ltd., Atsugi (JP)

(72) Inventors: Kouhei Toyotaka, Atsugi (JP); Kiyotaka Kimura, Isehara (JP); Hidetomo Kobayashi, Isehara (JP); Kei Takahashi, Isehara (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 17/911,147

(22) PCT Filed: Mar. 15, 2021

(86) PCT No.: PCT/IB2021/052112
§ 371 (c)(1),
(2) Date: Sep. 13, 2022

(87) PCT Pub. No.: WO2021/191721
PCT Pub. Date: Sep. 30, 2021

(65) Prior Publication Data
US 2023/0138701 A1    May 4, 2023

(30) Foreign Application Priority Data

Mar. 27, 2020    (JP) ................. 2020-058439

(51) Int. Cl.
*G09G 3/3275*    (2016.01)
*H10K 59/12*    (2023.01)

(52) U.S. Cl.
CPC ... *G09G 3/3275* (2013.01); *G09G 2300/0809* (2013.01); *G09G 2310/0291* (2013.01); *G09G 2330/021* (2013.01); *H10K 59/12* (2023.02)

(58) Field of Classification Search
CPC .......... G09G 3/3275; G09G 2300/0809; G09G 2310/0291; G09G 2330/021; H10K 59/12
See application file for complete search history.

(56) References Cited

U.S. PATENT DOCUMENTS

| 7,248,232 B1 | 7/2007 | Yamazaki et al. |
| 7,339,511 B2 | 3/2008 | Son et al. |

(Continued)

FOREIGN PATENT DOCUMENTS

| JP | 05-307368 A | 11/1993 |
| JP | 2000-002856 A | 1/2000 |

(Continued)

OTHER PUBLICATIONS

International Search Report (Application No. PCT/IB2021/052112) dated Jun. 22, 2021.

(Continued)

*Primary Examiner* — Amare Mengistu
*Assistant Examiner* — Jennifer L Zubajlo
(74) *Attorney, Agent, or Firm* — Eric J. Robinson; Robinson Intellectual Property Law Office, P.C.

(57) ABSTRACT

A low-power display device is provided. The display device is provided with a plurality of display portions. A data driver circuit and an addition circuit are provided to have a region overlapping with the display portion. First analog data is output from the data driver circuit in the case where first digital data consisting of a first digital value is input to the data driver circuit, whereas second analog data is output from the data driver circuit in the case where second digital data consisting of a second digital value is input to the data driver circuit. The addition circuit generates analog data corresponding to digital data that has a high-order bit that is the first digital value and a low-order bit that is the second digital value, by adding the second analog data to the first (Continued)

analog data. An output terminal of the data driver circuit is directly connected to an input terminal of the addition circuit without through an amplifier circuit.

13 Claims, 35 Drawing Sheets

(56) References Cited

U.S. PATENT DOCUMENTS

| | | |
|---|---|---|
| 8,508,967 B2 | 8/2013 | Yamazaki et al. |
| 8,605,010 B2 | 12/2013 | Yamazaki et al. |
| 9,991,265 B2 | 6/2018 | Yamazaki et al. |
| 10,957,720 B2 | 3/2021 | Takahashi et al. |
| 11,120,764 B2 | 9/2021 | Takahashi et al. |
| 11,423,844 B2 | 8/2022 | Ikeda et al. |
| 2007/0030192 A1* | 2/2007 | Son .......................... G09G 3/20 341/156 |
| 2007/0097021 A1 | 5/2007 | Yamazaki et al. |
| 2009/0051575 A1 | 2/2009 | Lee et al. |
| 2017/0092177 A1* | 3/2017 | Kobayashi ............ G09G 3/2074 |
| 2017/0178586 A1* | 6/2017 | Kim ........................ G09G 3/003 |
| 2017/0358254 A1* | 12/2017 | Inoue ................... G09G 3/3648 |

FOREIGN PATENT DOCUMENTS

| | | |
|---|---|---|
| JP | 2007-041537 A | 2/2007 |
| KR | 10-0633537 | 10/2006 |
| KR | 2009-0020030 A | 2/2009 |
| KR | 2017-0075618 A | 7/2017 |
| WO | WO-2019/123064 | 6/2019 |
| WO | WO-2019/220278 | 11/2019 |

OTHER PUBLICATIONS

Written Opinion (Application No. PCT/IB2021/052112) dated Jun. 22, 2021.

* cited by examiner

FIG. 5A1
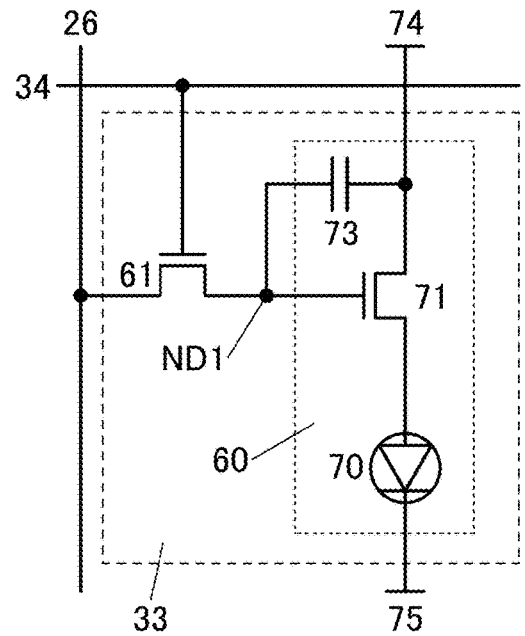
FIG. 5A2
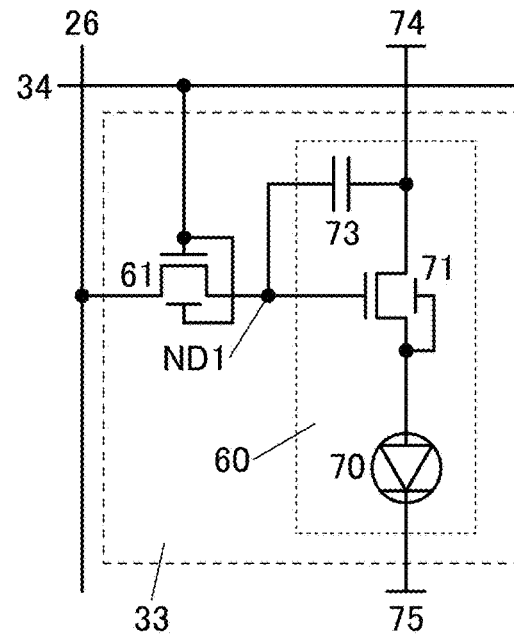
FIG. 5B1
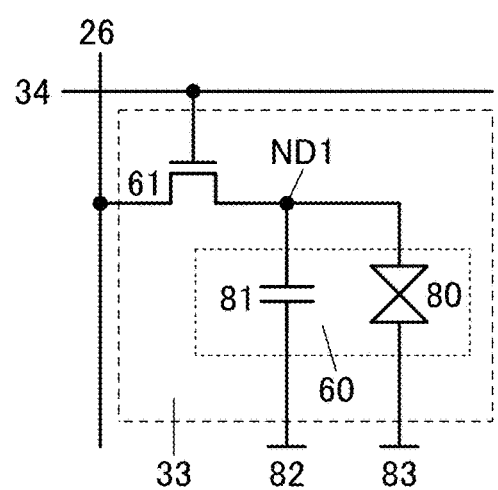
FIG. 5B2
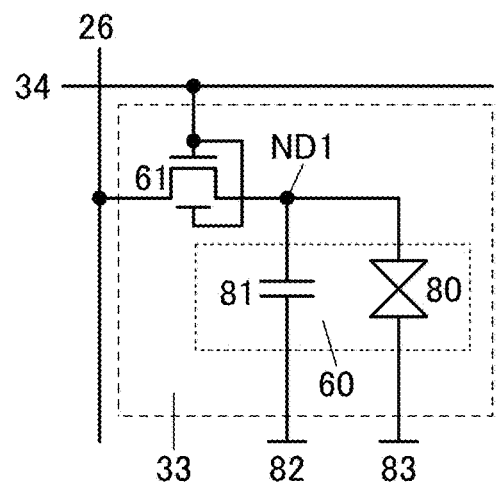

FIG. 21
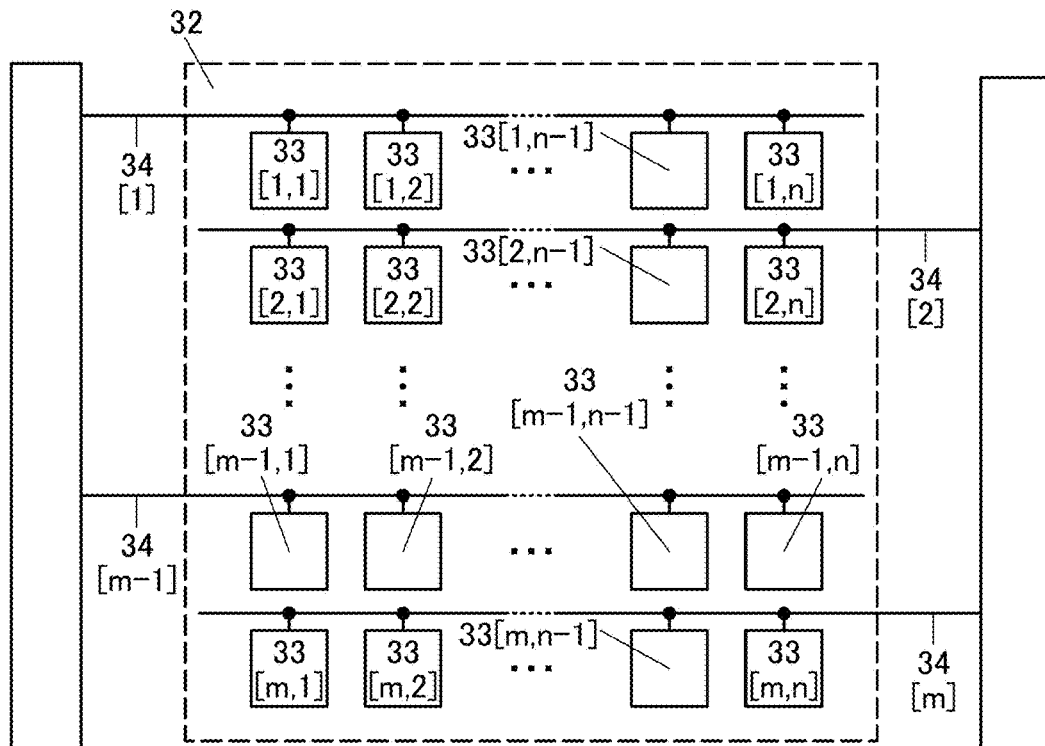
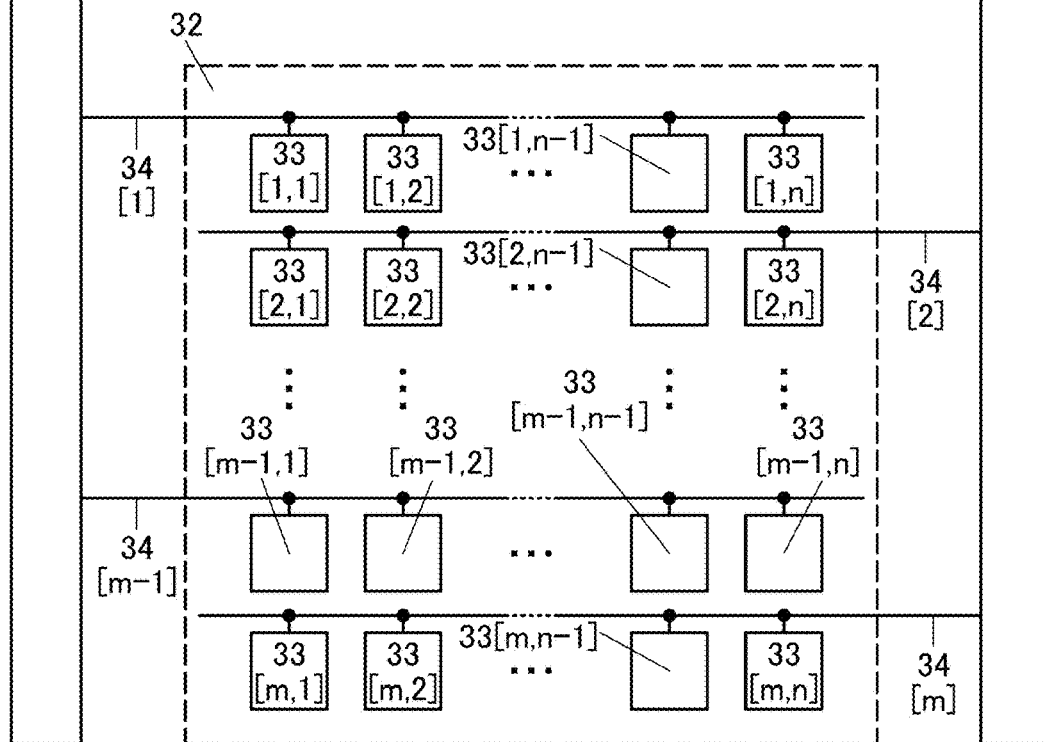

FIG. 33A
| Amorphous | Intermediate state / New crystalline phase — Crystalline | Crystal |
|---|---|---|
| • completely amorphous | • CAAC<br>• nc<br>• CAC<br><br>excluding single crystal and poly crystal | • single crystal<br>• poly crystal |
FIG. 33B
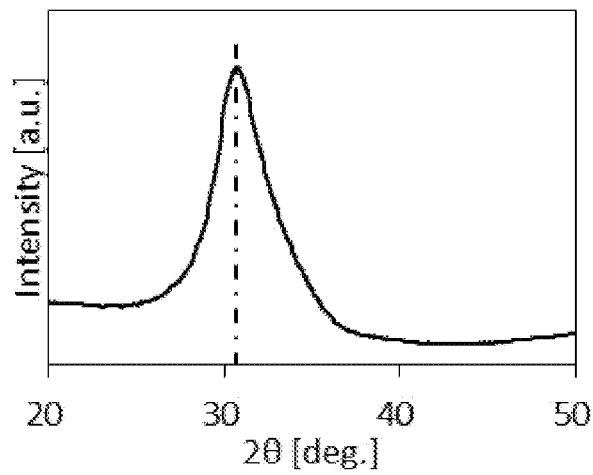
FIG. 33C
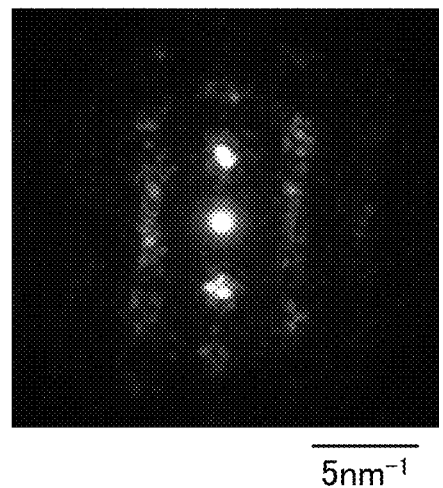

DISPLAY DEVICE AND ELECTRONIC DEVICE

TECHNICAL FIELD

One embodiment of the present invention relates to a display device. One embodiment of the present invention relates to an electronic device.

Note that one embodiment of the present invention is not limited to the above technical field. Examples of the technical field of one embodiment of the present invention include a semiconductor device, a display device, a light-emitting device, a display system, an electronic device, a lighting device, an input device (e.g., a touch sensor), an input-output device (e.g., a touch panel), a driving method thereof, and a manufacturing method thereof.

In this specification and the like, a semiconductor device refers to every device that can function by utilizing semiconductor characteristics. A display device (a liquid crystal display device, a light-emitting display device, and the like), a projection device, a lighting device, an electro-optical device, a power storage device, a memory device, a semiconductor circuit, an imaging device, an electronic device, and the like can sometimes be regarded as a semiconductor device. Alternatively, they can sometimes be regarded as including a semiconductor device.

BACKGROUND ART

As electronic devices with display devices for augmented reality (AR) or virtual reality (VR), wearable electronic devices and stationary electronic devices are becoming widespread. Examples of wearable electronic devices include a head-mounted display (HMD) and an eyeglass-type electronic device. Examples of stationary electronic devices include a head-up display (HUD).

When using an electronic device such as an HMD with a small distance between a display portion and a user, the user is likely to perceive pixels and strongly feels granularity, whereby the sense of immersion and realistic feeling of AR and VR might be diminished. Therefore, an HMD preferably includes a display device that has so high a pixel density that pixels are not perceived by the user. The pixel density of the display device is preferably 1000 ppi or more, 5000 ppi or more, or 7000 ppi or more, for example. Patent Document 1 discloses a method in which an HMD having a high pixel density is achieved by using transistors capable of high-speed driving.

REFERENCE

Patent Document

[Patent Document 1] Japanese Published Patent Application No. 2000-2856

SUMMARY OF THE INVENTION

Problems to be Solved by the Invention

Reducing the size of a pixel included in a display device can increase the pixel density. Accordingly, many pixels can be provided in the display device. In contrast, providing many pixels in the display device increases power consumption of the display device. Consequently, when power is supplied from a battery to the display device, a continuous use period of an electronic device provided with the display device is shortened in some cases. Furthermore, an attempt to extend the continuous use period of the electronic device provided with the display device might increase the size and weight of a battery. An increase in the size of the battery incorporated in the electronic device provided with the display device increases the size of the electronic device in some cases. An increase in the weight of the battery incorporated in the electronic device increases the weight of the electronic device in some cases. In particular, an increase in the weight of the battery incorporated in a wearable electronic device might increase a burden on the user of the electronic device, and the user might be more likely to feel fatigue.

An object of one embodiment of the present invention is to provide a low-power display device. Another object of one embodiment of the present invention is to provide a display device that can display a high-quality image. Another object of one embodiment of the present invention is to provide a display device capable of high-speed driving. Another object of one embodiment of the present invention is to provide a highly reliable display device. Another object of one embodiment of the present invention is to provide a novel display device. Another object of one embodiment of the present invention is to provide a method for driving the display device. Another object of one embodiment of the present invention is to provide an electronic device provided with the display device. Another object of one embodiment of the present invention is to provide a novel semiconductor device, a driving method thereof, and the like.

Note that the description of these objects does not preclude the existence of other objects. One embodiment of the present invention does not need to achieve all of these objects. Other objects can be derived from the description of the specification, the drawings, and the claims.

Means for Solving the Problems

One embodiment of the present invention is a display device provided with a plurality of display portions, a plurality of data driver circuits, and a plurality of addition circuits. Pixels are arranged in a matrix in the display portion. For example, the display portions are provided in an upper layer, and the data driver circuits and the addition circuits are provided in a lower layer to have regions overlapping with the display portions. An output terminal of the data driver circuit is electrically connected to an input terminal of the addition circuit. An output terminal of the addition circuit is electrically connected to the pixels in one column through a data line. That is, the addition circuit is provided between the data driver circuit and the pixels. The data driver circuit has a function of performing D/A conversion.

In one embodiment of the present invention, first, the data driver circuit converts first digital data consisting of a first digital value into first analog data, and second digital data consisting of a second digital value into second analog data. After that, the addition circuit adds the second analog data to the first analog data. In this manner, the addition circuit can generate analog data corresponding to digital data that has a high-order bit that is the first digital value and a low-order bit that is the second digital value. Accordingly, the addition circuit can generate analog data corresponding to digital data having a larger number of bits than the digital data on which the data driver circuit can perform D/A conversion, and write the analog data to the pixel. The analog data generated by the addition circuit is supplied to the pixel through the data line.

When a plurality of display portions are provided, the number of columns of pixels per display portion can be reduced. Thus, the data line can be shortened, whereby a potential corresponding to the analog data generated by the addition circuit can be inhibited from being attenuated before being written to the pixel.

In addition, when the addition circuit is provided between the data driver circuit and the pixel, analog data corresponding to digital data having a larger number of bits than digital data on which the data driver circuit can perform D/A conversion can be written to the pixel. Thus, the number of bits of digital data on which the data driver circuit can perform D/A conversion can be reduced. This can simplify the structure of the data driver circuit. Thus, a potential corresponding to the first analog data and a potential corresponding to the second analog data, which are generated by the data driver circuit, can be inhibited from being attenuated in the data driver circuit.

In the above manner, in one embodiment of the present invention, a potential generated by the data driver circuit can be inhibited from being attenuated before being written to the pixel. Thus, although a buffer amplifier or the like is not provided between the data driver circuit and the addition circuit, the driving speed of the display device of one embodiment of the present invention does not decrease greatly. This structure allows direct connection between the output terminal of the data driver circuit and the input terminal of the addition circuit without through a buffer amplifier or the like. Moreover, although a buffer amplifier or the like is not provided between the addition circuit and the pixel, the driving speed of the display device of one embodiment of the present invention does not decrease greatly. This structure allows direct connection between the output terminal of the addition circuit and the pixel without through a buffer amplifier or the like. Thus, the display device of one embodiment of the present invention can be a low-power display device.

One embodiment of the present invention is a display device in which a first layer and a second layer are provided to be stacked. The first layer includes a potential supply circuit, a plurality of data driver circuits, and a plurality of addition circuits. The data driver circuit includes a pass transistor logic circuit. The second layer includes a plurality of display portions in each of which pixels are arranged in a matrix. Each of the plurality of display portions includes a region overlapping with the data driver circuit and the addition circuit. An output terminal of the pass transistor logic circuit is directly connected to an input terminal of the addition circuit. An output terminal of the addition circuit is directly connected to the pixel. The potential supply circuit has a function of supplying a plurality of kinds of potentials to the pass transistor logic circuit. The pass transistor logic circuit has a function of outputting any one of the plurality of kinds of potentials as analog data on the basis of digital data input to the pass transistor logic circuit. The addition circuit has a function of generating third analog data by adding second analog data output in response to input of second digital data to the pass transistor logic circuit, to first analog data output in response to input of first digital data to the pass transistor logic circuit.

In the above embodiment, the addition circuit may include a first switch, a second switch, a third switch, and a capacitor. The output terminal of the pass transistor logic circuit may be directly connected to one terminal of the first switch. The one terminal of the first switch may be electrically connected to one terminal of the second switch. The other terminal of the first switch may be directly connected to the pixel. One terminal of the capacitor may be electrically connected to the pixel. The other terminal of the capacitor may be electrically connected to the other terminal of the second switch and one terminal of the third switch.

Another embodiment of the present invention is a display device in which a first layer and a second layer are provided to be stacked. The first layer includes a potential supply circuit, a plurality of data driver circuits, and a plurality of addition circuits. The data driver circuit includes a pass transistor logic circuit. The addition circuit includes a first switch, a second switch, a third switch, a fourth switch, a fifth switch, a sixth switch, a first capacitor, a second capacitor, a comparator circuit, a control circuit, and a retention circuit. The second layer includes a plurality of display portions in each of which pixels are arranged in a matrix. Each of the plurality of display portions includes a region overlapping with the data driver circuit and the addition circuit. An output terminal of the pass transistor logic circuit is directly connected to one terminal of the first switch. The one terminal of the first switch is electrically connected to one terminal of the second switch. The other terminal of the second switch is electrically connected to one terminal of the third switch. The other terminal of the first switch is directly connected to the pixel. The other terminal of the first switch is electrically connected to one terminal of the fourth switch, one terminal of the fifth switch, and one terminal of the sixth switch. The other terminal of the fifth switch is electrically connected to one terminal of the first capacitor. The other terminal of the sixth switch is electrically connected to one terminal of the second capacitor. The other terminal of the first capacitor and the other terminal of the second capacitor are electrically connected to the one terminal of the third switch. The other terminal of the fourth switch is electrically connected to one of a non-inverting input terminal and an inverting input terminal of the comparator circuit. The potential supply circuit has a function of supplying a plurality of kinds of potentials to the pass transistor logic circuit. The pass transistor logic circuit has a function of outputting any one of the plurality of kinds of potentials as analog data on the basis of digital data input to the pass transistor logic circuit. The addition circuit has a function of generating and retaining third analog data by adding second analog data output in response to input of second digital data to the pass transistor logic circuit, to first analog data output in response to input of first digital data to the pass transistor logic circuit. The control circuit has a function of generating a digital signal for controlling on and off of the fifth switch and on and off of the sixth switch. The control circuit has a function of updating or determining a digital value of the digital signal on the basis of a signal output from the comparator circuit, in the case where the addition circuit retains the third analog data. The retention circuit has a function of retaining a determined digital value of the digital signal.

In the above embodiment, the third analog data may correspond to data obtained by converting, into analog data, digital data that has a high-order bit that is a digital value included in the first digital data and a low-order bit that is a digital value included in the second digital data.

In the above embodiment, the potential supply circuit may include a plurality of amplifier circuits, and the plurality of amplifier circuits may output different potentials to the potential supply circuit.

In the above embodiment, a constant potential may be supplied to the other terminal of the third switch. The first analog data may be written to the addition circuit when the first and third switches are turned on and the second switch is turned off, whereas the second analog data may be written to the addition circuit and the third analog data may be generated when the second switch is turned on and the first and third switches are turned off after the first analog data is written to the addition circuit.

In the above-described embodiment, the pixel may include a transistor including a metal oxide in a channel formation region, and the metal oxide may contain In, an element M (M is Al, Ga, Y, or Sn), and Zn.

An electronic device including the display device of one embodiment of the present invention and a battery is also one embodiment of the present invention.

Effect of the Invention

According to one embodiment of the present invention, a low-power display device can be provided. According to another embodiment of the present invention, a display device that can display a high-quality image can be provided. According to another embodiment of the present invention, a display device capable of high-speed driving can be provided. According to another embodiment of the present invention, a highly reliable display device can be provided. According to another embodiment of the present invention, a novel display device can be provided. According to another embodiment of the present invention, a method for driving the display device can be provided. According to another embodiment of the present invention, an electronic device provided with the display device can be provided. According to another embodiment of the present invention, a novel semiconductor device, a driving method thereof, and the like can be provided.

Note that the description of these effects does not preclude the existence of other effects. One embodiment of the present invention does not necessarily have all of these effects. Other effects can be derived from the description of the specification, the drawings, and the claims.

BRIEF DESCRIPTION OF THE DRAWINGS

FIG. 5A1, FIG. 5A2, FIG. 5B1, and FIG. 5B2 are circuit diagrams each illustrating a structure example of a pixel.
FIG. 21 is a block diagram illustrating a structure example of a display device.
FIG. 33A is a table showing classifications of crystal structures of IGZO.
FIG. 33B is a graph showing an XRD spectrum of a CAAC-IGZO film.
FIG. 33C is an image showing nanobeam electron diffraction patterns of a CAAC-IGZO film.

MODE FOR CARRYING OUT THE INVENTION

Figure 1:
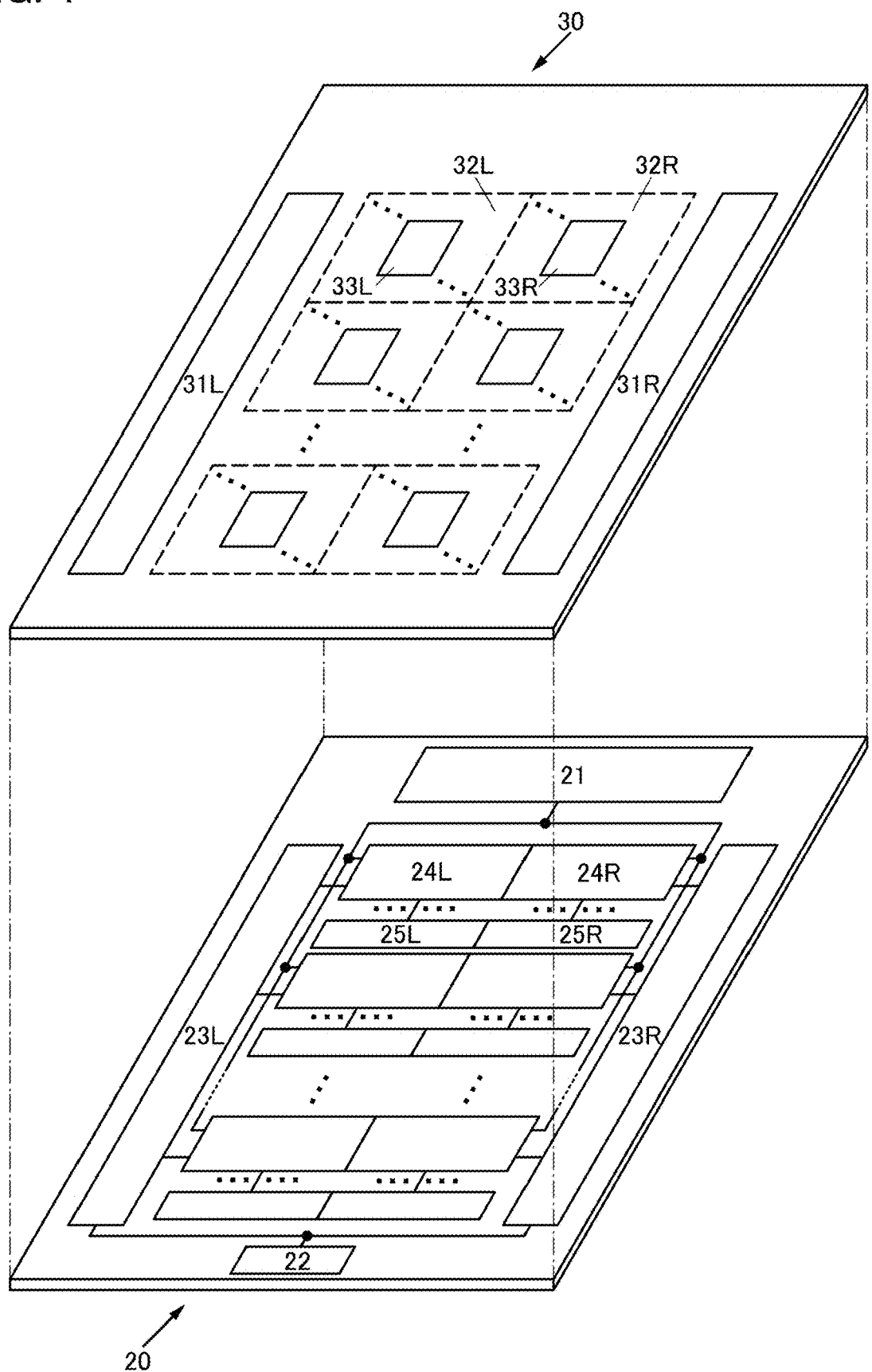
FIG. 1 is a block diagram illustrating a structure example of a display device.

Hereinafter, embodiments are described with reference to the drawings. Note that the embodiments can be implemented in many different modes, and it is readily understood by those skilled in the art that modes and details thereof can be changed in various ways without departing from the spirit and scope thereof. Thus, the present invention should not be interpreted as being limited to the description of the embodiments below.

In each drawing described in this specification, the size, the layer thickness, or the region of each component is exaggerated for clarity in some cases. Therefore, they are not limited to the illustrated scale. Note that the drawings are schematic views illustrating ideal examples, and embodiments of the present invention are not limited to shapes or values shown in the drawings. For example, in an actual manufacturing process, a layer, a resist mask, or the like might be unintentionally reduced in size by treatment such as etching, which might not be reflected in the drawings for easy understanding. In the drawings, the same portions or portions having similar functions and materials are denoted by the same reference numerals in different drawings, and explanation thereof is not repeated in some cases. Furthermore, the same hatch pattern is used for the portions having similar functions and materials, and the portions are not especially denoted by reference numerals in some cases.

Ordinal numbers such as "first", "second", and "third" used in this specification are used in order to avoid confusion among components and do not limit the components numerically.

In this specification, terms for describing arrangement such as "over" and "under" are used for convenience to describe the positional relation between components with reference to drawings. The positional relation between components is changed as appropriate in accordance with the direction from which each component is described. Thus, without limitation to terms described in this specification, the description can be changed appropriately depending on the situation.

In this specification and the like, functions of a source and a drain of a transistor are sometimes switched from each other depending on the polarity of the transistor, the case where the direction of current flow is changed in circuit operation, or the like. Therefore, the terms "source" and "drain" can be used interchangeably.

In this specification and the like, the terms "electrode", "wiring", "terminal", and the like do not functionally limit those components. For example, an "electrode" is used as part of a wiring in some cases, and vice versa. Furthermore, the term "electrode" or "wiring" can also include the case where a plurality of "electrodes" or "wirings" are formed in an integrated manner. For example, a "terminal" is used as part of a "wiring" or an "electrode" in some cases, and vice versa. Furthermore, the term "terminal" can also mean the case where a plurality of "electrodes", "wirings", "terminals", or the like are formed in an integrated manner, for example. Therefore, for example, an "electrode" can be part of a "wiring" or a "terminal", and a "terminal" can be part of a "wiring" or an "electrode". Moreover, the term "electrode", "wiring", "terminal", or the like is sometimes replaced with the term "region" depending on the case, for example.

In this specification and the like, the resistance value of a "resistor" is sometimes determined depending on the length of a wiring. Alternatively, the resistance value is sometimes determined through the connection of a conductive layer used for a wiring to a conductive layer with resistivity different from that of the conductive layer. Alternatively, the resistance value is sometimes determined by doping a semiconductor with an impurity.

In this specification and the like, the expression "electrically connected" includes the case where components are directly connected to each other and the case where components are connected through an "object having any electric function". Here, there is no particular limitation on the "object having any electric function" as long as electric signals can be transmitted and received between components that are connected through the object. Thus, even when the expression "electrically connected" is used, there is a case where no physical connection is made and a wiring just extends in an actual circuit. In addition, the expression "directly connected" includes the case where different conductive layers are connected to each other through a contact to form a wiring. Note that a wiring may be formed of conductive layers that contain one or more of the same elements or may be formed of conductive layers that contain different elements.

In this specification and the like, the term "film" and the term "layer" can be interchanged with each other. For example, the term "conductive layer" and the term "insulating layer" can be interchanged with the term "conductive film" and the term "insulating film", respectively.

Furthermore, unless otherwise specified, an off-state current in this specification and the like refers to a drain current of a transistor in an off state (also referred to as a non-conduction state or a cutoff state). Unless otherwise specified, an off state refers to a state where the voltage $V_{gs}$ between its gate and source is lower than the threshold voltage Vth in an n-channel transistor (higher than Vth in a p-channel transistor).

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, a metal oxide used in an active layer of a transistor is referred to as an oxide semiconductor in some cases. That is, when an OS transistor is described, it can also be referred to as a transistor including an oxide or an oxide semiconductor.

Embodiment 1

In this embodiment, a display device that is one embodiment of the present invention is described.

<Structure Example_1 of Display Device>

FIG. 1 is a block diagram illustrating a structure example of a display device 10 that is a display device of one embodiment of the present invention. The display device 10 includes a layer 20 and a layer 30. The layer 30 can be stacked above the layer 20, for example. An interlayer insulating film can be provided between the layer 20 and the layer 30.

In the layer 20, a circuit 21, a potential generation circuit 22, a potential supply circuit 23L, a potential supply circuit 23R, a data driver circuit 24L, a data driver circuit 24R, a circuit 25L, and a circuit 25R are provided. Here, a plurality of data driver circuits 24L, a plurality of data driver circuits 24R, a plurality of circuits 25L, and a plurality of circuits 25R can be provided.

In the layer 30, a gate driver circuit 31L, a gate driver circuit 31R, a display portion 32L, and a display portion 32R are provided. Pixels 33L are arranged in a matrix in the display portion 32L, and pixels 33R are arranged in a matrix in the display portion 32R. Here, a plurality of display portions 32L and a plurality of display portions 32R can be provided. For example, it is possible that the same number of the display portions 32L as the data driver circuits 24L are provided, and the same number of the display portions 32R as the data driver circuits 24R are provided. In this manner, the display device 10 can have a structure including a plurality of display portions. That is, the display device 10 includes divided display portions.

In this specification and the like, the potential supply circuit 23L and the potential supply circuit 23R are collectively referred to as a potential supply circuit 23. The data driver circuit 24L and the data driver circuit 24R are collectively referred to as a data driver circuit 24. The circuit 25L and the circuit 25R are collectively referred to as a circuit 25. The gate driver circuit 31L and the gate driver circuit 31R are collectively referred to as a gate driver circuit 31. The display portion 32L and the display portion 32R are collectively referred to as a display portion 32. The pixel 33L and the pixel 33R are collectively referred to as a pixel 33.

Although connection relations between the pixel 33L and the pixel 33R and other circuits are not illustrated in FIG. 1 for clarity of the drawing, the pixel 33L is actually electrically connected to the gate driver circuit 31L and the circuit 25L, and the pixel 33R is actually electrically connected to the gate driver circuit 31R and the circuit 25R. For example, the pixels 33L in one row can be electrically connected to the gate driver circuit 31L through one gate line, and the pixels 33R in one row can be electrically connected to the gate driver circuit 31R through one gate line. Furthermore, the pixels 33L in one column provided in one display portion 32L can be electrically connected to the circuit 25L through one data line, and the pixels 33R in one column provided in one display portion 32R can be electrically connected to the circuit 25R through one data line.

The circuit 21 functions as an interface that receives data such as image data from the outside of the display device 10. The data can be single-ended digital data. When the circuit 21 receives data with the use of a data transmitting signal based on LVDS (Low Voltage Differential Signaling) or the like, the circuit 21 may have a function of converting the received data into a signal based on a standard that can undergo internal processing.

The circuit 21 may have a function of performing parallel conversion of the single-ended digital data. Thus, data can be transmitted from the circuit 21 to the data driver circuit 24 at high speed even when the load is large at the time of data transmission from the circuit 21 to the data driver circuit 24.

The potential generation circuit 22 has a function of generating potentials to be supplied to the potential supply circuit 23L and the potential supply circuit 23R.

The potential supply circuit 23L has a function of selecting a potential to be supplied to the data driver circuit 24L from the potentials generated by the potential generation circuit 22. The potential supply circuit 23R has a function of selecting a potential to be supplied to the data driver circuit 24R from the potentials generated by the potential generation circuit 22.

The data driver circuit 24L has a function of supplying, to the circuit 25L, data such as image data supplied from the circuit 21. Specifically, the data driver circuit 24L has a function of converging digital data supplied from the circuit 21 into analog data and supplying the analog data to the circuit 25L. Specifically, the data driver circuit 24L has a function of selecting one of the potentials supplied from the potential supply circuit 23L on the basis of the digital data supplied from the circuit 21 and supplying the potential as analog data to the circuit 25L.

The data driver circuit 24R has a function of supplying, to the circuit 25R, data such as image data supplied from the circuit 21. The operation of the data driver circuit 24R can be similar to the operation of the data driver circuit 24L. For example, the data driver circuit 24R selects one of the potentials supplied from the potential supply circuit 23R on the basis of the digital data supplied from the circuit 21 and supplies the potential as analog data to the circuit 25R.

As described above, the data driver circuit 24 has a function of performing D/A (Digital to Analog) conversion.

The circuit 25L has a function of adding, to analog data, another piece of analog data. Specifically, the circuit 25L has a function of generating third analog data by adding second analog data output from the data driver circuit 24L to first analog data output from the data driver circuit 24L. For example, first digital data is input to the data driver circuit 24L, and the first digital data is converted into the first analog data by the data driver circuit 24L. After that, second digital data is input to the data driver circuit 24L, and the second digital data is converted into the second analog data by the data driver circuit 24L. In this case, analog data that is generated by the circuit 25L by adding the second analog data to the first analog data corresponds to data obtained by converting, into analog data, digital data that has a high-order bit that is the digital value included in the first digital data and a low-order bit that is the digital value included in the second digital data.

Like the circuit 25L, the circuit 25R has a function of adding, to analog data, another piece of analog data. Specifically, the circuit 25R has a function of generating third analog data by adding second analog data output from the data driver circuit 24R to first analog data output from the data driver circuit 24R.

The gate driver circuit 31L has a function of selecting the pixel 33L to which the analog data output from the circuit 25L is to be written. The gate driver circuit 31R has a function of selecting the pixel 33R to which the analog data output from the circuit 25R is to be written.

The display device 10 includes a region where the data driver circuit 24L and the circuit 25L provided in the layer 20 overlap with the display portion 32L provided in the layer 30. Furthermore, the display device 10 includes a region where the data driver circuit 24R and the circuit 25R overlap with the display portion 32R.

Here, in the case where the data driver circuit 24L and the circuit 25L do not overlap with the display portion 32L, the data driver circuit 24L and the circuit 25L are provided in the peripheral portion of the display portion 32L, for example. In this case, it is difficult to provide three or more of the display portions 32L in the display device in terms of a space for providing the data driver circuits 24L and the circuits 25L, for example. For a similar reason, it is difficult to provide three or more of the display portions 32R in the display device. On the other hand, in the display device 10, the data driver circuit 24 and the circuit 25 can be provided in a layer different from the layer including the display portion 32, thereby having a region overlapping with the display portion 32. Thus, three or more of the display portions 32L and three or more of the display portions 32R can be provided in the display device 10.

When a plurality of display portions 32 are provided and the data driver circuits 24 and the circuits 25 are provided accordingly, the number of columns of the pixels 33 provided in one display portion 32 can be reduced. Thus, a data line electrically connecting the circuit 25 to the pixel 33 can be shortened, for example, whereby wiring resistance of the data line can be reduced. Thus, analog data can be written to the pixel 33 from the circuit 25 at high speed, for example, enabling high-speed driving of the display device 10. Accordingly, even when the number of the pixels 33 included in the display device 10 is increased, a sufficiently long frame period can be ensured, and thus, the pixel density of the display device 10 can be increased. For example, the pixel density of the display device 10 can be 1000 ppi or more, 5000 ppi or more, or 7000 ppi or more. In addition, the increased pixel density of the display device 10 can increase the resolution of an image displayed by the display device 10. Thus, the display device 10 can be, for example, a display device for AR or VR and can be suitably used in an electronic device with a short distance between the display portion and the user, such as an HMD.

Furthermore, when the display device 10 includes the circuit 25, the number of bits of digital data on which the data driver circuit 24 performs D/A conversion can be small. For example, 5-bit first digital data and 5-bit second digital data are input to the data driver circuit 24. In this case, data generated by the circuit 25 can correspond to data obtained by conversion of 10-bit digital data into analog data. That is, even when the upper limit of the number of bits of digital data on which the data driver circuit 24 can perform D/A conversion is five bits, analog data corresponding to 10-bit digital data can be written to the pixel 33.

The circuit 21, the potential generation circuit 22, the potential supply circuit 23, the data driver circuit 24, the circuit 25, the gate driver circuit 31, and the pixel 33 each include a transistor. That is, the layer 20 and the layer 30 are each provided with transistors. For example, a transistor provided in the layer 20 can be a transistor including silicon in a channel formation region (also referred to as a Si transistor), such as a transistor including single crystal silicon in a channel formation region. In particular, the use of a transistor including single crystal silicon in a channel formation region as the transistor provided in the layer 20 can increase the on-state current of the transistor. Thus, this is preferable because the circuit 21, the potential generation circuit 22, the potential supply circuit 23, the data driver circuit 24, and the circuit 25 can be driven at high speed. Note that as the transistor provided in the layer 20, a transistor including low-temperature polysilicon, hydrogenated amorphous silicon, microcrystalline silicon, polycrystalline silicon, or the like in a channel formation region may be used. Alternatively, an OS transistor may be used as the transistor provided in the layer 20.

In contrast, a transistor provided in the layer 30 can be an OS transistor, for example. In particular, a transistor including an oxide including at least one of indium, an element M (the element M is aluminum, gallium, yttrium, or tin), and zinc in a channel formation region is preferably used as the OS transistor. Such an OS transistor has a characteristic of an extremely low off-state current. Thus, it is particularly preferable to use the OS transistor as the transistor provided in the pixel 33, in which case the pixel 33 can retain analog data written to the pixel 33 for a long time.

Note that a Si transistor may be used as the transistor provided in the layer 30. For example, a transistor including low-temperature polysilicon, hydrogenated amorphous silicon, microcrystalline silicon, polycrystalline silicon, or the like in a channel formation region may be used.

All the transistors provided in the layer 20 are not necessarily transistors of the same kind, and all the transistors provided in the layer 30 are not necessarily transistors of the same kind. For example, among the transistors provided in the layer 30, the transistors provided in the gate driver circuit 31 may be Si transistors, and the transistors provided in the pixels 33 may be OS transistors. For another example, some of the transistors provided in the pixels 33 may be Si transistors and the others may be OS transistors.

Figure 2:
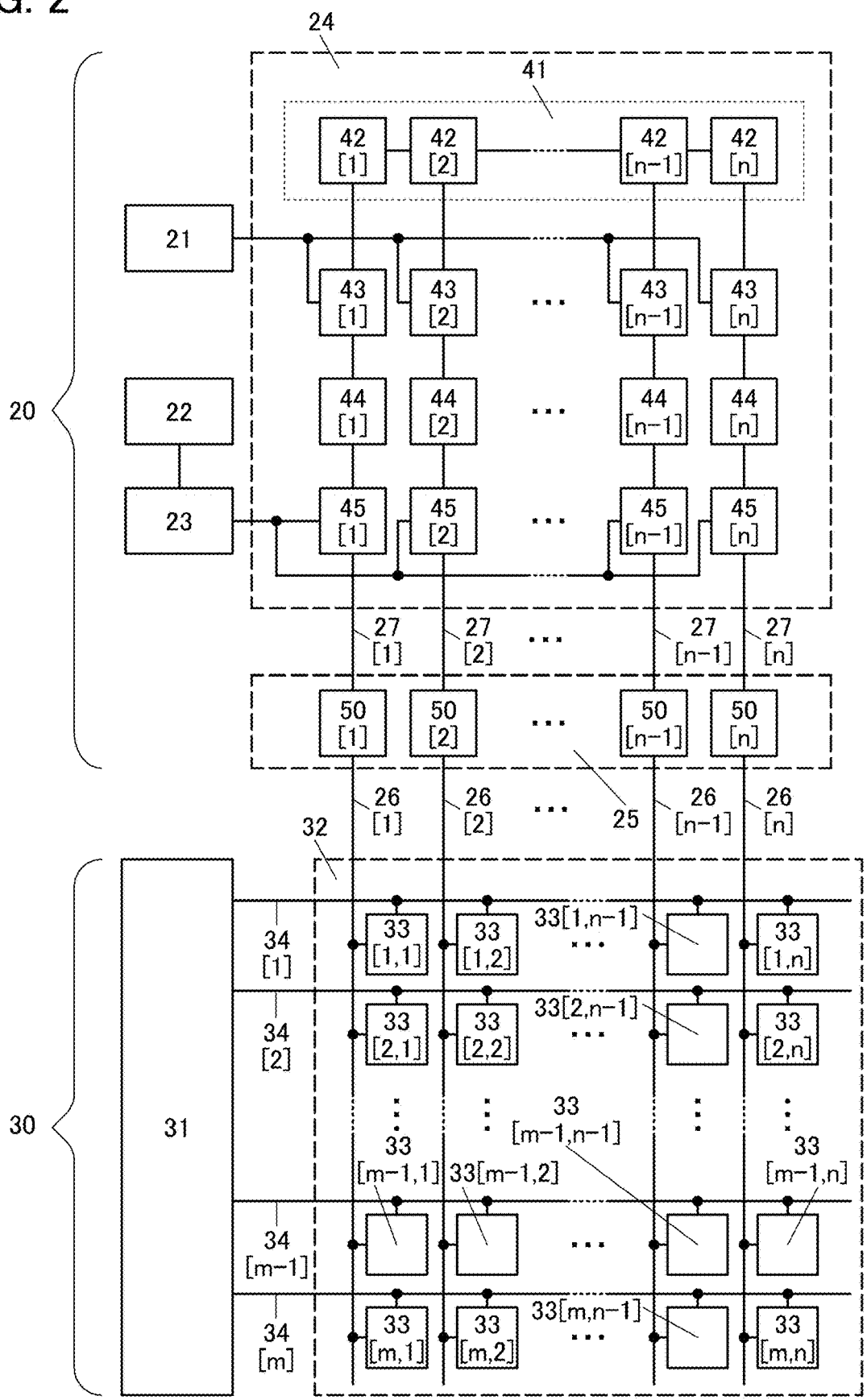
FIG. 2 is a block diagram illustrating a structure example of a display device.

FIG. 2 is a block diagram illustrating structure examples of the data driver circuit 24, the circuit 25, and the display portion 32. Note that the circuit 21, the potential generation circuit 22, the potential supply circuit 23, and the gate driver circuit 31 are also illustrated in FIG. 2 to show connection relations.

In the display portion 32, the pixels 33 are arranged in a matrix of m rows and n columns (m and n are each an integer of greater than or equal to 1). The pixels 33 in one row are electrically connected to the gate driver circuit 31 through one wiring 34, and the pixels 33 in one column are electrically connected to one wiring 26. Here, the wiring 34 is a gate line, and the wiring 26 is a data line.

In this specification and the like, when a plurality of components are denoted by the same reference numeral and in particular need to be distinguished from each other, an identification sign such as "[m]", "[m,n]", "(0)", "(1)", "<0>", or "<1>" is sometimes added to the reference numeral. For example, the pixel 33 in the first row and the first column is denoted by a pixel 33[1,1], and the pixel 33 in the m-th row and the n-th column is denoted by a pixel 33[m,n]. For example, the wiring 34 electrically connected to the pixels 33 in the first row is denoted by a wiring 34[1], and the wiring 34 electrically connected to the pixels 33 in the m-th row is denoted by a wiring 34[m]. Moreover, for example, the wiring 26 electrically connected to the pixels 33 in the first column is denoted by a wiring 26[1], and the wiring 26 electrically connected to the pixels 33 in the n-th column is denoted by a wiring 26[n]. The same description applies to other components in some cases.

The data driver circuit 24 includes n register circuits 42, n latch circuits 43, n level shifter circuits 44, and n pass transistor logic circuits 45. A register circuit 42[1] to a register circuit 42[n] can constitute a shift register circuit 41. An output terminal of the pass transistor logic circuit 45 is electrically connected to a wiring 27.

Digital data such as image data output from the circuit 21 is supplied to a latch circuit 43[1] to a latch circuit 43[n]. The potential supply circuit 23 can supply a potential to a pass transistor logic circuit 45[1] to a pass transistor logic circuit 45[n].

The register circuit 42 has a function of generating a signal for controlling driving of the latch circuit 43. For example, when a start pulse is supplied to the register circuit 42[1], signals for controlling driving of the latch circuit 43[1] to the latch circuit 43[n] are sequentially output from the register circuit 42[1] to the register circuit 42[n].

The latch circuit 43 has a function of retaining or outputting digital data output from the circuit 21. Whether the latch circuit 43 retains or outputs digital data is determined on the basis of a signal supplied to the latch circuit 43 from the register circuit 42.

The level shifter circuit 44 has a function of changing a potential level of a signal representing digital data output from the latch circuit 43. Specifically, the level shifter circuit 44 has a function of changing a potential level of a signal representing digital data output from the latch circuit 43 into a potential level that can undergo processing by the pass transistor logic circuit 45.

The pass transistor logic circuit 45 has a function of outputting any of potentials supplied from the potential supply circuit 23 to the pass transistor logic circuit 45 as analog data on the basis of a digital value of digital data output from the level shifter circuit 44. For example, a potential output from the pass transistor logic circuit 45 can be higher as the digital value becomes larger.

Thus, the potential supply circuit 23 and the pass transistor logic circuit 45 can form a D/A converter circuit.

The circuit 25 includes n addition circuits 50. An input terminal of the addition circuit 50 is electrically connected to the wiring 27, and an output terminal of the addition circuit 50 is electrically connected to the wiring 26. As described above, the wiring 27 is electrically connected to the output terminal of the pass transistor logic circuit 45 included in the data driver circuit 24 in addition to the input terminal of the addition circuit 50. Accordingly, the data driver circuit 24 outputs data through the wiring 27. Therefore, the wiring 27 is a data line.

Here, the output terminal of the pass transistor logic circuit 45 can be directly connected to the input terminal of the addition circuit 50 through the wiring 27, which will be described in detail later. The output terminal of the addition circuit 50 can be directly connected to the pixel 33 through the wiring 26.

In this specification and the like, "X and Y are directly connected" means that X and Y are connected without another element, another circuit, or the like provided therebetween. For example, in the case where X and Y are directly connected, X and Y are connected without through an amplifier circuit. Note that in the case where X and Y are connected through a resistor, X and Y can be regarded as being directly connected.

The addition circuit 50 has a function of generating third analog data by adding second analog data output from the pass transistor logic circuit 45 to first analog data output from the pass transistor logic circuit 45. Furthermore, the addition circuit 50 has a function of retaining the generated third analog data.

Figure 3:
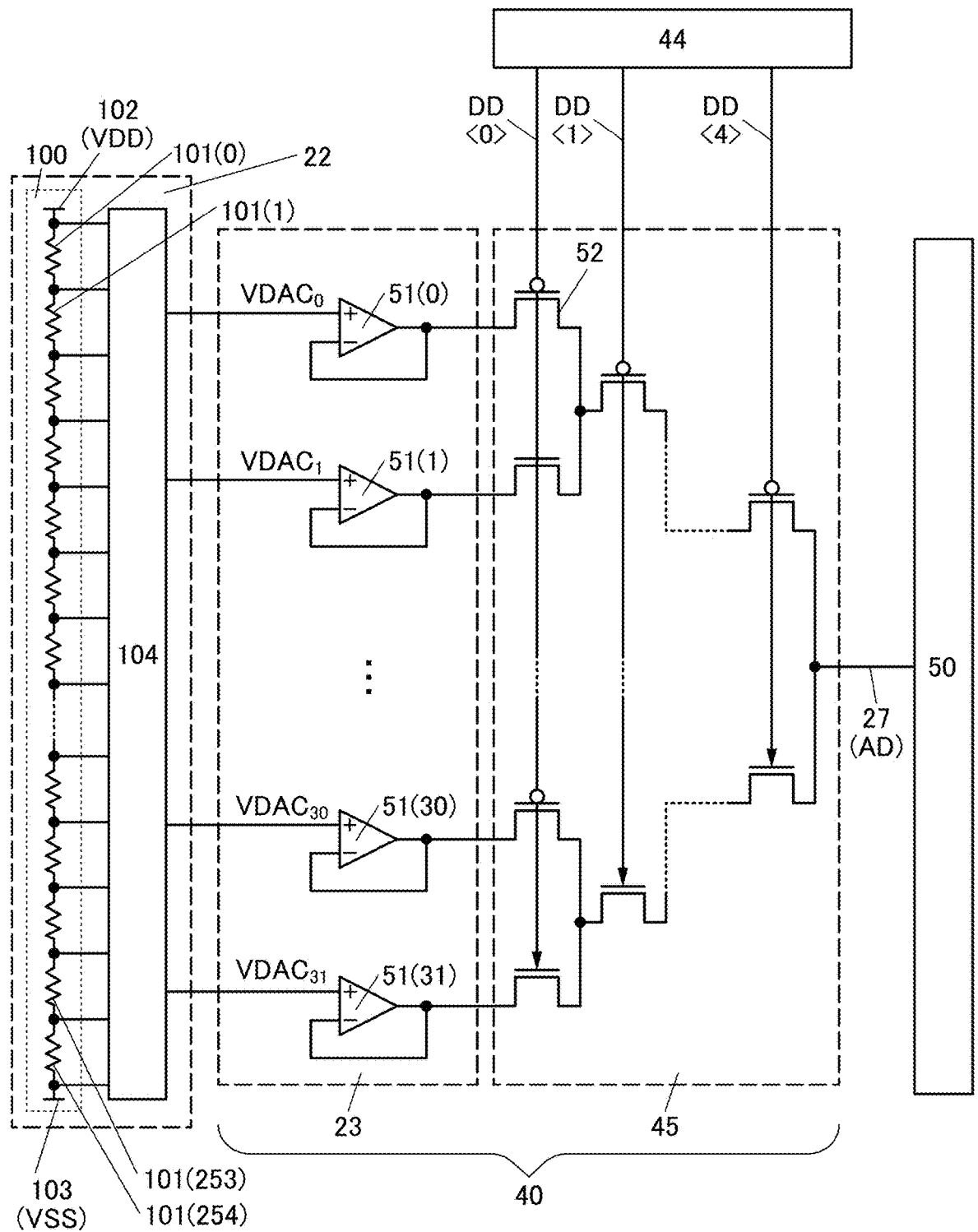
FIG. 3 is a circuit diagram illustrating a structure example of a display device.

FIG. 3 is a circuit diagram illustrating specific structure examples of the potential generation circuit 22, the potential supply circuit 23, and the pass transistor logic circuit 45. Note that the level shifter circuit 44 and the addition circuit 50 are also illustrated in FIG. 3 to show connection relations. As an example, 5-bit digital data DD is input to the data driver circuit 24 in FIG. 3. Furthermore, as an example, the potential generation circuit 22 generates 256 kinds of potentials and supplies 32 kinds of potentials out of the potentials to the potential supply circuit 23 in FIG. 3.

In this specification and the like, for example, bits included in the 5-bit digital data DD are denoted by digital data DD<0> to digital data DD<4> sequentially from the low-order bit. For example, in the case where the number of bits of the digital data DD is 5, the digital data DD<0> represents the least significant bit and the digital data DD<4> represents the most significant bit.

The potential generation circuit 22 includes a resistor 101(0) to a resistor 101(254) and a selection circuit 104. The resistor 101(0) to the resistor 101(254) are connected in series to form a resistor string 100. One end of the resistor 101(0) is electrically connected to a wiring 102, and a potential VDD can be supplied to the wiring 102. One end of the resistor 101(254) is electrically connected to a wiring 103, and a potential VSS can be supplied to the wiring 103. Here, the potential VDD can be a potential higher than the potential VSS. One end and the other end of each of the resistor 101(0) to the resistor 101(254) are electrically connected to the selection circuit 104. In this way, 256 kinds of potentials including the potential VDD that is the highest potential and the potential VSS that is the lowest potential can be supplied to the selection circuit 104. Note that when the number of the resistors 101 provided in the resistor string 100 is larger than the number of the resistors 101 illustrated in FIG. 3, for example, one or both of the potential VDD and the potential VSS are not necessarily supplied to the selection circuit 104.

The selection circuit 104 has a function of selecting a potential to be supplied to the potential supply circuit 23 among potentials output from the resistor string 100. FIG. 3 illustrates an example in which the selection circuit 104 has a function of selecting 32 kinds of potentials to be supplied to the potential supply circuit 23 among 256 kinds of potentials output from the resistor string 100. The 32 kinds of potentials are denoted by a potential $VDAC_0$ to a potential $VDAC_{31}$. The selection circuit 104 has a function of selecting a potential to be supplied to the potential supply circuit 23 so that image data input to the circuit 21 can be subjected to image processing such as gamma correction, for example.

The potential supply circuit 23 includes an amplifier circuit 51. For example, the potential supply circuit 23 can include the same number of amplifier circuits 51 as the kinds of potentials output from the potential generation circuit 22. FIG. 3 illustrates an example in which the potential supply circuit 23 includes an amplifier circuit 51(0) to an amplifier circuit 51(31), that is, 32 amplifier circuits 51.

The potential $VDAC_0$ to the potential $VDAC_{31}$ output from the selection circuit 104 are input to input terminals, e.g., non-inverting input terminals, of the corresponding amplifier circuit 51(0) to amplifier circuit 51(31). The potential input to the amplifier circuit 51 is amplified by the amplifier circuit 51 to be input to the pass transistor logic circuit 45. The amplifier circuit 51 can be a unity gain buffer, for example. Note that the gain of the amplifier circuit 51 may be larger than 1.

As described above, with the circuit 25 included in the display device 10, the number of bits of the digital data DD can be reduced. For example, even in the case where analog data corresponding to 10-bit digital data is written to the pixel 33, the digital data DD can be digital data having nine or less bits. Thus, the number of bits of digital data on which the data driver circuit 24 can perform D/A conversion can be reduced. Accordingly, the number of kinds of potentials output to the pass transistor logic circuit 45 from the potential supply circuit 23 can be reduced. Therefore, even when the potential supply circuit 23 is not a resistor string type, a great increase in the area occupied by the potential supply circuit 23 can be suppressed. In the case where the potential supply circuit 23 is a resistor string type, current flows from one end of the resistor string to the other end, which increases power consumption of the display device 10. Accordingly, the potential supply circuit 23 having the structure illustrated in FIG. 3, for example, can reduce power consumption of the display device 10.

The pass transistor logic circuit 45 includes a transistor 52. The pass transistor logic circuit 45 illustrated in FIG. 3 is formed of five stages of the transistors 52. Specifically, the pass transistor logic circuit 45 has a structure in which one stage is split into two electrical paths; i.e., the pass transistor logic circuit 45 has a total of 32 paths. That is, the transistors 52 are electrically connected in a tournament manner. One of a source and a drain of each of the transistors 52 in the fifth stage which is the last stage can serve as an output terminal of the pass transistor logic circuit 45, and can be electrically connected to the wiring 27. The pass transistor logic circuit 45 can output analog data AD through the wiring 27.

Specifically, the digital data DD<0> can be supplied to the transistors 52 in the first stage, the digital data DD<1> can be supplied to the transistors 52 in the second stage, the digital data DD<2> can be supplied to the transistors 52 in the third stage, the digital data DD<3> can be supplied to the transistors 52 in the fourth stage, and the digital data DD<4> can be supplied to the transistors 52 in the fifth stage. Thus, the potential of the wiring 27 can be a potential corresponding to any of the potential $VDAC_0$ to the potential $VDAC_{31}$ in accordance with the digital value of the digital data DD. Consequently, the digital data DD can be converted into the analog data AD.

The pass transistor logic circuit 45 illustrated in FIG. 3 includes n-channel transistors 52 and p-channel transistors 52; alternatively, the pass transistor logic circuit 45 can include only n-channel transistors 52. For example, the transistors 52 provided in the pass transistor logic circuit 45 can be all n-channel transistors when the digital data DD<0> to the digital data DD<4> and their complementary data are supplied to gates of the transistors 52.

As described above, the pass transistor logic circuit 45 has a function of outputting, as the analog data AD, a potential corresponding to any of the potential $VDAC_0$ to the potential $VDAC_{31}$ supplied to the pass transistor logic circuit 45 from the potential supply circuit 23 on the basis of the digital value of the digital data DD output from the level shifter circuit 44, for example. Thus, the potential supply circuit 23 and the pass transistor logic circuit 45 can form the D/A converter circuit. The D/A converter circuit is a D/A converter circuit 40.

As described above, with the circuit 25 included in the display device 10, the number of bits of the digital data DD can be reduced. Thus, the number of bits of the digital data on which the D/A converter circuit 40 can perform D/A conversion can be reduced. Here, the number of stages of the transistors 52 included in the pass transistor logic circuit 45 can be equal to the number of bits of the digital data DD, for example. The number of bits of the digital data on which the D/A converter circuit 40 can perform D/A conversion is reduced, whereby the number of stages of the transistors 52 can be reduced. Accordingly, the potential supplied to the pass transistor logic circuit 45 from the potential supply circuit 23 can be inhibited from being attenuated due to resistance between the source and the drain of the transistor 52 before being output as the analog data AD through the wiring 27.

Figure 4:
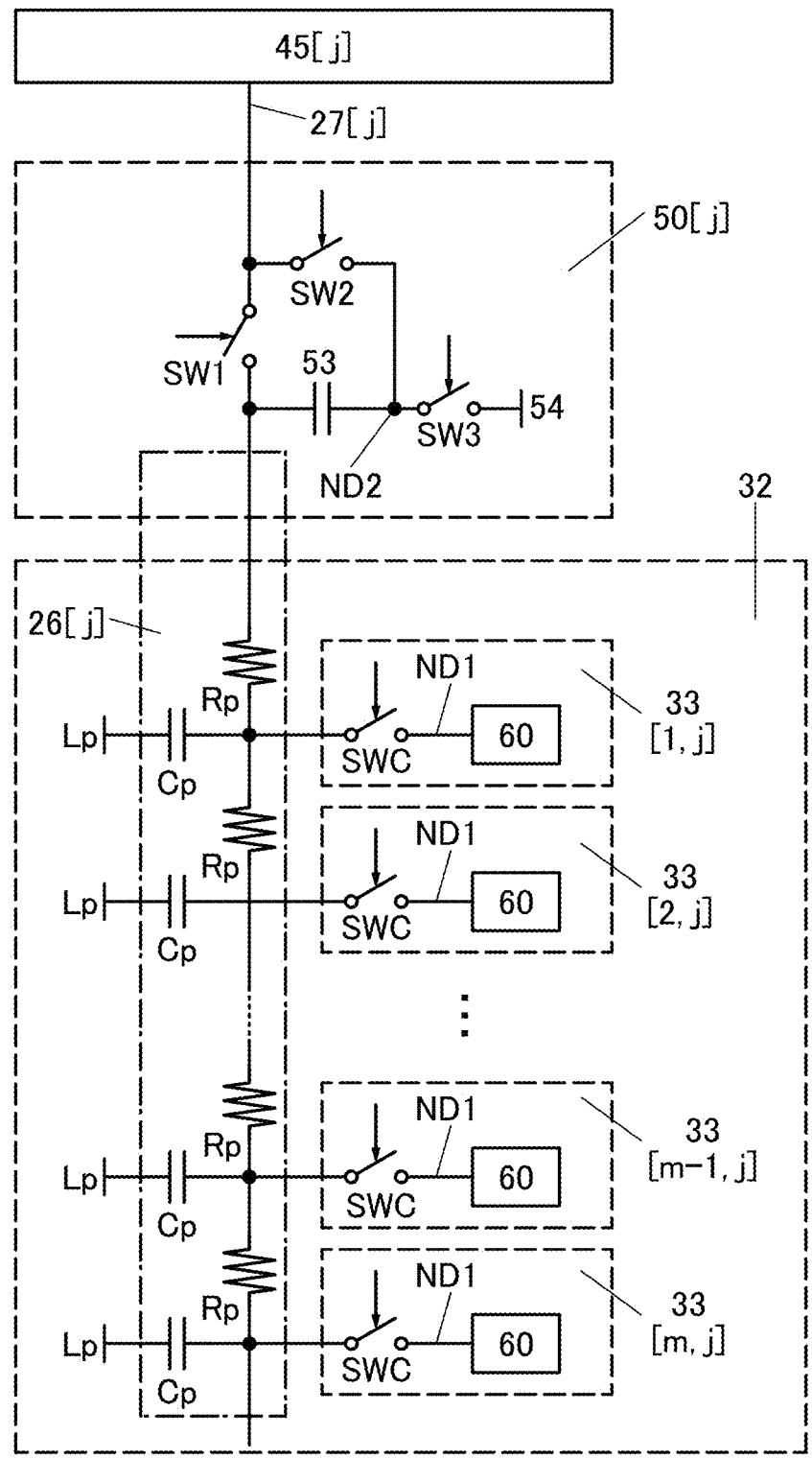
FIG. 4 is a circuit diagram illustrating a structure example of a display device.

FIG. 4 is a circuit diagram illustrating the parasitic capacitance and the wiring resistance of a wiring 26[*j*] (j is an integer of greater than or equal to 1 and less than or equal to n), structure examples of a pixel 33[1,*j*] to a pixel 33[*m,j*], and a structure example of an addition circuit 50[*j*]. Note that the pass transistor logic circuit 45[*j*] is also illustrated in FIG. 4 to show the connection relation with the addition circuit 50[*j*].

As described above, FIG. 4 illustrates the parasitic capacitance and the wiring resistance of the wiring 26[*j*]. Specifically, the wiring 26[*j*] includes a resistor Rp as the wiring resistance and a capacitor Cp as the parasitic capacitance for one pixel 33. In the display portion 32 illustrated in FIG. 4, m pixels 33 are provided per column, and the wiring 26[*j*] includes m resistors Rp connected in series and m capacitors Cp connected in parallel. In addition, in FIG. 4, one pixel 33 is electrically connected to a point of electrical connection between one terminal of the capacitor Cp and one terminal of the resistor Rp.

The other terminal of the capacitor Cp functioning as the parasitic capacitance is electrically connected to a wiring Lp. As the wiring Lp, the wiring 34 including a region overlapping with the wiring 26, or the like can be used, for example.

The pixel 33 includes a switch SWC and a circuit 60. One terminal of the switch SWC is electrically connected to the circuit 60. The other terminal of the switch SWC is electrically connected to the wiring 26. Here, a node where the one terminal of the switch SWC and the circuit 60 are electrically connected is a node ND1.

The circuit 60 includes a display element. As the display element, a light-emitting element such as an organic light-emitting element or an LED (Light Emitting Diode) element can be used, for example. Alternatively, a liquid crystal element, a MEMS (Micro Electro Mechanical Systems) element, or the like can be used as the display element. A capacitor is provided in the circuit 60, and charge can be accumulated in the node ND1 owing to the capacitor.

In this specification and the like, the term "element" can be replaced with the term "device" in some cases. For example, a display element, a light-emitting element, and a liquid crystal element can be rephrased as a display device, a light-emitting device, and a liquid crystal device, respectively.

The addition circuit 50 includes a switch SW1, a switch SW2, a switch SW3, and a capacitor 53. One terminal of the switch SW1 and one terminal of the switch SW2 are electrically connected to the wiring 27. The one terminal of the switch SW1 can serve as the input terminal of the addition circuit 50. Here, the output terminal of the pass transistor logic circuit 45[*j*] can be directly connected to the one terminal of the switch SW1 capable of serving as the input terminal of the addition circuit 50 through the wiring 27, which will be described in detail later.

The other terminal of the switch SW1 and one terminal of the capacitor 53 are electrically connected to the other terminal of the switch SWC through the wiring 26. The other terminal of the switch SW1 can serve as the output terminal of the addition circuit 50. Here, the other terminal of the switch SW1 capable of serving as the output terminal of the addition circuit 50 can be directly connected to the other terminal of the switch SWC through the wiring 26, which will be described in detail later.

The other terminal of the capacitor 53 is electrically connected to the other terminal of the switch SW2 and one terminal of the switch SW3. The other terminal of the switch SW3 is electrically connected to a wiring 54. Here, a node where the other terminal of the switch SW2, the one terminal of the switch SW3, and the other terminal of the capacitor 53 are electrically connected is a node ND2.

The wiring 54 can be supplied with a constant potential. For example, the wiring 54 can be supplied with a low potential such as a ground potential.

By turning on the switch SWC, analog data output from the addition circuit 50 can be written to the pixel 33. Specifically, a potential of the node ND1 can be a potential corresponding to the analog data output from the addition circuit 50.

FIG. 5A1 is a circuit diagram illustrating a structure example of the pixel 33. The pixel 33 illustrated in FIG. 5A1 includes a transistor 61 and the circuit 60, and the circuit 60 includes a light-emitting element 70, a transistor 71, and a capacitor 73. Here, the transistor 61 corresponds to the switch SWC illustrated in FIG. 4.

One of a source and a drain of the transistor 61, a gate of the transistor 71, and one terminal of the capacitor 73 are electrically connected to the node ND1. One of a source and a drain of the transistor 71 is electrically connected to one terminal of the light-emitting element 70.

The other of the source and the drain of the transistor 61 is electrically connected to the wiring 26. A gate of the transistor 61 is electrically connected to the wiring 34. The other of the source and the drain of the transistor 71 and the other terminal of the capacitor 73 are electrically connected to a wiring 74. The other terminal of the light-emitting element 70 is electrically connected to a wiring 75.

The wiring 74 and the wiring 75 can be supplied with a constant potential. For example, a potential of the wiring 74 can be a high potential and a potential of the wiring 75 can be a low potential in the case where an anode of the light-emitting element 70 is electrically connected to the one of the source and the drain of the transistor 71 and a cathode of the light-emitting element 70 is electrically connected to the wiring 75 as illustrated in FIG. 5A1.

In the pixel 33 illustrated in FIG. 5A1, when a potential corresponding to analog data generated by the addition circuit 50 is retained in the node ND1, current corresponding to a gate-source voltage of the transistor 71 flows between the source and the drain of the transistor 71. The current flows into the light-emitting element 70, so that the light-emitting element 70 emits light having a luminance corresponding to the current. Thus, the pixel 33 illustrated in FIG. 5A1 can emit light having a luminance corresponding to the analog data generated by the addition circuit 50. As described above, the transistor 71 has a function of a driving transistor that controls current flowing into the light-emitting element 70.

The transistor 61 and the transistor 71 may each include a back gate in addition to the gate (also referred to as a top gate). The pixel 33 illustrated in FIG. 5A2 has a structure in which the transistor 61 and the transistor 71 included in the pixel 33 illustrated in FIG. 5A1 each include a back gate.

In the pixel 33 illustrated in FIG. 5A2, the back gate of the transistor 61 is electrically connected to the gate of the transistor 61. Accordingly, the transistor 61 can have a higher on-state current. The back gate of the transistor 71 is electrically connected to the one of the source and the drain of the transistor 71, and for example, can be electrically connected to the source of the transistor 71. Accordingly, the transistor 71 can have a higher on-state current. As described above, when the pixel 33 has the structure illustrated in FIG. 5A2, the pixel 33 can be driven at high speed, and thus, the display device 10 can be driven at high speed.

The pixel 33 illustrated in FIG. 5B1 is a modification example of the pixel 33 illustrated in FIG. 5A1, and is different from the pixel 33 illustrated in FIG. 5A1 in the structure of the circuit 60. The circuit 60 illustrated in FIG. 5B1 includes a liquid crystal element 80 and a capacitor 81.

In the pixel 33 illustrated in FIG. 5B1, the one of the source and the drain of the transistor 61, one terminal of the liquid crystal element 80, and one terminal of the capacitor 81 are electrically connected to the node ND1. The other terminal of the capacitor 81 is electrically connected to a wiring 82, and the other terminal of the liquid crystal element 80 is electrically connected to a wiring 83.

The wiring 82 and the wiring 83 can be supplied with a constant potential. For example, the wiring 82 and the wiring 83 can be supplied with a low potential such as a ground potential.

In the pixel 33 illustrated in FIG. 5B1, when a potential corresponding to the analog data generated by the addition circuit 50 is retained in the node ND1, liquid crystal molecules included in the liquid crystal element 80 are oriented in accordance with the potential difference between the terminals of the liquid crystal element 80. Since the oriented liquid crystal molecules transmit light from a backlight unit that can be included in the display device 10 in accordance with the orientation degree, the pixel 33 can emit light having a luminance corresponding to the analog data generated by the addition circuit 50.

As described above, the transistor 61 may include a back gate. The pixel 33 illustrated in FIG. 5B2 has a structure in which the transistor 61 included in the pixel 33 illustrated in FIG. 5B1 includes a back gate.

In the pixel 33 illustrated in FIG. 5B2, the back gate of the transistor 61 is electrically connected to the gate of the transistor 61. In this manner, the on-state current of the transistor 61 can be increased as described above; accordingly, the pixel 33 can be driven at high speed, and thus, the display device 10 can be driven at high speed.

<Example_1 of Driving Method of Display Device>

Figure 6:
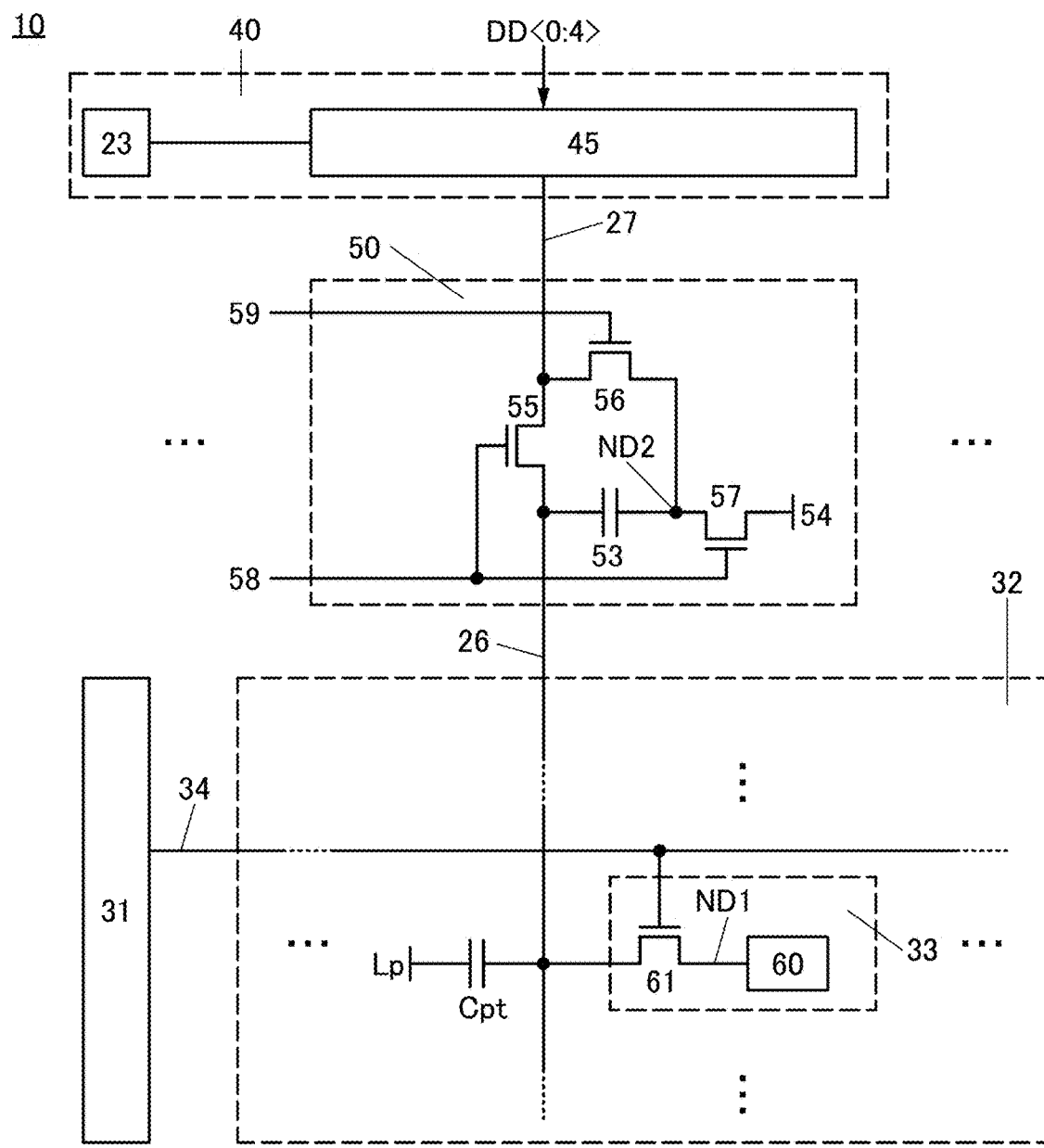
FIG. 6 is a circuit diagram illustrating a structure example of a display device.

Next, an example of a driving method of the display device 10 is described. An example of the driving method of the display device 10 having a structure illustrated in a circuit diagram of FIG. 6 is described. As illustrated in FIG. 6, the digital data DD<0> to the digital data DD<4> are input to the pass transistor logic circuit 45. The switch SWC included in the pixel 33 corresponds to the transistor 61. Furthermore, in the addition circuit 50, the switch SW1 corresponds to a transistor 55, the switch SW2 corresponds to a transistor 56, and the switch SW3 corresponds to a transistor 57. Note that in FIG. 6, when a capacitor Cpt is the sum of the capacitors Cp that are the parasitic capacitance of the wiring 26 illustrated in FIG. 4, the number of pixels 33 electrically connected to the wiring 26 is m, and all the capacitors Cp have the same capacitance value, the capacitance value of the capacitor Cpt is "the capacitance value of the capacitor Cp×m". Furthermore, in FIG. 6, the resistor Rp that represents the wiring resistance of the wiring 26 illustrated in FIG. 4 is omitted.

One of a source and a drain of the transistor 55 and one of a source and a drain of the transistor 56 are electrically connected to the wiring 27. The one of the source and the drain of the transistor 55 can serve as the input terminal of the addition circuit 50. Here, the output terminal of the pass transistor logic circuit 45 can be directly connected to the one of the source and the drain of the transistor 55, which can serve as the input terminal of the addition circuit 50, through the wiring 27, which will be described in detail later.

The other of the source and the drain of the transistor 55 and the one terminal of the capacitor 53 are electrically connected to the wiring 26. The other of the source and the drain of the transistor 55 can serve as the output terminal of the addition circuit 50. Here, the other of the source and the drain of the transistor 55, which can serve as the output terminal of the addition circuit 50, can be directly connected to the other of the source and the drain of the transistor 61 through the wiring 26, which will be described in detail later.

The other terminal of the capacitor 53 is electrically connected to the other of the source and the drain of the transistor 56 and one of a source and a drain of the transistor 57. The other of the source and the drain of the transistor 57 is electrically connected to the wiring 54. Here, a node where the other of the source and the drain of the transistor 56, the one of the source and the drain of the transistor 57, and the other terminal of the capacitor 53 are electrically connected is the node ND2.

A gate of the transistor 55 and a gate of the transistor 57 are electrically connected to a wiring 58. A gate of the transistor 56 is electrically connected to a wiring 59. The wiring 58 and the wiring 59 are wirings for switching the on state and the off state of the transistor 55 to the transistor 57. Here, the gate of the transistor 55 and the gate of the transistor 57 are electrically connected to the wiring 58; thus, by supplying a high potential or a low potential to the wiring 58, the on state and the off state can be switched in both the transistor 55 and the transistor 57 at the same time. Note that switching the on state and the off state of the transistor 55 may be performed independently of switching the on state and the off state of the transistor 57. In this case, a structure is employed in which the gate of the transistor 55 and the gate of the transistor 57 are electrically connected to different wirings.

Figure 7:
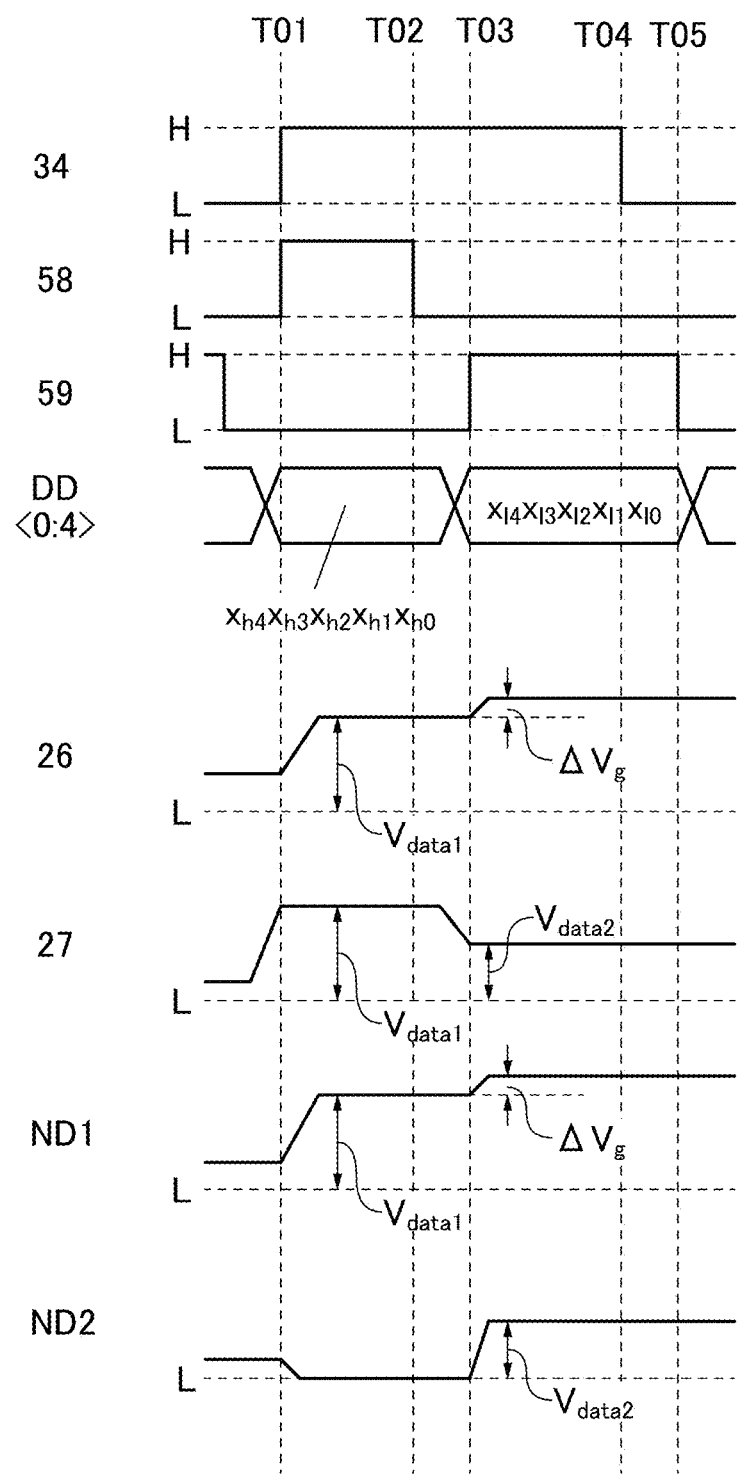
FIG. 7 is a timing chart showing an example of a method for driving a display device.

FIG. 7 is a timing chart showing an example of a method for driving the display device 10. The timing chart of FIG.

7 shows changes in potentials of the wiring 34, the wiring 58, the wiring 59, the wiring 26, the wiring 27, the node ND1, and the node ND2 at and around time T01 to time T05. The timing chart of FIG. 7 also shows the digital data DD. Note that in the timing chart of FIG. 7, "H" represents a high potential and "L" represents a low potential. The same applies to other timing charts.

At and around time T01 to time T05, the wiring 54 is constantly supplied with a low potential.

Note that in an example of the driving method described in this specification, the transistor 61 and the transistor 55 to the transistor 57 which are in an on state operate in a linear region in the end unless otherwise specified. In other words, the gate voltages, the source voltages, and the drain voltages of the transistor 61 and the transistor 55 to the transistor 57 are biased appropriately to voltages in the range where the transistors operate in the linear region. Note that in the case where the pixel 33 illustrated in FIG. 5A1 or FIG. 5A2 is used as the pixel 33, the transistor 71 is preferably driven in a saturated region.

[Before Time T01]

Before time T01, a low potential is supplied to the wiring 34. When the potential of the wiring 34 is a low potential, the low potential is supplied to the gate of the transistor 61 and the transistor 61 is turned off accordingly. That is, the wiring 26 and the node ND1 are electrically disconnected.

A low potential is supplied to the wiring 58. When the potential of the wiring 58 is a low potential, the low potential is supplied to the gate of the transistor 55 and the gate of the transistor 57 and the transistor 55 and the transistor 57 are turned off accordingly. That is, the pass transistor logic circuit 45 and the display portion 32 are electrically disconnected, and the node ND2 and the wiring 54 are also electrically disconnected.

Before time T01, the potential of the wiring 59 is changed from a high potential to a low potential. When the potential of the wiring 59 is a high potential, the high potential is supplied to the gate of the transistor 56 and the transistor 56 is turned on accordingly. That is, the pass transistor logic circuit 45 and the node ND2 are electrically connected. At this time, a potential output from the output terminal of the pass transistor logic circuit 45 is supplied to the node ND2. When the potential of the wiring 59 becomes a low potential, the transistor 56 is turned off, and the pass transistor logic circuit 45 and the node ND2 are electrically disconnected accordingly.

[Time T01]

At time T01, a high potential is supplied to the wiring 34. Consequently, from time T01 to time T02, the high potential is supplied to the gate of the transistor 61. Thus, the transistor 61 is turned on. The wiring 26 and the node ND1 are electrically connected accordingly.

At time T01, a high potential is also supplied to the wiring 58. Consequently, from time T01 to time T02, the high potential is supplied to the gate of the transistor 55 and the gate of the transistor 57. Thus, the transistor 55 and the transistor 57 are turned on. The wiring 26 and the pass transistor logic circuit 45 are electrically connected accordingly. In addition, the node ND2 and the wiring 54 are electrically connected and the potential of the node ND2 becomes a low potential.

Here, before time T01, "$x_{h4}x_{h3}x_{h2}x_{h1}x_{h0}$" is input to the input terminal of the pass transistor logic circuit 45 as the digital data DD. That is, the digital data DD in which the digital data DD<0> is "$x_{h0}$", the digital data DD<1> is "$x_{h1}$", the digital data DD<2> is "$x_{h2}$", the digital data DD<3> is "$x_{h3}$", and the digital data DD<4> is "$x_{h4}$" is input. Then, "$x_{h4}x_{h3}x_{h2}x_{h1}x_{h0}$" is converted into the first analog data by the D/A converter circuit 40, and the potential of the wiring 27 becomes a potential $V_{data1}$. Since the transistor 55 is in an on state, the potential of the wiring 26 becomes the potential $V_{data1}$. In addition, since the transistor 61 is in an on state, the potential of the node ND1 in the pixel 33 also becomes the potential $V_{data1}$.

Meanwhile, the transistor 57 is in an on state, so that the potential of the node ND2 becomes the low potential that is the potential of the wiring 54. Since the transistor 56 is in an off state, the potential $V_{data1}$ of the wiring 27 is not supplied to the node ND2.

[Time T02]

At time T02, a low potential is supplied to the wiring 58. Consequently, from time T02 to time T03, the low potential is supplied to the gate of the transistor 55 and the gate of the transistor 57. Thus, the transistor 55 and the transistor 57 are turned off.

When the transistor 55 is turned off, the wiring 26 and the pass transistor logic circuit 45 are electrically disconnected. Thus, the wiring 26 and the node ND1 are brought into an electrically floating state. When the transistor 57 is turned off, the node ND2 and the wiring 54 are also electrically disconnected, and the node ND2 is also brought into an electrically floating state.

Furthermore, from time T02 to time T03, "$x_{j4}x_{j3}x_{j2}x_{j1}x_{j0}$" is input to the input terminal of the pass transistor logic circuit 45 as the digital data DD. That is, the digital data DD in which the digital data DD<0> is "$x_{j0}$", the digital data DD<1> is "$x_{j1}$", the digital data DD<2> is "$x_{j2}$", the digital data DD<3> is "$x_{j3}$", and the digital data DD<4> is "$x_{j4}$" is input. Then, "$x_{j4}x_{j3}x_{j2}x_{j1}x_{j0}$" is converted into the second analog data by the D/A converter circuit 40, and the potential of the wiring 27 becomes a potential $V_{data2}$.

In this specification, for example, the digital data "$x_{h4}x_{h3}x_{h2}x_{h1}x_{h0}$" is referred to as first digital data or 5-bit first digital data in some cases. Moreover, for example, the digital data "$x_{j4}x_{j3}x_{j2}x_{j1}x_{j0}$" is referred to as second digital data or 5-bit second digital data in some cases.

[Time T03]

At time T03, a high potential is supplied to the wiring 59. Consequently, from time T03 to time T04, the high potential is supplied to the gate of the transistor 56. Thus, the transistor 56 is turned on. The potential $V_{data2}$ of the wiring 27 is supplied to the node ND2 accordingly. Since the transistor 57 is in an off state, current does not flow to the wiring 54 from the pass transistor logic circuit 45, and the potential of the node ND2 becomes the potential $V_{data2}$.

In addition, since the wiring 26 and the node ND1 are in an electrically floating state, a change in the potential of the node ND2 causes changes in the potential of the wiring 26 and the potential of the node ND1 owing to capacitive coupling of the capacitor 53. In the timing chart of FIG. 7, the amount of change in the potential of the wiring 26 and the amount of change in the potential of the node ND1 are each denoted by a potential $\Delta V_g$. The potential $\Delta V_g$ can be estimated using the following formula (1), where a capacitance value $C_A$ is the electrostatic capacitance value of the capacitor 53 and a capacitance value $C_B$ is the electrostatic capacitance value obtained by combining the capacitor Cpt which is the parasitic capacitance of the wiring 26 and the capacitance due to the circuit 60 or the like. Here, in the case where the electrostatic capacitance of the capacitance due to the circuit 60 or the like is much smaller than the parasitic capacitance of the wiring 26, the capacitance value $C_B$ can be equal to the capacitance value of the capacitor Cpt.

[Formula 1]

$$\Delta V_g = \frac{C_A}{C_A + C_B} V_{data2} \quad (1)$$

Therefore, when the potential of the node ND1 is a potential $V_{ND1}$, the potential $V_{ND1}$ is expressed by the following formula (2). Note that from time T02 to time T03, the potential of the node ND2 is a ground potential.

[Formula 2]

$$V_{ND1} = V_{data1} + \frac{C_A}{C_A + C_B} V_{data2} \quad (2)$$

As described above, the potential $V_{data1}$ is a potential corresponding to the first analog data, and the potential $V_{data2}$ is a potential corresponding to the second analog data. Accordingly, from the formula (2), the second analog data can be added to the first analog data. Thus, the addition circuit 50 can generate and retain the third analog data. In addition, the pixel 33 can emit light having a luminance corresponding to the potential $V_{ND1}$ corresponding to the third analog data. Accordingly, an image can be displayed on the display portion 32 where the pixel 33 is provided.

When the number of bits of the digital data DD is 5 bits, the digital data DD can have any of the binary values from "00000" to "11111". Here, for example, the potential $V_{data1}$ output from the output terminal of the pass transistor logic circuit 45 when the digital data "$x_{h4}x_{h3}x_{h2}x_{h1}x_{h0}$" is "00000" is 0 V. For example, the potential $V_{data1}$ output from the output terminal of the pass transistor logic circuit 45 when the digital data "$x_{h4}x_{h3}x_{h2}x_{h1}x_{h0}$" is "11111" is 3.1 V. In this case, the potential that the potential $V_{data1}$ can be is in the range of 0 V to 3.1 V in 0.1 V steps.

Thus, in the example of the driving method shown in FIG. 7, the potential $V_{data1}$ ranging from 0 V to 3.1 V can be written to the wiring 26 and the node ND1 from time T01 to time T02.

Here, for example, $C_A:C_B=1:31$. In this case, the formula (1) is represented by the following formula (3).

[Formula 3]

$$\Delta V_g = \frac{1}{32} V_{data2} = \frac{1}{2^5} V_{data2} \quad (3)$$

When both the potential $V_{data1}$ and the potential $V_{data2}$ are output from the D/A converter circuit 40, like the digital data corresponding to the potential $V_{data1}$, digital data corresponding to the potential $V_{data2}$ can have any of the binary values from "00000" to "11111". In this case, the potential that the potential $V_{data2}$ can be is also in the range of 0 V to 3.1 V in 0.1 V steps. Thus, from the formula (3), the value of the potential $\Delta V_g$ can be in the range of 0 V to 0.096875 V in 0.003125 V steps.

Accordingly, in the example of the driving method shown in FIG. 7, from time T03 to time T04, the value of the potential of the node ND1 can be in the range of 0 V to 3.196875 V from the formula (2) and the formula (3).

That is, when the display device 10 is driven by the method shown in FIG. 7, the node ND1 in the pixel 33 can be supplied with a potential in a step smaller than the step of the potential that can be output from the 5-bit D/A converter circuit 40. In the above specific example, the D/A converter circuit 40 can only output a potential in 0.1 V steps, while a potential can be supplied to the node ND1 in 0.003125 V steps. Thus, a potential (analog data) corresponding to the number of bits larger than 5 bits that is the resolution of the D/A converter circuit 40 can be written to the pixel 33.

In the above specific example, the potential \Tama' output from the D/A converter circuit 40 having a 5-bit resolution corresponds to the high-order 5 bits of the digital data expressing an image displayed on the display portion 32. Moreover, the potential $\Delta V_g$ added to the node ND1 owing to capacitive coupling of the capacitor 53 of the addition circuit 50 corresponds to the low-order 5 bits of the digital data. Thus, the analog data written to the pixel 33 corresponds to data obtained by converting 10-bit digital data having a digital value of "$x_{h4}x_{h3}x_{h2}x_{h1}x_{h0}x_{l4}x_{l3}x_{l2}x_{l1}x_{l0}$" into analog data.

[Time T04]

At time T04, a low-level potential is supplied to the wiring 34. Consequently, from time T04 to time T05, the low potential is supplied to the gate of the transistor 61. Accordingly, the transistor 61 is turned off.

When the transistor 61 is turned off, the wiring 26 and the node ND1 are electrically disconnected. Thus, the potential $V_{ND1}$ of the node ND1 is retained

[Time T05]

At time T05, a low potential is supplied to the wiring 59. Consequently, after time T05, the low potential is supplied to the gate of the transistor 56. Accordingly, the transistor 56 is turned off.

When the transistor 56 is turned off, the pass transistor logic circuit 45 and the node ND2 are electrically disconnected. In addition, since the transistor 57 is in an off state, the node ND2 is brought into an electrically floating state. Thus, the potential of the node ND2 is retained in the capacitor 53.

The above is an example of the driving method of the display device 10. As described above, when the switch SW1 and the switch SW3 are turned on and the switch SW2 is turned off, the first analog data is written to the addition circuit 50. After that, the switch SW2 is turned on and the switch SW1 and the switch SW3 are turned off, whereby the second analog data is written to the addition circuit 50 to be added to the first analog data. In this manner, the addition circuit 50 generates and retains the third analog data.

Figure 8:
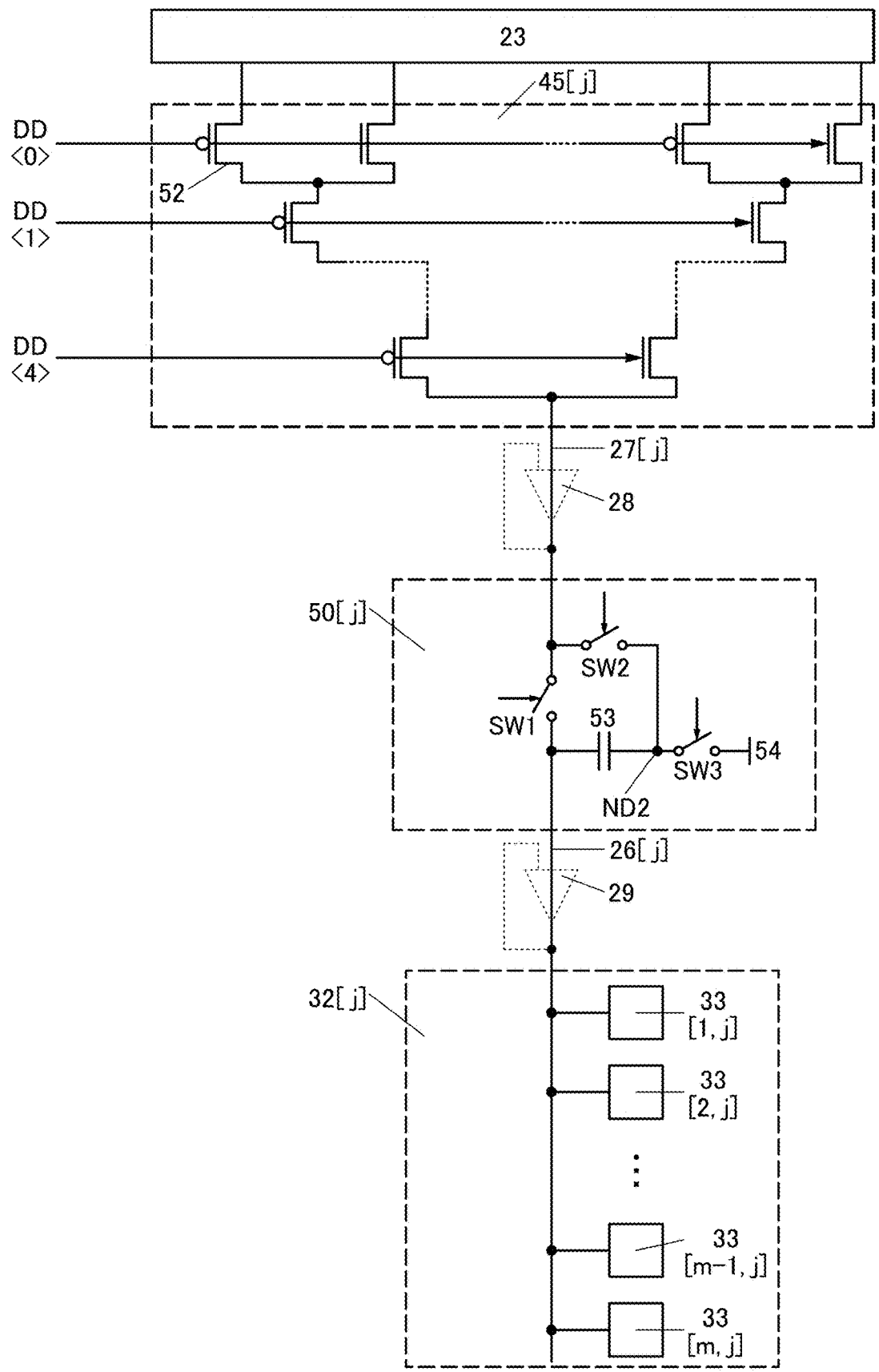
FIG. 8 is a circuit diagram illustrating a structure example of a display device.

FIG. 8 is a circuit diagram showing connection relations between the potential supply circuit 23, the pass transistor logic circuit 45[j], the addition circuit 50[j], and the display portion 32. The structure of the pass transistor logic circuit 45[j] illustrated in FIG. 8 is similar to the structure of the pass transistor logic circuit 45 illustrated in FIG. 3. The structure of the addition circuit 50[j] illustrated in FIG. 8 is similar to the structure of the addition circuit 50[j] illustrated in FIG. 4. As the pixels 33 provided in the display portion 32, the pixel 33[1,j] to the pixel 33[m,j] are illustrated.

As described above, a plurality of display portions 32 are provided as in FIG. 1 and the corresponding data driver circuits 24 and circuits 25 are provided, whereby the number of columns of the pixels 33 provided in one display portion 32 can be reduced. Accordingly, the wiring 26 that is electrically connected to the pixels 33 and functions as a data line can be shortened. Thus, the wiring resistance of the wiring 26 can be reduced. Therefore, the potential output from the addition circuit 50 can be inhibited from being attenuated before being written to the pixels 33.

As described above, the display device 10 includes the addition circuit 50, whereby analog data corresponding to digital data having a larger number of bits than digital data on which the D/A converter circuit 40 can perform D/A conversion can be written to the pixel 33. Thus, the number of bits of digital data on which the D/A converter circuit 40 can perform D/A conversion can be reduced. Accordingly, the number of stages of the transistors 52 included in the pass transistor logic circuit 45 can be reduced. Thus, the potential supplied to the pass transistor logic circuit 45 from the potential supply circuit 23 can be inhibited from being attenuated due to the drain-source resistance of the transistor 52, or the like before being output from the wiring 27 as analog data.

In the above manner, in one embodiment of the present invention, a potential output from the potential supply circuit 23 can be inhibited from being attenuated before being written to the pixel 33. Thus, although a buffer amplifier or the like is not provided between the output terminal of the pass transistor logic circuit 45 and the input terminal of the addition circuit 50, the driving speed of the display device 10 does not decrease greatly. Furthermore, although a buffer amplifier or the like is not provided between the output terminal of the addition circuit 50 and the pixel 33, the driving speed of the display device 10 does not decrease greatly.

Accordingly, the output terminal of the pass transistor logic circuit 45 can be directly connected to the input terminal of the addition circuit 50 through the wiring 27. In addition, the output terminal of the addition circuit 50 can be directly connected to the pixel 33 through the wiring 26. In FIG. 8, an amplifier circuit 28 is denoted by a dotted line to show that the output terminal of the pass transistor logic circuit 45 is directly connected to the input terminal of the addition circuit 50 without through the amplifier circuit 28. In addition, an amplifier circuit 29 is denoted by a dotted line to show that the output terminal of the addition circuit 50 is directly connected to the pixel 33 without through the amplifier circuit 29.

The display device 10 does not include the amplifier circuit 28 and/or the amplifier circuit 29, whereby the power consumption of the display device 10 can be reduced. Thus, in the case where power is supplied from a battery to the display device 10, an electronic device in which the display device 10 is provided can be continuously used for a long period. Moreover, a reduction in the power consumption of the display device 10 enables a reduction in the size and weight of a battery incorporated into the electronic device in which the display device 10 is provided. Thus, the electronic device be reduced in size and weight. For example, application of the display device 10 to a wearable electronic device such as an HMD is particularly preferable because a reduction in the size and weight of the electronic device can lighten a burden of a user of the electronic device and thus the user is less likely to feel fatigue.

In the case where the amplifier circuit 28 and/or the amplifier circuit 29 are/is provided in the display device 10, display unevenness occurs due to variation in the electrical characteristics of the amplifier circuits 28 and/or variation in the electrical characteristics of the amplifier circuits 29. Thus, when the display device 10 does not include the amplifier circuit 28 and/or the amplifier circuit 29, a high-quality image with little display unevenness can be displayed on the display portion 32.

Note that one of the amplifier circuit 28 and the amplifier circuit 29 may be provided. For example, the amplifier circuit 29 may be provided. The output terminal of the addition circuit 50 is electrically connected to the pixel 33 through the amplifier circuit 29, whereby analog data that is generated by the addition circuit 50 and then amplified can be written to the pixel 33. Thus, the display device 10 can be driven at high speed.

<Structure Example_2 of Display Device>

Figure 9:
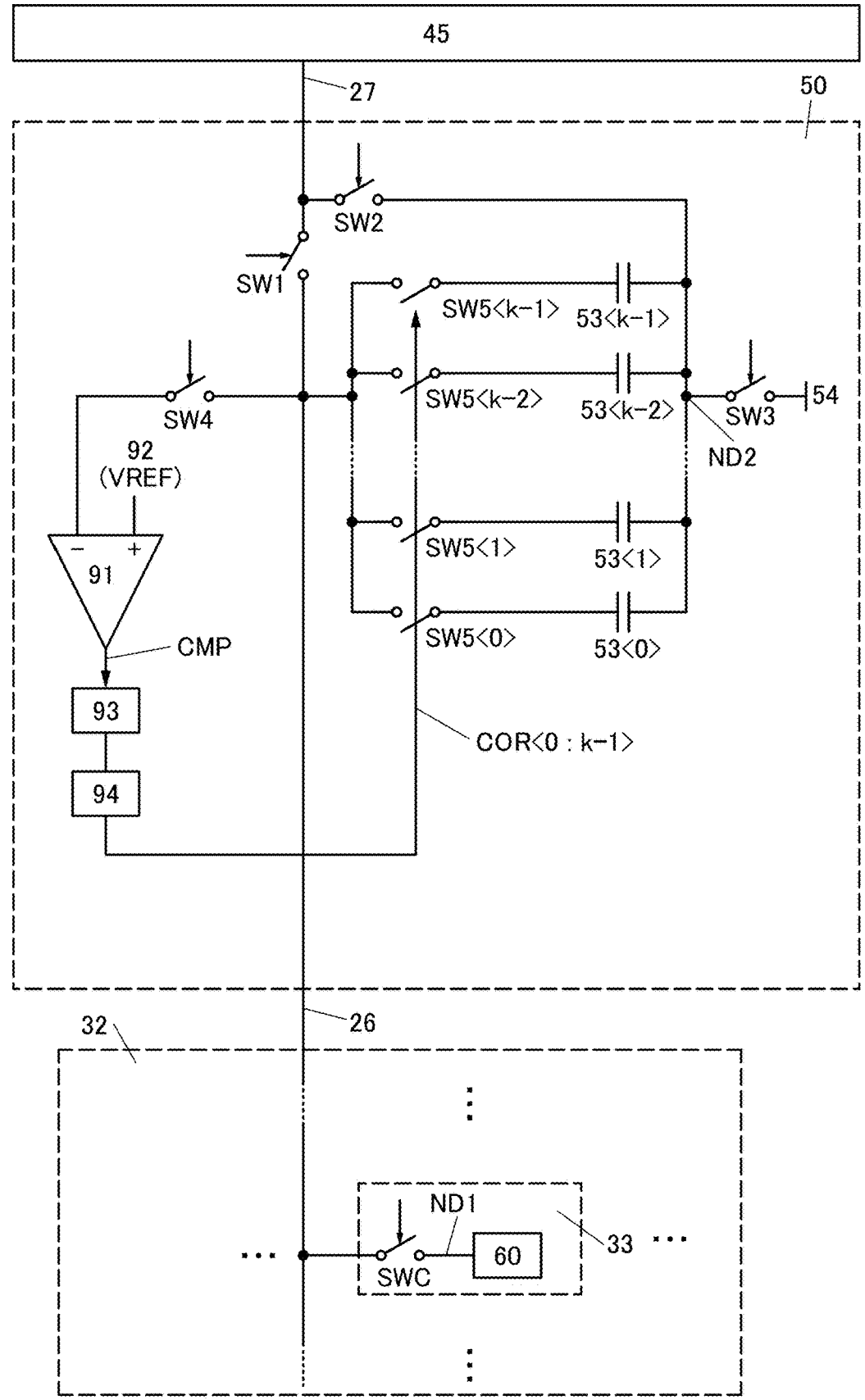
FIG. 9 is a circuit diagram illustrating a structure example of a display device.

FIG. 9 is a circuit diagram illustrating a structure example of the addition circuit 50 which is a modification example of the addition circuit 50 illustrated in FIG. 4. The addition circuit 50 illustrated in FIG. 9 is different from the addition circuit 50 illustrated in FIG. 4 in that a switch SW4, a switch SW5<0> to a switch SW5<k−1> (k is an integer of greater than or equal to 1), a comparator circuit 91, a control circuit 93, and a retention circuit 94 are provided in addition to the switch SW1 to the switch SW3. Furthermore, the addition circuit 50 illustrated in FIG. 9 is different from the addition circuit 50 illustrated in FIG. 4 in that k capacitors 53 (a capacitor 53<0> to a capacitor 53<k−1>) are provided. Note that the pass transistor logic circuit 45 and the pixel 33 are also illustrated in FIG. 9 to show the connection relation with the addition circuit 50.

In the addition circuit 50 illustrated in FIG. 9, the one terminal of the switch SW1 and the one terminal of the switch SW2 are electrically connected to the wiring 27. As described above, the one terminal of the switch SW1 can serve as the input terminal of the addition circuit 50 and can be directly connected to the output terminal of the pass transistor logic circuit 45 through the wiring 27.

The other terminal of the switch SW1, one terminal of the switch SW4, and one terminal of each of the switch SW5<0> to the switch SW5<k−1> are electrically connected to the wiring 26. As described above, the other terminal of the switch SW1 can serve as the output terminal of the addition circuit 50 and can be directly connected to the other terminal of the switch SWC provided in the pixel 33 through the wiring 26.

One terminal of each of the capacitor 53<0> to the capacitor 53<k−1> is electrically connected to the other terminal of the corresponding one of the switch SW5<0> to the switch SW5<k−1>. The other terminal of the switch SW2 is electrically connected to one terminal of the switch SW3. The one terminal of the switch SW3 is electrically connected to the other terminal of each of the capacitor 53<0> to the capacitor 53<k−1>. Thus, the capacitor 53<0> to the capacitor 53<k−1> are connected in parallel through the switch SW5<0> to the switch SW5<k−1>.

Here, a node where the other terminal of the switch SW2, the one terminal of the switch SW3, and the other terminal of each of the capacitor 53<0> to the capacitor 53<k−1> are electrically connected is the node ND2.

The other terminal of the switch SW3 is electrically connected to the wiring 54. As described above, a constant potential can be supplied to the wiring 54.

The other terminal of the switch SW4 is electrically connected to one of a non-inverting input terminal and an inverting input terminal of the comparator circuit 91. The other of the non-inverting input terminal and the inverting input terminal of the comparator circuit 91 is electrically connected to a wiring 92. A reference potential VREF is supplied to the wiring 92.

An output terminal of the comparator circuit 91 is electrically connected to an input terminal of the control circuit 93. An output terminal of the control circuit 93 is electrically connected to an input terminal of the retention circuit 94.

The comparator circuit 91 has a function of outputting a signal CMP expressing a magnitude relation between a potential input to the non-inverting input terminal of the comparator circuit 91 and a potential input to the inverting input terminal of the comparator circuit 91. Specifically, in the case where the potential input to the non-inverting input terminal of the comparator circuit 91 is higher than the potential input to the inverting input terminal of the comparator circuit 91, the signal CMP is a high-potential signal. Meanwhile, in the case where the potential input to the non-inverting input terminal of the comparator circuit 91 is lower than the potential input to the inverting input terminal of the comparator circuit 91, the signal CMP is a low-potential signal. Therefore, for example, when the reference potential VREF is supplied to the non-inverting input terminal of the comparator circuit 91 as illustrated in FIG. 9, the potential of the signal CMP is a low potential in the case where the potential supplied to the inverting input terminal of the comparator circuit 91 is higher than the reference potential VREF. In contrast, the potential of the signal CMP is a high potential in the case where the potential supplied to the inverting input terminal of the comparator circuit 91 is lower than the reference potential VREF. The reference potential VREF can have a value corresponding to a step of a potential that can be output from the D/A converter circuit 40, which will be described in detail later.

The control circuit 93 has a function of generating a signal COR for controlling on and off of the switch SW5<0> to the switch SW5<k−1>. The signal COR can be a k-bit digital signal.

The control circuit 93 has a function of updating or determining a digital value of the signal COR on the basis of the signal CMP in the case where the addition circuit 50 retains the third analog data generated by adding the second analog data to the first analog data. Specifically, for example, the control circuit 93 has a function of updating the digital value of the signal COR in the case where the potential of the signal CMP is a low potential, and the control circuit 93 has a function of not updating but determining the digital value of the signal COR in the case where the potential of the signal CMP is a high potential.

In the following description, the signal COR is a k-bit digital signal and bits of the signal COR are denoted by a signal COR<0> to a signal COR<k−1>.

For example, the switch SW5<0> can be turned on when the signal COR<0> represents "1", whereas the switch SW5<0> can be turned off when the signal COR<0> represents "0". Note that the switch SW5<0> may be turned on when the signal COR<0> represents "0" and the switch SW5<0> may be turned off when the signal COR<0> represents "1". The same applies to the signal COR<1> to the signal COR<k−1>.

The retention circuit 94 has a function of retaining data regarding on and off of the switch SW5<0> to the switch SW5<k−1>, which is expressed by the signal COR. For example, the retention circuit 94 has a function of retaining the determined digital value of the signal COR.

The retention circuit 94 can include a latch circuit, for example. Alternatively, the retention circuit 94 may include a nonvolatile memory.

In the display device 10, the ratio of the capacitance value $C_A$ to the capacitance value $C_B$ in the formula (1) and the formula (2) is preferably controlled precisely in order that the potential of analog data to be written to the pixel 33 represents the luminance of light to be emitted from the pixel 33 with high accuracy. However, it is difficult to accurately measure the capacitance value of the parasitic capacitance of the wiring 26 in the capacitance value $C_B$. Furthermore, for example, the capacitance values of the parasitic capacitance of the n wirings 26 provided in the display device 10 vary among the wirings 26 in some cases. Thus, when a plurality of capacitors 53 are provided and connected in parallel through the switches SW5, the value of "$C_A/(C_A+C_B)$" in the formula (1) and the formula (2) can be precisely controlled. Specifically, the capacitance value $C_A$ can be a total of the electrostatic capacitance of the capacitors 53 electrically connected to the switches SW5 in an on state out of the capacitor 53<0> to the capacitor 53<k−1>.

In this manner, when the addition circuit 50 has the structure illustrated in FIG. 9, the potential of the analog data to be written to the pixel 33 can express the luminance of light to be emitted from the pixel 33 with high accuracy. Thus, the display device 10 can display a high-quality image.

<Example_2 of Driving Method of Display Device>

Figure 10:
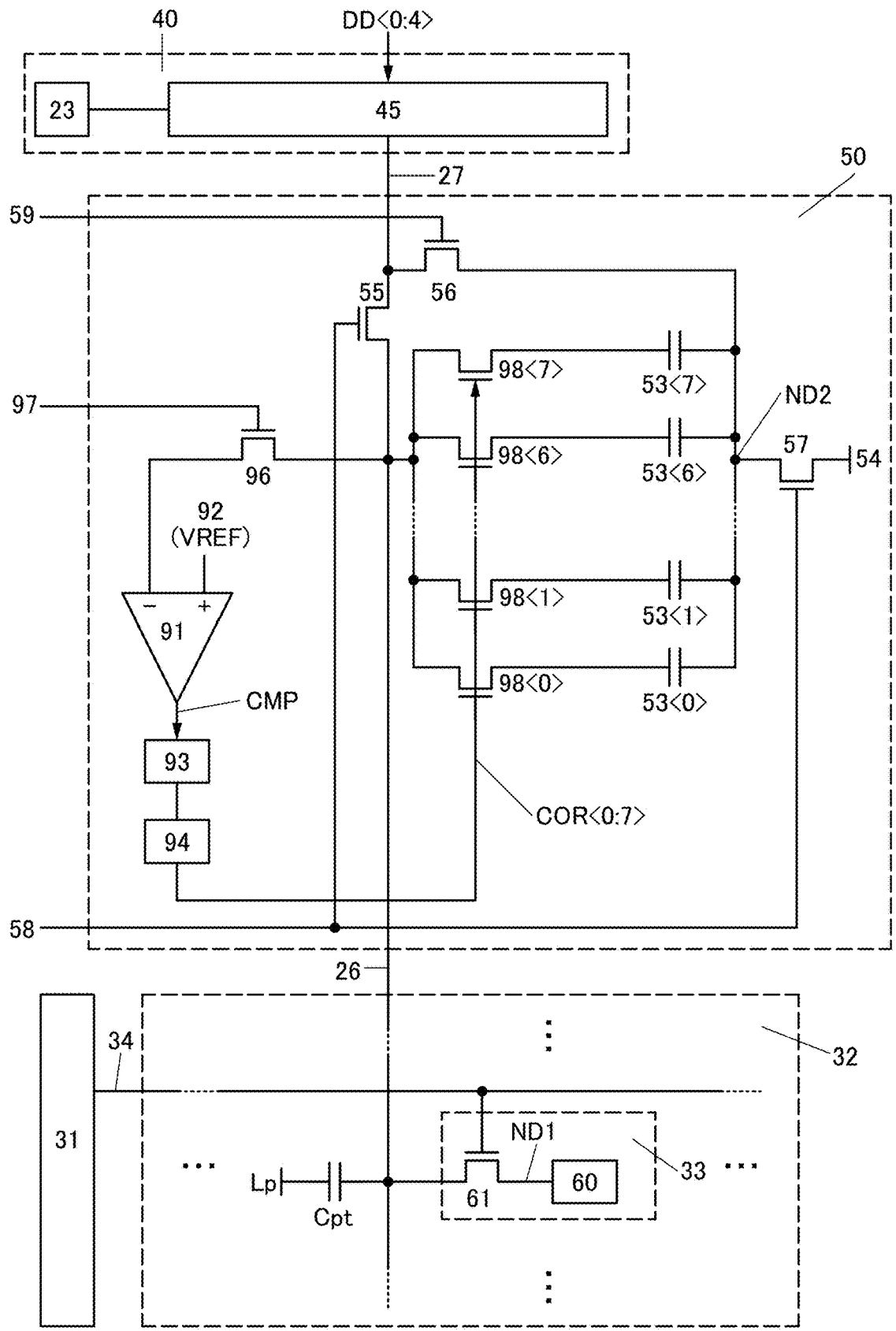
FIG. 10 is a circuit diagram illustrating a structure example of a display device.

Next, an example of a driving method of the display device 10 including the addition circuit 50 illustrated in FIG. 9 is described. An example of the driving method of the display device 10 having a structure illustrated in a circuit diagram of FIG. 10 is described. As illustrated in FIG. 10, the switch SW4 is a transistor 96. Furthermore, k is 8 and the switch SW5 is a transistor 98. Moreover, the signal COR is supplied to a gate of the transistor 98. Other structures are similar to those illustrated in FIG. 6.

In the addition circuit 50 illustrated in FIG. 10, one of a source and a drain of the transistor 96 is electrically connected to the wiring 26. A gate of the transistor 96 is electrically connected to a wiring 97. The other of the source and the drain of the transistor 96 is electrically connected to the inverting input terminal of the comparator circuit 91. One of a source and a drain of each of a transistor 98<0> to a transistor 98<7> is electrically connected to the wiring 26. The other of the source and the drain of each of the transistor 98<0> to the transistor 98<7> is electrically connected to one terminal of the corresponding one of the capacitor 53<0> to the capacitor 53<7>.

First, an example of a method for determining digital values of the signal COR<0> to the signal COR<7> is described. This allows a transistor which is to be turned on to be determined among the transistor 98<0> to the transistor 98<7>. Consequently, the capacitance value $C_A$ can be determined.

Figure 11:
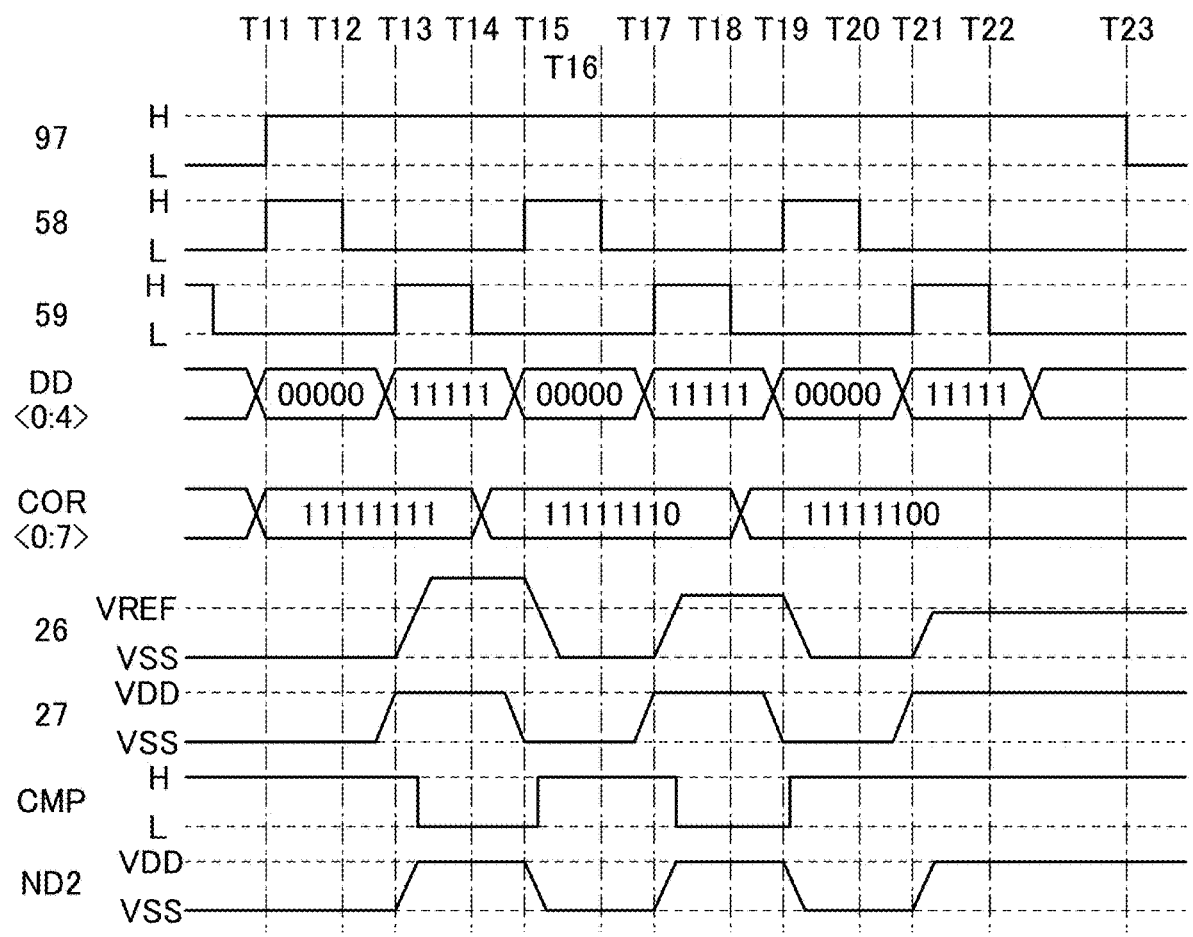
FIG. 11 is a timing chart showing an example of a method for driving a display device.

FIG. 11 is a timing chart showing an example of a method for determining the digital values of the signal COR<0> to the signal COR<7>. The timing chart of FIG. 11 shows changes in potentials of the wiring 97, the wiring 58, the wiring 59, the wiring 26, the wiring 27, the signal CMP, and the node ND2 at and around time T11 to time T23. The timing chart of FIG. 11 also shows the digital data DD and the signal COR.

Note that in an example of a driving method described in this specification, the transistor 96 and the transistor 98<0> to the transistor 98<7> which are in an on state operate in a linear region in the end unless otherwise specified. In other words, the gate voltages, the source voltages, and the drain voltages of the transistor 96 and the transistor 98<0> to the transistor 98<7> are biased appropriately to voltages in the range where the transistors operate in the linear region.

As described above, when the number of bits of the digital data DD is 5 bits, the digital data DD can have any of the binary values from "00000" to "11111". Here, the potential of the wiring 27 is the potential VSS that is a low potential in the case where the digital data DD has a digital value of "00000", and the potential of the wiring 27 is the potential VDD that is a high potential in the case where the digital data DD has a digital value of "11111". The potential of the wiring 54 is the potential VSS. Furthermore, the reference potential VREF is higher than or equal to the potential VSS and lower than or equal to the potential VDD.

In the method shown in FIG. 11, the control circuit 93 updates the digital value of the signal COR in the case where the addition circuit 50 retains the third analog data generated by adding the second analog data to the first analog data and the signal CMP is a low potential. The control circuit 93 does not update but determines the digital value of the signal COR in the case where the addition circuit 50 retains the third analog data and the signal CMP is a high potential.

Furthermore, the capacitance due to the pixel 33 such as the capacitance due to the transistor 61 and the capacitance due to the circuit 60 is much smaller than the parasitic capacitance of the wiring 26.

[Before Time T11]

Before time T11, a low potential is supplied to the wiring 97. When the potential of the wiring 97 is a low potential, the low potential is supplied to the gate of the transistor 96 and the transistor 96 is turned off accordingly. That is, the wiring 26 and the inverting input terminal of the comparator circuit 91 are electrically disconnected.

A low potential is supplied to the wiring 58. When the potential of the wiring 58 is a low potential, the low potential is supplied to the gate of the transistor 55 and the gate of the transistor 57 and the transistor 55 and the transistor 57 are turned off accordingly. That is, the pass transistor logic circuit 45 and the display portion 32 are electrically disconnected, and the node ND2 and the wiring 54 are also electrically disconnected.

Moreover, the potential of the wiring 26, the potential of the wiring 27, the potential of the node ND1, and the potential of the node ND2 are each a low potential and the potential of the signal CMP is a high potential.

Before time T11, the potential of the wiring 59 is changed from a high potential to a low potential. When the potential of the wiring 59 is a high potential, the high potential is supplied to the gate of the transistor 56 and the transistor 56 is turned on accordingly. That is, the pass transistor logic circuit 45 and the node ND2 are electrically connected. At this time, a potential output from the output terminal of the pass transistor logic circuit 45 is supplied to the node ND2. When the potential of the wiring 59 becomes a low potential, the transistor 56 is turned off, and the pass transistor logic circuit 45 and the node ND2 are electrically disconnected accordingly.

[Time T11]

At time T11, the digital value of the signal COR is "11111111". Thus, a high potential is supplied to the gates of the transistor 98<0> to the transistor 98<7>, and the transistor 98<0> to the transistor 98<7> are turned on. Accordingly, one terminal of each of the capacitor 53<0> to the capacitor 53<7> and the wiring 26 are electrically connected.

At time T11, a high potential is supplied to the wiring 97. Consequently, the high potential is supplied to the gate of the transistor 96 and the transistor 96 is turned on. Thus, the wiring 26 and the inverting input terminal of the comparator circuit 91 are electrically connected. Note that from time T11 to time T23, a high potential is supplied to the wiring 97. Therefore, from Time T11 to Time T23, the transistor 96 is in an on state.

At time T11, a high potential is supplied to the wiring 58. Thus, the high potential is supplied to the gate of the transistor 55 and the gate of the transistor 57, and the transistor 55 and the transistor 57 are turned on. When the transistor 57 is turned on, the node ND2 and the wiring 54 are electrically connected. Accordingly, the potential of the node ND2 becomes a low potential that is the potential of the wiring 54.

Here, at time T11, "00000" is input to the input terminal of the pass transistor logic circuit 45 as the digital data DD. That is, the digital data DD having the smallest digital value that the 5-bit digital data can have is input. Then, "00000" is converted into the first analog data by the D/A converter circuit 40, and the potential of the wiring 27 becomes a low potential. At this time, since the transistor 55 is in an on state, the potential of the wiring 26 becomes a low potential. Since the transistor 96 is in an on state, the potential of the inverting input terminal of the comparator circuit 91 becomes a low potential. Thus, the potential of the signal CMP is a high potential.

[Time T12]

At time T12, a low potential is supplied to the wiring 58. Thus, the low potential is supplied to the gate of the transistor 55 and the gate of the transistor 57, and the transistor 55 and the transistor 57 are turned off.

When the transistor 55 is turned off, the wiring 26 and the pass transistor logic circuit 45 are electrically disconnected. Thus, the wiring 26 is brought into an electrically floating state. When the transistor 57 is turned off, the node ND2 and the wiring 54 are also electrically disconnected, and the node ND2 is also brought into an electrically floating state.

[Time T13]

At time T13, "11111" is input to the input terminal of the pass transistor logic circuit 45 as the digital data DD. That is, the digital data DD having the largest digital value that the 5-bit digital data can have is input. Then, "11111" is converted into the second analog data by the D/A converter circuit 40, and the potential of the wiring 27 becomes a high potential.

At time T13, a high potential is supplied to the wiring 59. Consequently, the high potential is supplied to the gate of the transistor 56 and the transistor 56 is turned on. Thus, the high potential that is the potential of the wiring 27 is supplied to the node ND2. Since the transistor 57 is in an off state, current does not flow into the wiring 54 from the pass transistor logic circuit 45, and the potential of the node ND2 becomes a high potential.

In addition, since the wiring 26 is in an electrically floating state, a change in the potential of the node ND2 causes a change in the potential of the wiring 26 owing to capacitive coupling of the capacitor 53. At time T13, the transistor 98<0> to the transistor 98<7> are in an on state. Thus, the potential of the wiring 26 is changed owing to the capacitive coupling of the capacitor 53<0> to the capacitor 53<7>. The second analog data is added to the first analog data by the potential change of the wiring 26, and the third analog data is generated. The third analog data is retained in the addition circuit 50. Here, from time T13 to time T14, the potential of the wiring 26 is higher than the reference potential VREF.

As described above, from time T13 to time T14, the transistor 96 is in an on state. Thus, the potential of the wiring 26 is supplied to the inverting input terminal of the comparator circuit 91. As described above, from time T13 to time T14, the potential of the wiring 26 is higher than the reference potential VREF. Thus, the potential of the signal CMP is a low potential.

[Time T14]

At time T14, a low potential is supplied to the wiring 59. Accordingly, the low potential is supplied to the gate of the transistor 56 and the transistor 56 is turned off.

At time T14, the addition circuit 50 retains the third analog data generated by adding the second analog data to the first analog data. The potential of the signal CMP is a low potential. Thus, the digital value of the signal COR is updated. At time T14, the digital value of the signal COR is updated to "11111110" from "11111111". When the digital value of the signal COR is "11111110", a low potential is supplied to the gate of the transistor 98<0> and the transistor 98<0> is turned off. Accordingly, the capacitor 53<0> and the wiring 26 are electrically disconnected. In contrast, a high potential is supplied to the gates of the transistor 98<1> to the transistor 98<7>, and the transistor 98<1> to the transistor 98<7> are turned on. Thus, one terminal of each of the capacitor 53<1> to the capacitor 53<7> and the wiring 26 are electrically connected. Note that in the timing chart shown in FIG. 11, changes in potentials of the wiring 26 and the like due to update of the digital value of the signal COR from time T14 to time T15 are not taken into consideration.

[Time T15]

At time T15, a high potential is supplied to the wiring 58. Accordingly, the potential of the node ND2 becomes a low potential as in time T11.

Here, at time T15, "00000" is input to the input terminal of the pass transistor logic circuit 45 as the digital data DD as in time T11. Accordingly, the signal CMP becomes a high potential.

[Time T16]

At time T16, a low potential is supplied to the wiring 58. In this manner, the transistor 55 and the transistor 57 are tuned off as in time T12, and the wiring 26 and the node ND2 are brought into an electrically floating state.

[Time T17]

At time T17, "11111" is input to the input terminal of the pass transistor logic circuit 45 as the digital data DD as in time T13. Thus, the potential of the wiring 27 becomes a high potential.

At time T17, a high potential is supplied to the wiring 59. Thus, the transistor 56 is turned on and the potential of the node ND2 becomes a high potential as in time T13.

In addition, since the wiring 26 is in an electrically floating state as in time T13, a change in the potential of the node ND2 causes a change in the potential of the wiring 26. At time T17, the transistor 98<1> to the transistor 98<7> are in an on state. Thus, the potential of the wiring 26 is changed owing to the capacitive coupling of the capacitor 53<1> to the capacitor 53<7>. The second analog data is added to the first analog data by the potential change of the wiring 26, and the third analog data is generated. The third analog data is retained in the addition circuit 50. Here, from time T17 to time T18, the potential of the wiring 26 is higher than the reference potential VREF.

The potential of the wiring 26 from time T17 to time T18 is the potential $V_{ND1}$ expressed by the formula (2). As described above, the capacitance value $C_A$ can be a total of the electrostatic capacitance of the capacitors 53 electrically connected to the transistors 98 in an on state out of the capacitor 53<0> to the capacitor 53<7>. From time T17 to time T18, the transistor 98<1> to the transistor 98<7> are in an on state and the transistor 98<0> is in an off state. Thus, the capacitance value $C_A$ is a value corresponding to a total of the electrostatic capacitance of the capacitor 53<1> to the capacitor 53<7>. Here, since the transistor 98<0> to the transistor 98<7> are in an on state from time T13 to time T14, the capacitance value $C_A$ is a value corresponding to a total of the electrostatic capacitance of the capacitor 53<0> to the capacitor 53<7>. Accordingly, the capacitance value $C_A$ from time T17 to time T18 is smaller than the capacitance value $C_A$ from time T13 to time T14. As expressed by the formula (2), when the potential $V_{data1}$, the potential $V_{data2}$, and the capacitance value $C_B$ are not changed, the smaller the capacitance value $C_A$ is, the lower the potential of the wiring 26 is. Thus, the potential of the wiring 26 from time T17 to time T18 is lower than the potential of the wiring 26 from time T13 to time T14.

As described above, from time T17 to time T18, the transistor 96 is in an on state. Thus, the potential of the wiring 26 is supplied to the inverting input terminal of the comparator circuit 91. As described above, from time T17 to time T18, the potential of the wiring 26 is higher than the reference potential VREF. Thus, the potential of the signal CMP is a low potential.

[Time T18]

At time T18, a low potential is supplied to the wiring 59. Accordingly, the low potential is supplied to the gate of the transistor 56 and the transistor 56 is turned off.

At time T18, the addition circuit 50 retains the third analog data generated by adding the second analog data to the first analog data. The potential of the signal CMP is a low potential. Thus, the digital value of the signal COR is updated. At time T18, the digital value of the signal COR is updated to "11111100" from "11111110". When the digital value of the signal COR is "11111100", a low potential is supplied to the gates of the transistor 98<0> and the transistor 98<1> and the transistor 98<0> and the transistor 98<1> are turned off. Accordingly, the wiring 26 and each of the capacitor 53<0> and the capacitor 53<1> are electrically disconnected. In contrast, a high potential is supplied to the gates of the transistor 98<2> to the transistor 98<7>, and the transistor 98<2> to the transistor 98<7> are turned on. Thus, one terminal of each of the capacitor 53<2> to the capacitor 53<7> and the wiring 26 are electrically connected. Note that in the timing chart shown in FIG. 11, changes in potentials of the wiring 26 and the like due to update of the digital value of the signal COR from time T18 to time T19 are not taken into consideration.

[Time T19]

At time T19, a high potential is supplied to the wiring 58. Accordingly, the potential of the node ND2 becomes a low potential as in time T11 and the like.

Here, at time T19, "00000" is input to the input terminal of the pass transistor logic circuit 45 as the digital data DD as in time T11 and the like. Accordingly, the potential of the signal CMP becomes a high potential.

[Time T20]

At time T20, a low potential is supplied to the wiring 58. In this manner, the transistor 55 and the transistor 57 are tuned off as in time T12 and the like, and the wiring 26 and the node ND2 are brought into an electrically floating state.

[Time T21]

At time T21, "11111" is input to the input terminal of the pass transistor logic circuit 45 as the digital data DD as in time T13 and the like. Thus, the potential of the wiring 27 becomes a high potential.

At time T21, a high potential is supplied to the wiring 59. Thus, the transistor 56 is turned on and the potential of the node ND2 becomes a high potential as in time T13 and the like.

In addition, since the wiring 26 is in an electrically floating state as in time T13 and the like, a change in the potential of the node ND2 causes a change in the potential of the wiring 26. At time T21, the transistor 98<2> to the transistor 98<7> are in an on state. Thus, the potential of the wiring 26 is changed owing to the capacitive coupling of the capacitor 53<2> to the capacitor 53<7>. The second analog data is added to the first analog data by the potential change of the wiring 26, and the third analog data is generated. The third analog data is retained in the addition circuit 50. Here, from time T21 to time T22, the potential of the wiring 26 is lower than the reference potential VREF.

The potential of the wiring 26 from time T21 to time T22 is the potential $V_{ND1}$ expressed by the formula (2). As described above, the capacitance value $C_A$ can be a total of the electrostatic capacitance of the capacitors 53 electrically connected to the transistors 98 in an on state out of the capacitor 53<0> to the capacitor 53<7>. From time T21 to time T22, the transistor 98<2> to the transistor 98<7> are in an on state and the transistor 98<0> and the transistor 98<1> are in an off state. Thus, the capacitance value $C_A$ is a value corresponding to a total of the electrostatic capacitance of the capacitor 53<2> to the capacitor 53<7>. Here, since the transistor 98<1> to the transistor 98<7> are in an on state from time T17 to time T18, the capacitance value $C_A$ is a value corresponding to a total of the electrostatic capacitance of the capacitor 53<1> to the capacitor 53<7>. Accordingly, the capacitance value $C_A$ from time T21 to time T22 is smaller than the capacitance value $C_A$ from time T17 to time T18. As expressed by the formula (2), when the potential $V_{data1}$, the potential $V_{data2}$, and the capacitance value $C_B$ are not changed, the smaller the capacitance value $C_A$ is, the lower the potential of the wiring 26 is. Thus, the potential of the wiring 26 from time T21 to time T22 is lower than the potential of the wiring 26 from time T17 to time T18.

As described above, from time T21 to time T22, the transistor 96 is in an on state. Thus, the potential of the wiring 26 is supplied to the inverting input terminal of the comparator circuit 91. As described above, from time T21 to time T22, the potential of the wiring 26 is lower than the reference potential VREF. Thus, the potential of the signal CMP is a high potential.

[Time T22]

At time T22, a low potential is supplied to the wiring 59. Accordingly, the low potential is supplied to the gate of the transistor 56 and the transistor 56 is turned off.

At time T22, the addition circuit 50 retains the third analog data generated by adding the second analog data to the first analog data. The potential of the signal CMP is a high potential. Thus, the digital value of the signal COR is not updated but determined. At time T18, the digital value of the signal COR is determined to be "11111100". The determined digital value is retained in the retention circuit 94.

[Time T23]

At time T23, a low potential is supplied to the wiring 97. Accordingly, the low potential is supplied to the gate of the transistor 96 and the transistor 96 is turned off.

In the above manner, the digital values of the signal COR<0> to the signal COR<7> can be determined.

As described above, when the transistor 55 and the transistor 57 are in an on state and the transistor 56 is in an off state, the first digital data is converted into the first analog data by the D/A converter circuit 40 and the first analog data is written to the addition circuit 50. Thus, the potential of the wiring 26 becomes a potential corresponding to the first analog data. After that, when the transistor 56 is turned on and the transistor 55 and the transistor 57 are turned off, the second digital data is converted into the second analog data by the D/A converter circuit 40 and the second analog data is added to the first analog data. Thus, the potential of the wiring 26 is changed by a potential corresponding to the second analog data. The potential of the wiring 26 after change corresponds to analog data obtained by D/A conversion of digital data that has a high-order bit that is the digital value included in the first digital data and a low-order bit that is the digital value included in the second digital data.

As described above, a difference between the potential of the wiring 26 at the time when the digital value of the second digital data is largest (e.g., all the bits are "1") and the potential of the wiring 26 at the time when the digital value of the second digital data is smallest (e.g., all the bits are "0") is preferably smaller than the amount of change in the potential of the wiring 26 at the time when the digital value of the first digital data is increased by 1. That is, the maximum value of the amount of change in the potential of the wiring 26 at the time when the second analog data is supplied to the addition circuit 50 is preferably smaller than the step size of the potential that can be output from the D/A converter circuit 40. In this manner, for example, the potential written to the pixel 33 can be increased with an increase in the digital value of digital data that has a high-order bit that is the digital value included in the first digital data and a low-order bit that is the digital value included in the second digital data. That is, for example, the potential written to the pixel 33 can be inhibited from being reduced even with an increase in the digital value of digital data that has a high-order bit that is the digital value included in the first digital data and a low-order bit that is the digital value included in the second digital data.

In the method shown in FIG. 11, first, the range of potential change of the wiring 26 at the time when the digital value of the second digital data is largest is detected. Next, the digital value of the signal COR is reduced by 1 and the range of potential change of the wiring 26 is also detected. This process is repeated, and the digital values of the signal COR<0> to the signal COR<7> are determined when the potential of the wiring 26 becomes lower than the reference potential VREF. As described above, the capacitance value $C_A$ in the formula (1) and the formula (2) can be determined by the digital values of the signal COR<0> to the signal COR<7>.

As described above, by performing the method illustrated in FIG. 11 under the conditions where the reference potential VREF is lower than or equal to the potential "$\Delta V_{DAC}$+VSS", for example, equal to the potential "$\Delta V_{DAC}$+VSS" where the step of the potential that can be output from the D/A converter circuit 40 is the potential $\Delta V_{DAC}$, the largest amount of change in the potential of the wiring 26 at the time when the second analog data is supplied to the addition circuit 50 can be smaller than the potential $\Delta V_{DAC}$. Thus, the potential of the analog data to be written to the pixel 33 can represent the luminance of light to be emitted from the pixel 33 with high accuracy. Note that in the case where the potential of the wiring 26 at the time when the first analog data is supplied to the addition circuit 50 is not the potential VSS but, for example, a potential $V_1$, the reference potential VREF is preferably lower than or equal to the potential "$\Delta V_{DAC}+V_1$", for example, equal to the potential "$\Delta V_{DAC}+V_1$". Thus, in the case where the digital value of the signal COR is determined by the method shown in FIG. 11, the digital value of the first digital data is not necessarily the minimum digital value (e.g., all the bits are "0") that the digital data DD can have.

Here, the potential of the wiring 54 is preferably equal to the potential of the wiring 27 at the time when the digital value of the digital data DD is smallest. In this manner, the range of the potential change of the wiring 26 at the time when the digital value of the second digital data is largest can be equal to a difference between the potential of the wiring 26 at the time when the digital value of the second digital data is largest and the potential of the wiring 26 at the time when the digital value of the second digital data is smallest.

Figure 12:
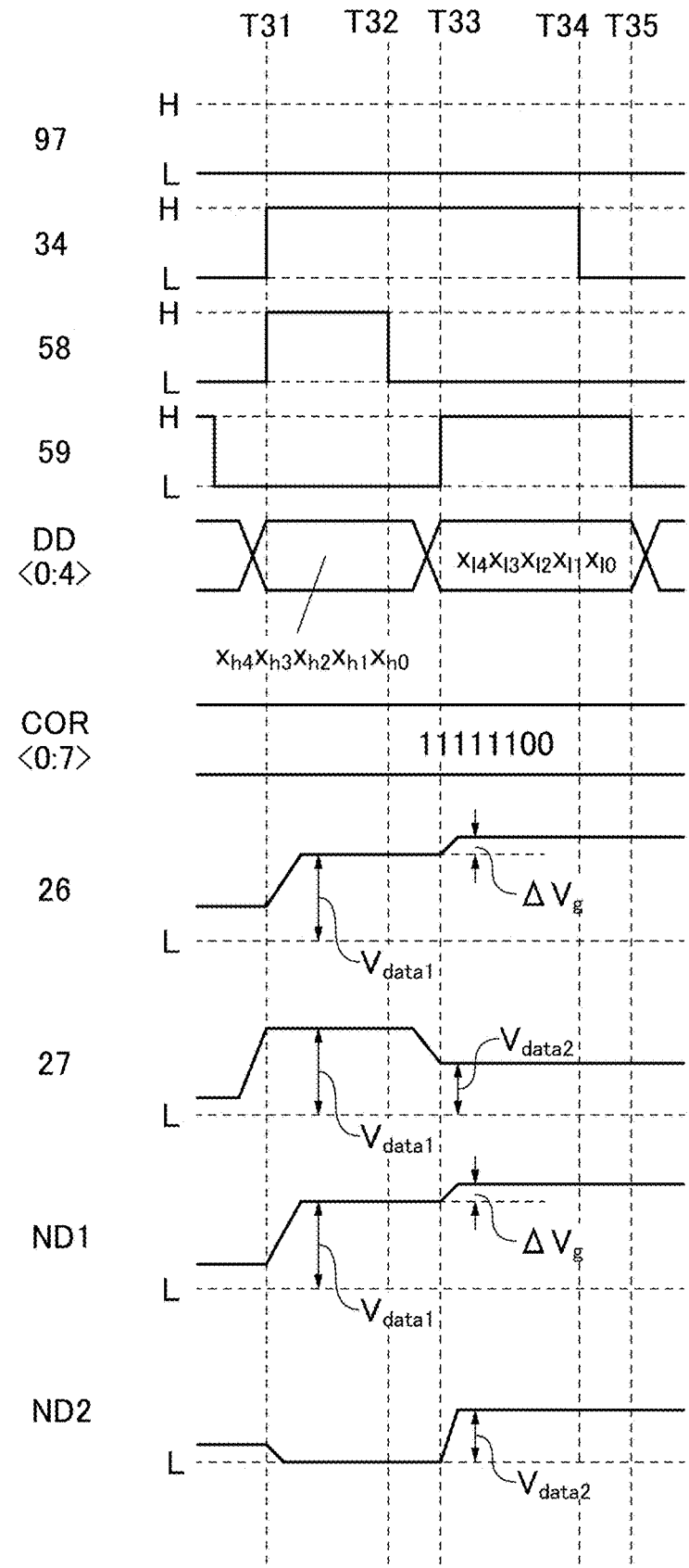
FIG. 12 is a timing chart showing an example of a method for driving a display device.

FIG. 12 is a timing chart showing an example of a method for writing analog data to the pixel 33 when the addition circuit 50 has the structure illustrated in FIG. 10. The timing chart shown in FIG. 12 shows changes in the potentials of the wiring 97, the wiring 34, the wiring 58, the wiring 59, the wiring 26, the wiring 27, the node ND1, and the node ND2 at and around time T31 to time T35. The timing chart of FIG. 7 also shows the digital data DD and the signal COR.

From time T31 to time T35, a low potential is supplied to the wiring 97. Consequently, the low potential is supplied to the gate of the transistor 96 from time T31 to time T35. Thus, the transistor 96 is turned off.

Furthermore, from time T31 to time T35, the digital value of the signal COR is a digital value determined by the method shown in FIG. 11, for example. The digital value of the signal COR is determined to be "11111100" in FIG. 11; thus, from time T31 to time T35 in FIG. 12, the digital value of the signal COR is "11111100".

The changes in the potentials of the wiring 34, the wiring 58, the wiring 59, the wiring 26, the wiring 27, the node ND1, and the node ND2, and the digital data DD from time T31 to time T35 can be similar to the changes in the potentials of the wiring 34, the wiring 58, the wiring 59, the wiring 26, the wiring 27, the node ND1, and the node ND2, and the digital data DD from time T01 to time T05 in FIG. 7.

The above is an example of the method for driving the display device 10 including the addition circuit 50 illustrated in FIG. 10.

<Structure Example_3 of Display Device>

Figure 13:
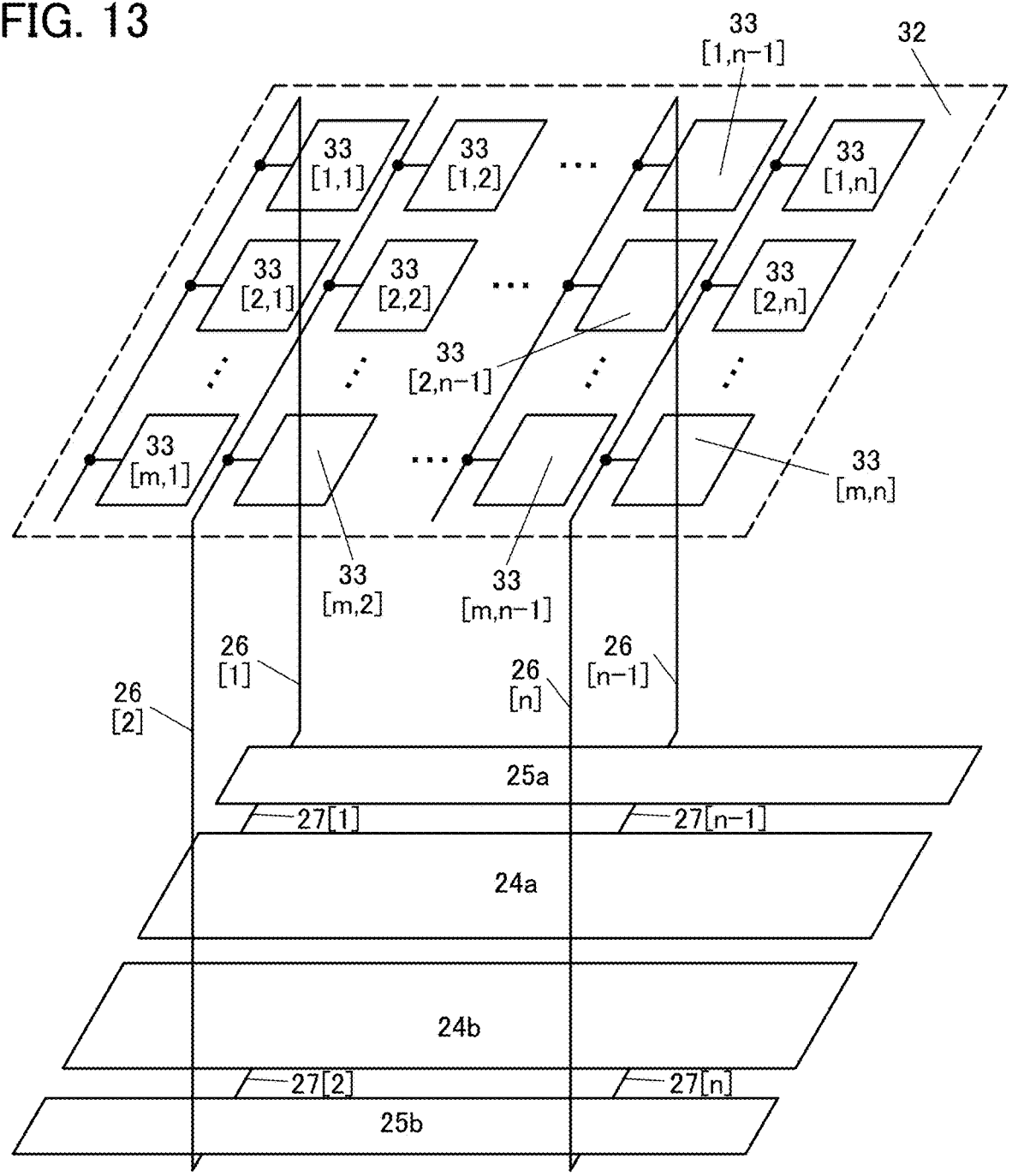
FIG. 13 is a block diagram illustrating a structure example of a display device.

In the display device 10 illustrated in FIG. 1, one data driver circuit 24 and one circuit 25 are provided for one display portion 32; however, one embodiment of the present invention is not limited thereto. FIG. 13 is a block diagram illustrating one display portion 32 and circuits provided to have regions overlapping with the display portion. The pixels 33 are arranged in a matrix of m rows and n columns in the display portion 32. Moreover, a data driver circuit 24a, a data driver circuit 24b, a circuit 25a, and a circuit 25b are provided to have regions overlapping with the display portion 32. That is, the structure example illustrated in FIG. 13 is different from the structure example illustrated in FIG. 1 in that a plurality of data driver circuits 24 (the data driver circuit 24a and the data driver circuit 24b) and a plurality of circuits 25 (the circuit 25a and the circuit 25b) are provided for one display portion 32.

An output terminal of the data driver circuit 24a is electrically connected to an input terminal of the circuit 25a through the wiring 27, and an output terminal of the circuit 25a is electrically connected to the pixels 33 in, for example, an odd-numbered column through the wiring 26. An output terminal of the data driver circuit 24b is electrically connected to an input terminal of the circuit 25b through the wiring 27, and an output terminal of the circuit 25b is electrically connected to the pixels 33 in, for example, an even-numbered column through the wiring 26.

Figure 14:
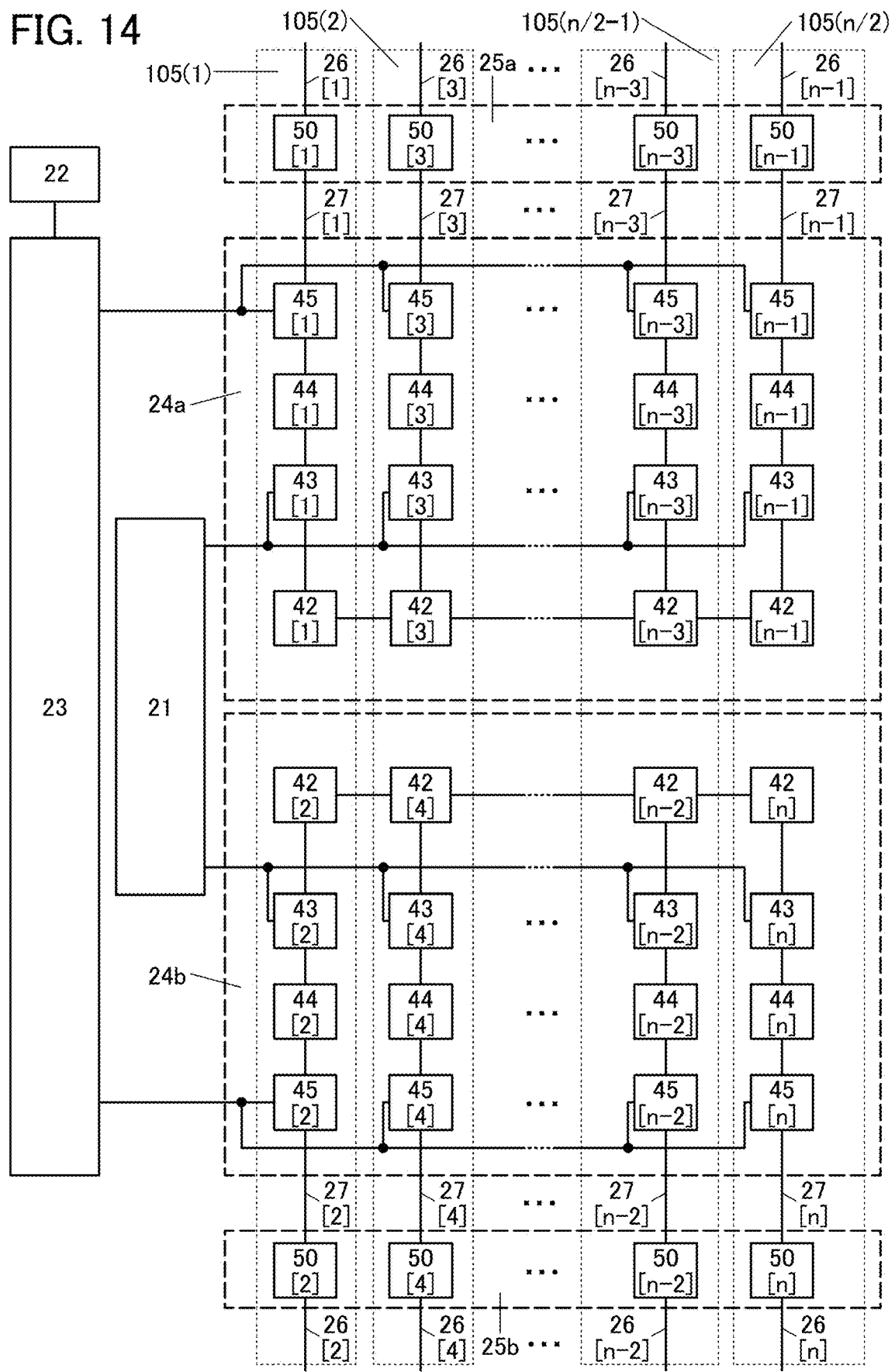
FIG. 14 is a block diagram illustrating a structure example of a display device.

FIG. 14 is a block diagram illustrating structure examples of the data driver circuit 24a, the data driver circuit 24b, the circuit 25a, and the circuit 25b. Note that the circuit 21, the potential generation circuit 22, and the potential supply circuit 23 are also illustrated in FIG. 14 to show connection relations.

Like the data driver circuit 24 illustrated in FIG. 2, the data driver circuit 24a and the data driver circuit 24b each include the register circuit 42, the latch circuit 43, the level shifter circuit 44, and the pass transistor logic circuit 45. Like the circuit 25 illustrated in FIG. 2, the circuit 25a and the circuit 25b each include the addition circuit 50.

For example, the register circuit 42[1], the latch circuit 43[1], a level shifter circuit 44[1], and the pass transistor logic circuit 45[1] are provided in the data driver circuit 24a, and the addition circuit 50[1] is provided in the circuit 25a. The register circuit 42[2], the latch circuit 43[2], a level shifter circuit 44[2], and the pass transistor logic circuit 45[2] are provided in the data driver circuit 24b, and the addition circuit 50[2] is provided in the circuit 25b. These circuits are provided in a region 105(1).

For example, the register circuit 42[$n-1$], the latch circuit 43[$n-1$], a level shifter circuit 44[$n-1$], and the pass transistor logic circuit 45[$n-1$] are provided in the data driver circuit 24a, and the addition circuit 50[$n-1$] is provided in the circuit 25a. The register circuit 42[$n$], the latch circuit 43[$n$], a level shifter circuit 44[$n$], and the pass transistor logic circuit 45[$n$] are provided in the data driver circuit 24b, and the addition circuit 50[$n$] is provided in the circuit 25b. These circuits are provided in a region 105($n$/2).

Thus, when h is an integer of greater than or equal to 1 and less than or equal to n/2, the register circuit 42[$2h-1$], the latch circuit 43[$2h-1$], a level shifter circuit 44[$2h-1$], and the pass transistor logic circuit 45[$2h-1$] are provided in the data driver circuit 24a, and the addition circuit 50[$2h-1$] is provided in the circuit 25a. The register circuit 42[$2h$], the latch circuit 43[$2h$], a level shifter circuit 44[$2h$], and the pass transistor logic circuit 45[$2h$] are provided in the data driver circuit 24b, and the addition circuit 50[$2h$] is provided in the circuit 25b. These circuits are provided in a region 105($h$).

The region 105 can be rectangular, for example. Thus, the addition circuit 50[$2h-1$], the pass transistor logic circuit 45[$2h-1$], the level shifter circuit 44[$2h-1$], the latch circuit 43[$2h-1$], the register circuit 42[$2h-1$], the register circuit 42[$2h$], the latch circuit 43[$2h$], the level shifter circuit 44[$2h$], the pass transistor logic circuit 45[$2h$], and the addition circuit 50[$2h$] can be laid out in a straight line when seen from the above, for example.

As described above, when the display device 10 has the structures illustrated in FIG. 13 and FIG. 14, circuits included in the data diver circuit 24 and circuits included in the circuit 25 can be efficiently laid out in, for example, the entire region overlapping with the display portion 32. For example, densely providing transistors and the like in part of the region overlapping with the display portion 32 and hardly providing transistors and the like in another region can be avoided.

Figure 15:
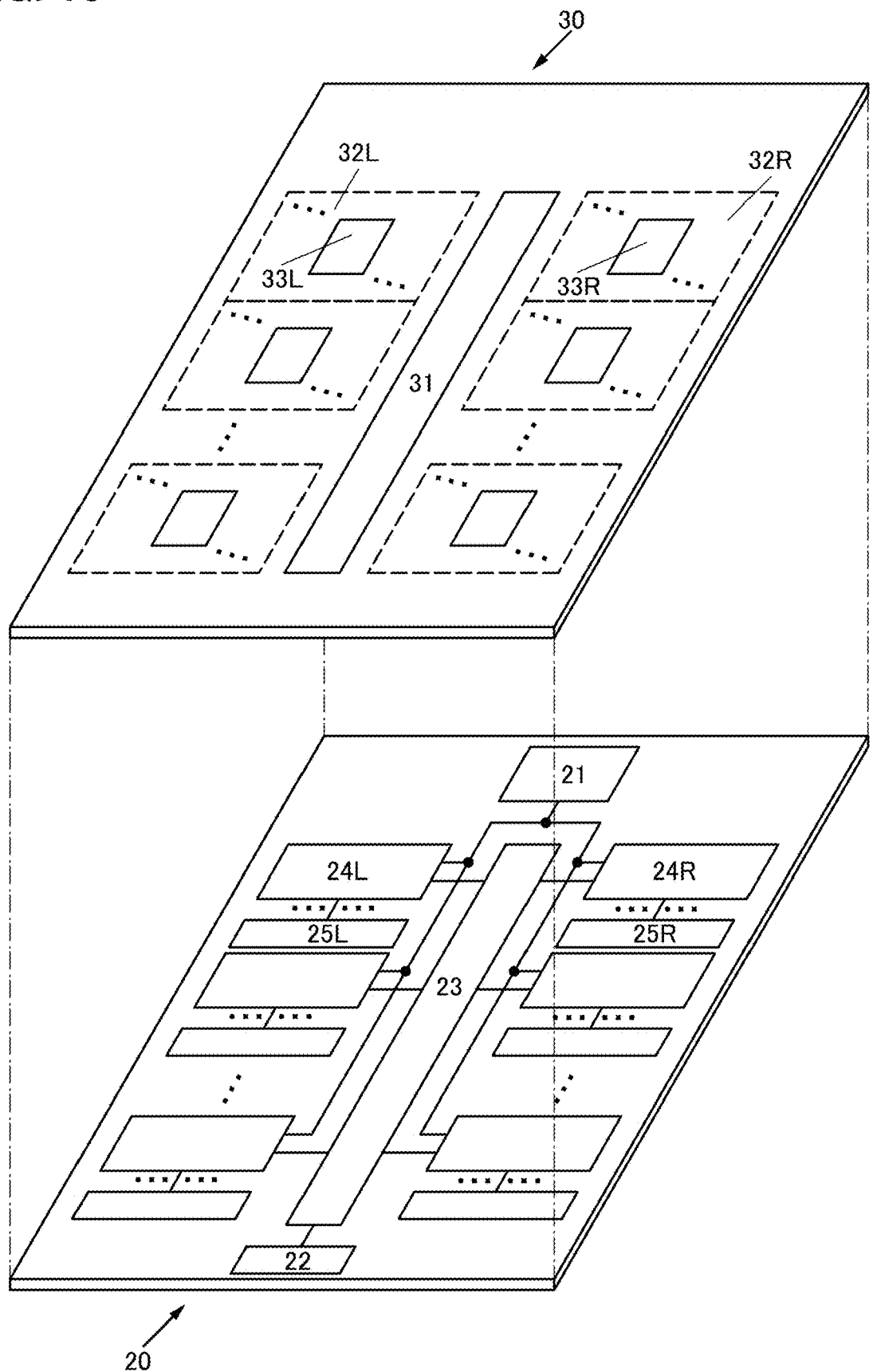
FIG. 15 is a block diagram illustrating a structure example of a display device.

In the display device 10 illustrated in FIG. 1, the potential supply circuit 23L is provided to the left of the data driver circuit 24L and the circuit 25L, and the potential supply circuit 23R is provided to the right of the data driver circuit 24R and the circuit 25R. Furthermore, the gate driver circuit 31L is provided on the left of the display portion 32L, and the gate driver circuit 31R is provided on the right of the display portion 32R. That is, in the display device 10 illustrated in FIG. 1, two potential supply circuits 23 are provided to face each other with the data driver circuits 24 and the circuits 25 therebetween. In addition, two gate driver circuits 31 are provided to face each other with the display portions 32 therebetween. However, one embodiment of the present invention is not limited thereto. FIG. 15 is a block diagram illustrating a structure example of the display device 10, and shows a modification example of the display device 10 illustrated in FIG. 1. The display device 10 illustrated in FIG. 15 is different from the display device 10 illustrated in FIG. 1 in that the potential supply circuit 23 is provided between the data driver circuit 24L and the circuit 25L, and the data driver circuit 24R and the circuit 25R and the gate driver circuit 31 is provided between the display portion 32L and the display portion 32R.

In the display device 10 illustrated in FIG. 15, all the data driver circuits 24 can be inhibited from having a long wiring distance from the output terminal of the potential supply circuit 23, and the number of the potential supply circuits 23 can be reduced as compared to that in the display device 10 illustrated in FIG. 1. Moreover, all the pixels 33 can be inhibited from having a long wiring distance from the output terminal of the gate driver circuit 31, and the number of the gate driver circuits 31 can be reduced as compared to that in the display device 10 illustrated in FIG. 1. Thus, the size of the display device 10 can be reduced. Moreover, the area of the display portion 32 can be enlarged.

Figure 16:
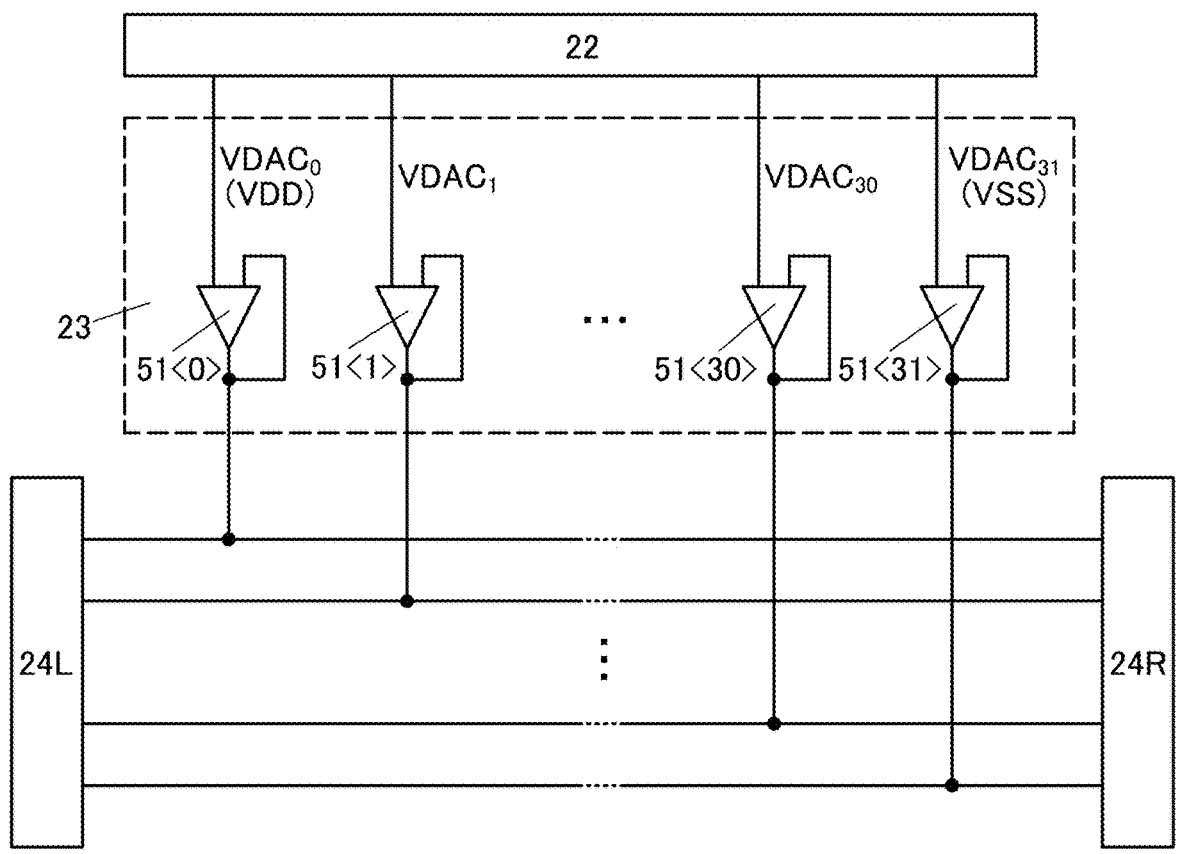
FIG. 16 is a circuit diagram illustrating a structure example of a display device.

FIG. 16 is a circuit diagram illustrating a structure example of the potential supply circuit 23 included in the display device 10 illustrated in FIG. 15. Note that the potential generation circuit 22, the data driver circuit 24L, and the data driver circuit 24R are also illustrated in FIG. 16 to show connection relations.

Like the potential supply circuit 23 illustrated in FIG. 3, the potential supply circuit 23 illustrated in FIG. 16 includes the amplifier circuit 51. As illustrated in FIG. 16, the output terminal of the amplifier circuit 51 can be electrically connected to both the data driver circuit 24L and the data driver circuit 24R.

Figure 17:
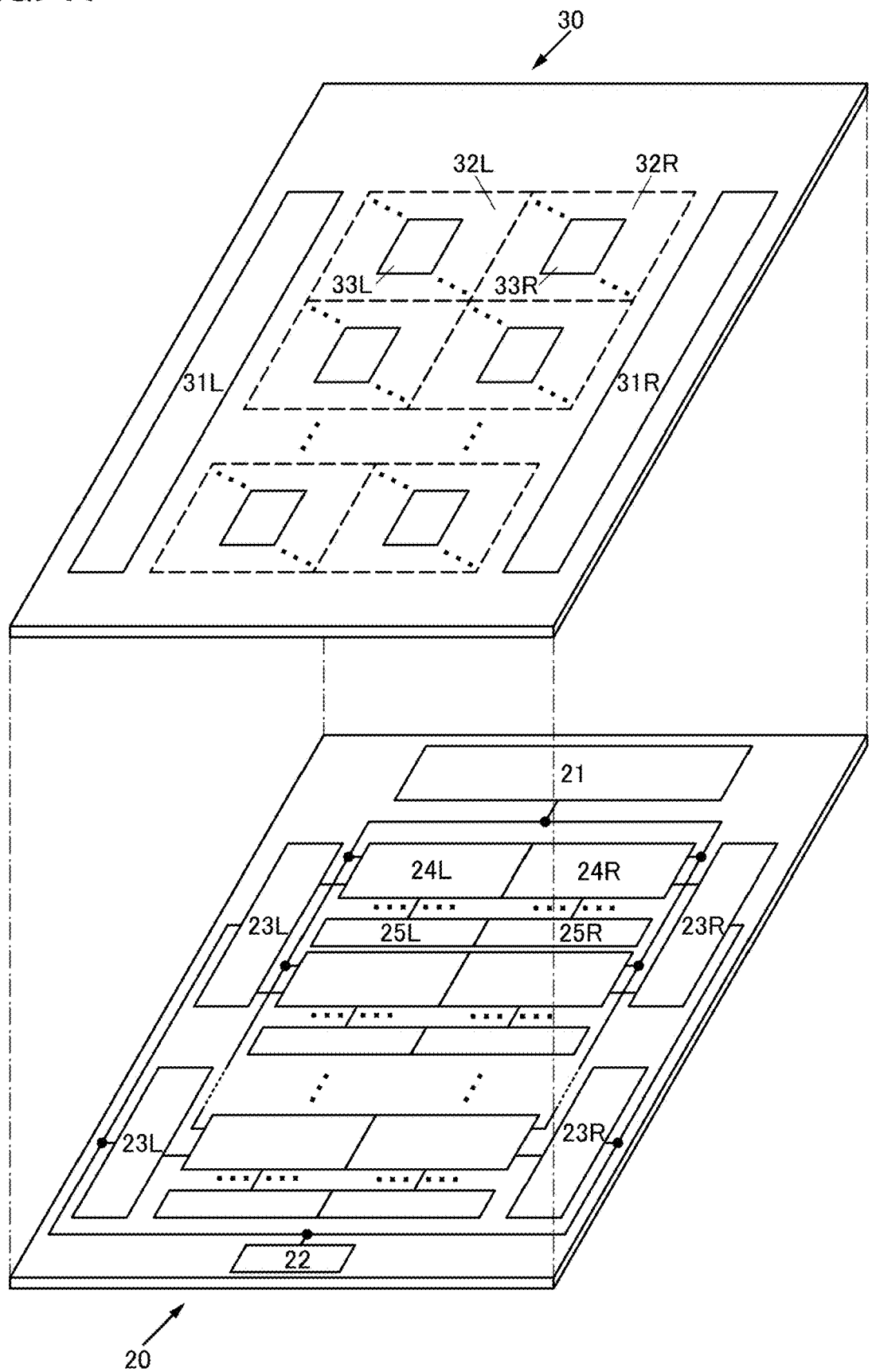
FIG. 17 is a block diagram illustrating a structure example of a display device.

In the display device 10 illustrated in FIG. 1, one potential supply circuit 23L and one potential supply circuit 23R are provided; however, one embodiment of the present invention is not limited thereto. FIG. 17 is a block diagram illustrating a structure example of the display device 10, and shows a modification example of the display device 10 illustrated in FIG. 1. The display device 10 illustrated in FIG. 17 is different from the display device 10 illustrated in FIG. 1 in that two potential supply circuits 23L and two potential supply circuits 23R are provided.

With an increase in the number of the potential supply circuits 23 provided in the display device 10, the number of the data driver circuits 24 electrically connected to one potential supply circuit 23 can be reduced. Thus, a load on the output terminal of the potential supply circuit 23 can be reduced. Accordingly, the power consumption of the display device 10 can be reduced.

Figure 18:
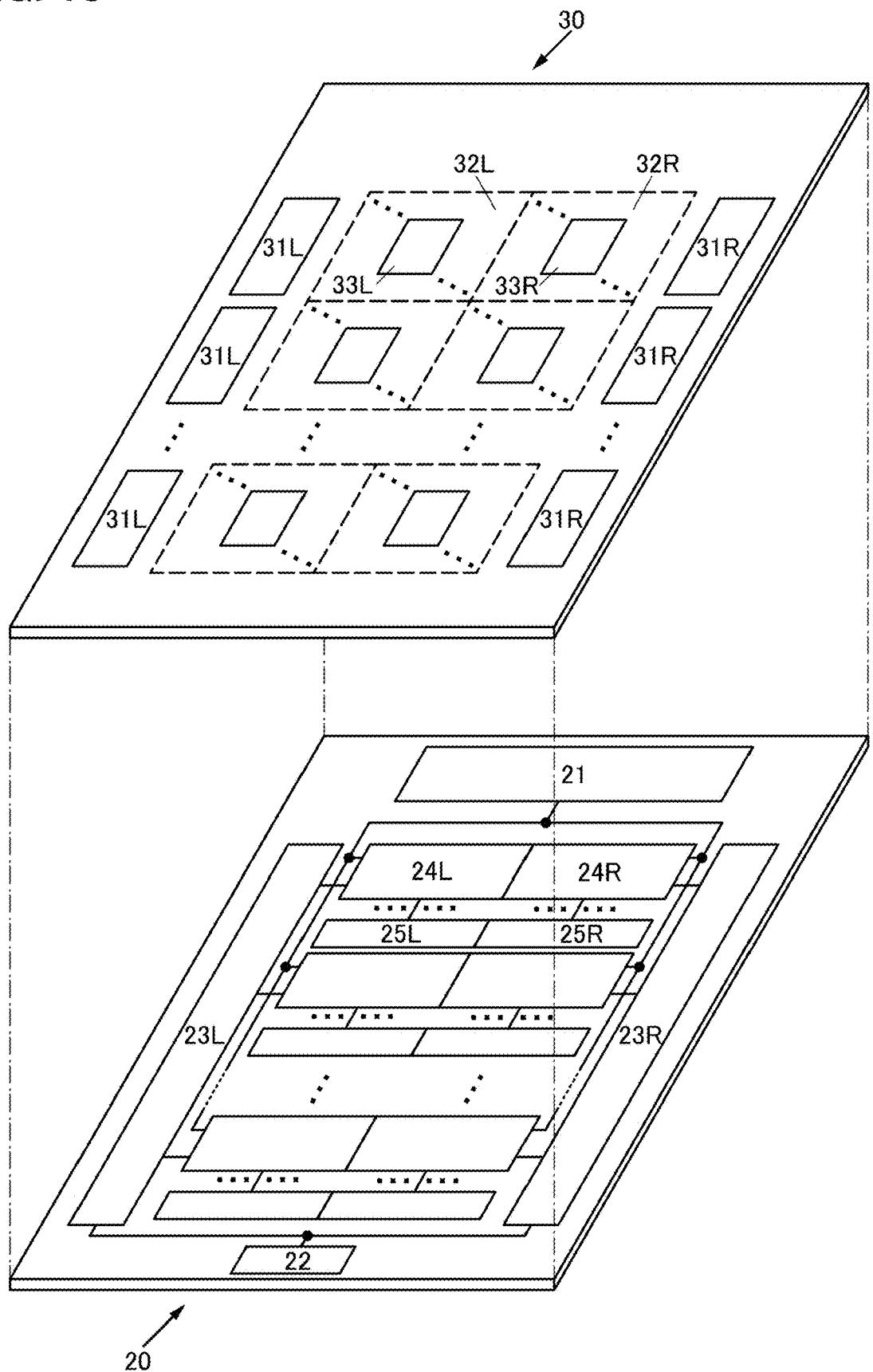
FIG. 18 is a block diagram illustrating a structure example of a display device.

Although one gate driver circuit 31L and one gate driver circuit 31R are provided in the display device 10 illustrated in FIG. 1, a plurality of gate driver circuits 31L and a plurality of gate driver circuits 31R may be provided. For example, the number of the gate driver circuits 31L and the number of the gate driver circuits 31R may be two, or three or more. For another example, as many the gate driver circuits 31L as the display portions 32L may be provided and as many the gate driver circuits 31R as the display portions 32R may be provided. FIG. 18 illustrates a modification example of the display device 10 illustrated in FIG. 1, which has a structure including as many the gate driver circuits 31L as the display portions 32L and as many the gate driver circuits 31R as the display portions 32R.

In the case where a plurality of gate driver circuits 31L and a plurality of gate driver circuits 31R are provided, the plurality of gate driver circuits 31 can be driven in parallel. In addition, a plurality of data driver circuits 24L and circuits 25L can be driven in parallel in accordance with driving of the gate driver circuits 31L, and a plurality of data driver circuits 24R and circuits 25R can be driven in parallel in accordance with driving of the gate driver circuits 31R. In the above manner, time required for writing analog data corresponding to an image of one frame to the pixel 33 can be shortened, for example. Thus, the length of one frame period can be shortened, and the frame frequency can be increased. Accordingly, the display device 10 can be driven at high speed.

Figure 19:
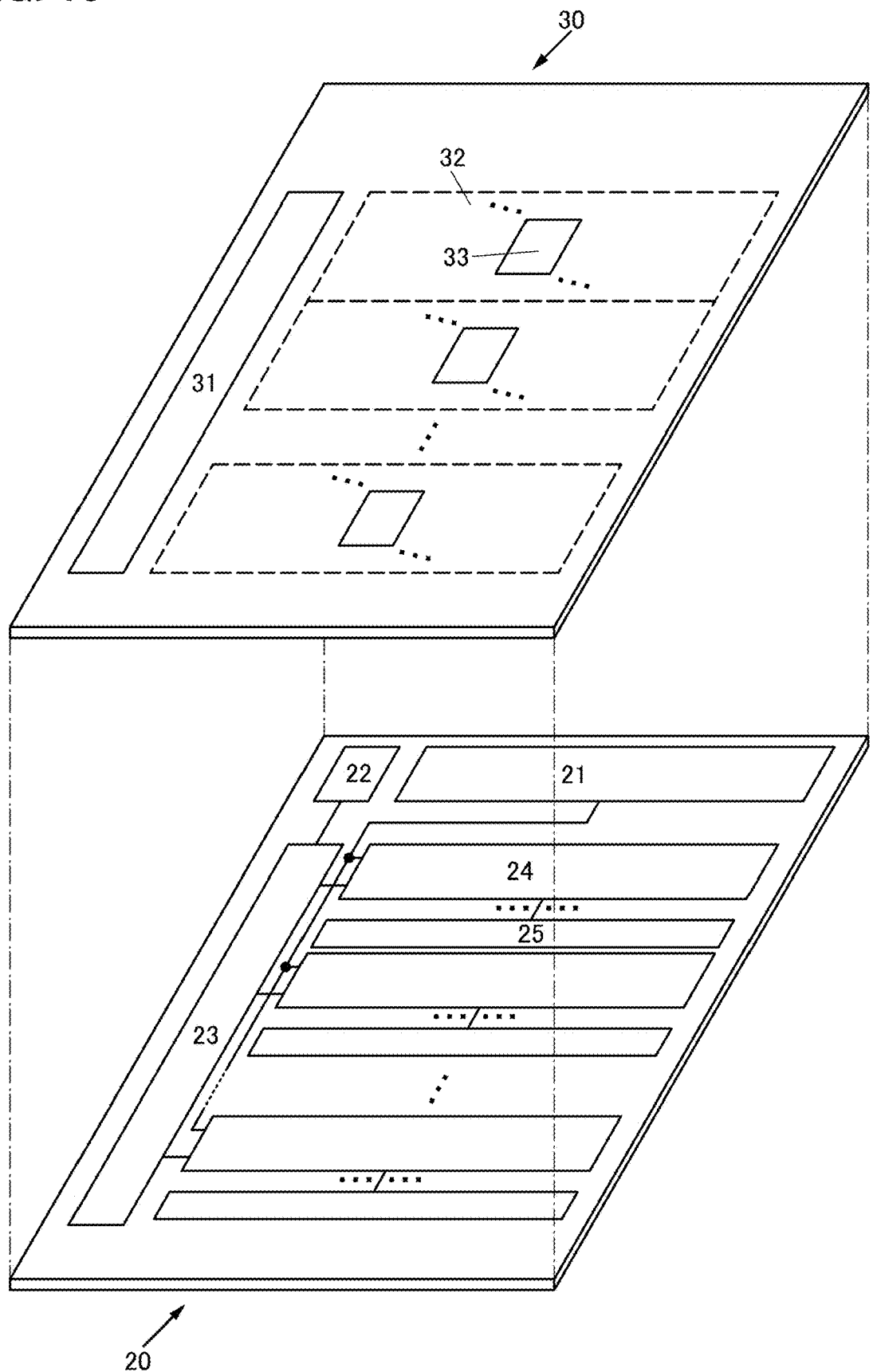
FIG. 19 is a block diagram illustrating a structure example of a display device.

FIG. 19 is a block diagram illustrating a structure example of the display device 10, and shows a modification example of the display device 10 illustrated in FIG. 1. The display device 10 illustrated in FIG. 19 is different from the display device 10 illustrated in FIG. 1 in that the potential supply circuit 23R, the data driver circuit 24R, the circuit 25R, the gate driver circuit 31R, and the display portion 32R are not provided. In FIG. 19, the potential supply circuit 23L, the data driver circuit 24L, the circuit 25L, the gate driver circuit 31L, and the display portion 32L are denoted by the potential supply circuit 23, the data driver circuit 24, the circuit 25, the gate driver circuit 31, and the display portion 32, respectively. Note that the potential supply circuit 23L, the data driver circuit 24L, the circuit 25L, the gate driver circuit 31L, and the display portion 32L are not necessarily provided.

The number of the potential supply circuits 23 and the number of the gate driver circuits 31 in the display device 10 illustrated in FIG. 19 can be reduced as compared to those in the display device 10 illustrated in FIG. 1. Thus, the size of the display device 10 can be reduced. Furthermore, the area of the display portion 32 can be enlarged.

Figure 20:
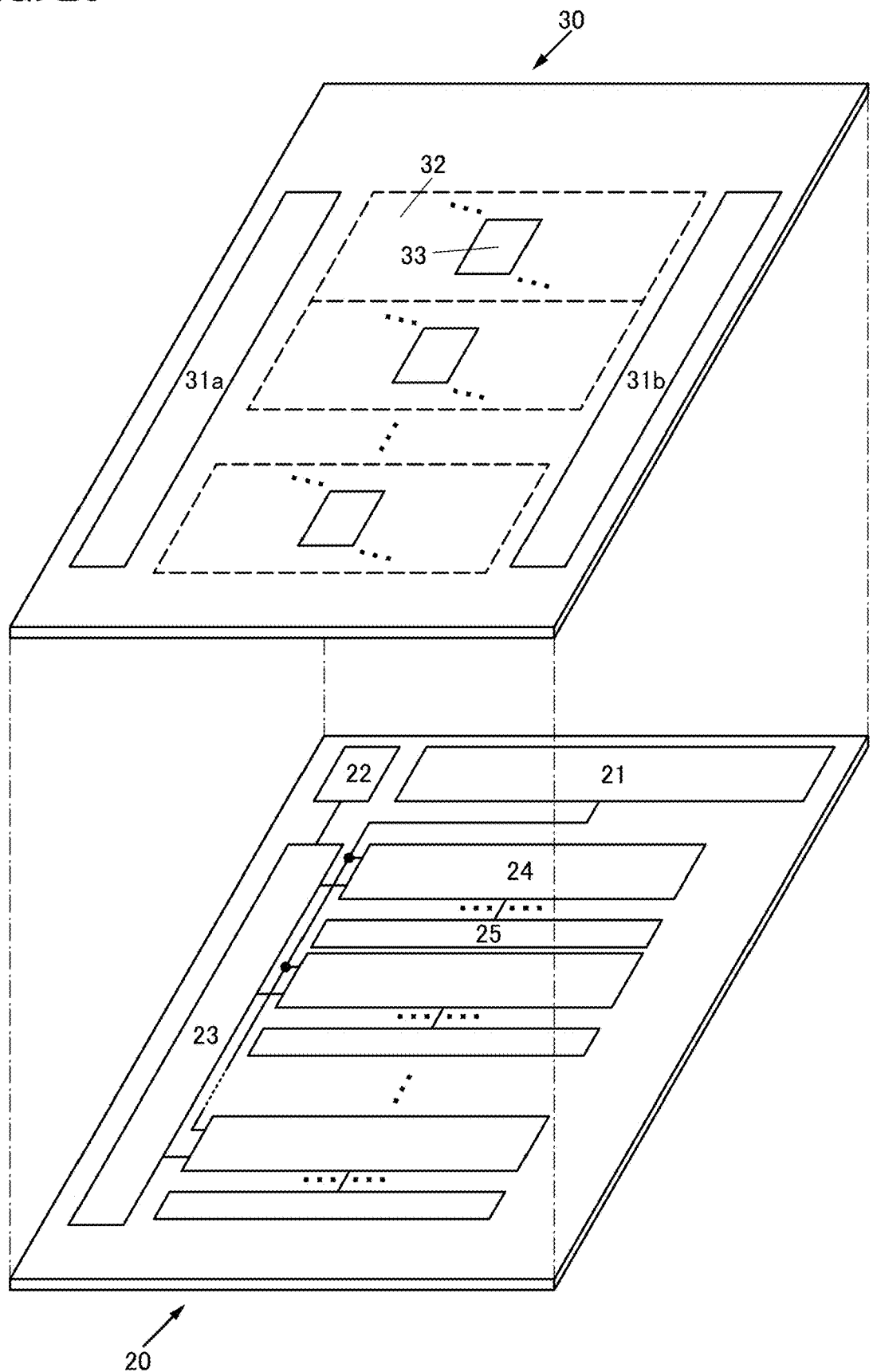
FIG. 20 is a block diagram illustrating a structure example of a display device.

FIG. 20 is a block diagram illustrating a structure example of the display device 10, and shows a modification example of the display device 10 illustrated in FIG. 19. The display device 10 illustrated in FIG. 20 is different from the display device 10 illustrated in FIG. 19 in that a gate driver circuit 31a and a gate driver circuit 31b are provided as the gate driver circuit 31. As illustrated in FIG. 20, the gate driver circuit 31a can be provided on the left of the display portions 32, and the gate driver circuit 31b can be provided on the right of the display portions 32, for example.

FIG. 21 is a block diagram illustrating a structure example of the layer 30 included in the display device 10 illustrated in FIG. 20. As illustrated in FIG. 21, an output terminal of the gate driver circuit 31a is electrically connected to the pixels 33 in an odd-numbered row through the wiring 34, for example. Furthermore, an output terminal of the gate driver circuit 31b is electrically connected to the pixels 33 in an even-numbered row through the wiring 34, for example.

When the display device 10 has the structures illustrated in FIG. 20 and FIG. 21, the density of elements such as transistors included in the gate driver circuit 31 can be reduced. Accordingly, the layout flexibility of the display device 10 can be increased. Although the potential supply circuit 23 is provided to have a region overlapping with the gate driver circuit 31a in FIG. 20, one embodiment of the present invention is not limited thereto. For example, the potential supply circuit 23 may be provided to have a region overlapping with the gate driver circuit 31b. For another example, two potential supply circuits 23 may be provided, one of the potential supply circuits 23 may be provided to have a region overlapping with the gate driver circuit 31a, and the other of the potential supply circuits 23 may be provided to have a region overlapping with the gate driver circuit 31b. Alternatively, three or more potential supply circuits 23 may be provided, for example.

Figure 22:
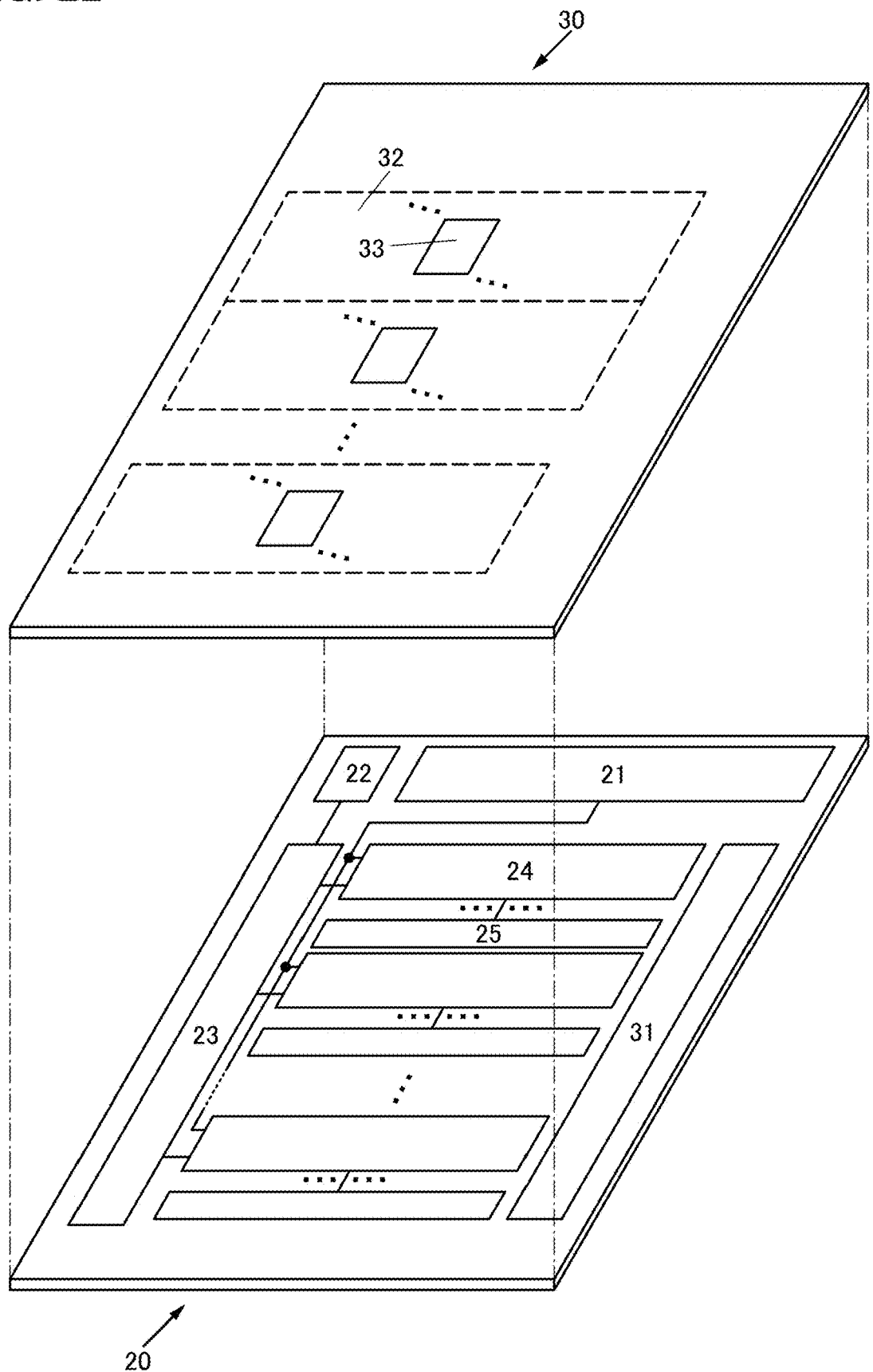
FIG. 22 is a block diagram illustrating a structure example of a display device.

FIG. 22 is a block diagram illustrating a structure example of the display device 10, and shows a modification example of the display device 10 illustrated in FIG. 19. The display device 10 illustrated in FIG. 22 is different from the display device 10 illustrated in FIG. 19 in that the gate driver circuit 31 is provided in the layer 20.

In the display device 10 having the structure illustrated in FIG. 22, a transistor included in the gate driver circuit 31 can be a transistor including single crystal silicon in a channel formation region, for example. As described above, the transistor including single crystal silicon in a channel formation region has a high on-state current. Thus, the gate driver circuit 31 in the display device 10 having the structure illustrated in FIG. 22 can be driven at high speed.

At least part of this embodiment can be implemented in combination with the other embodiments described in this specification as appropriate.

Embodiment 2

In this embodiment, a cross-sectional structure example of the display device 10 of one embodiment of the present invention is described.

<Cross-Sectional Structure Example_1 of Display Device>

Figure 23:
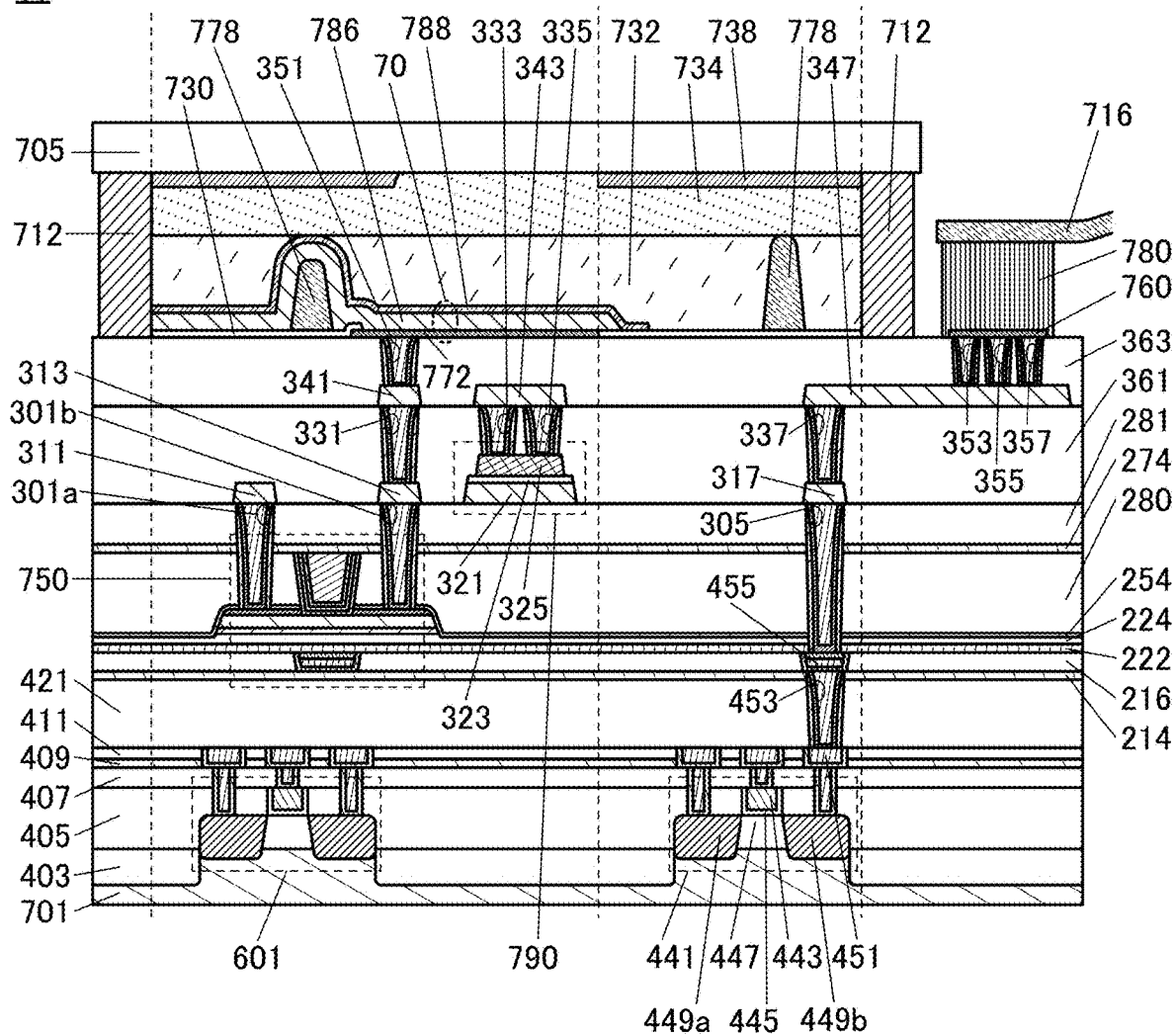
FIG. 23 is a cross-sectional view illustrating a structure example of a display device.

FIG. 23 is a cross-sectional view illustrating a structure example of the display device 10. The display device 10 includes a substrate 701 and a substrate 705, and the substrate 701 and the substrate 705 are attached to each other with a sealant 712.

As the substrate 701, a single crystal semiconductor substrate such as a single crystal silicon substrate can be used. Note that a semiconductor substrate other than a single crystal semiconductor substrate may be used as the substrate 701.

A transistor 441 and a transistor 601 are provided on the substrate 701. The transistor 441 and the transistor 601 can be transistors provided in the layer 20 described in Embodiment 1.

The transistor 441 is formed of a conductive layer 443 having a function of a gate electrode, an insulating layer 445 having a function of a gate insulating layer, and part of the substrate 701 and includes a semiconductor region 447 including a channel formation region, a low-resistance region 449a having a function of one of a source region and a drain region, and a low-resistance region 449b having a function of the other of the source region and the drain region. The transistor 441 can be either a p-channel transistor or an n-channel transistor.

The transistor 441 is electrically isolated from other transistors by an element isolation layer 403. FIG. 23 illustrates the case where the transistor 441 and the transistor 601 are electrically isolated from each other by the element isolation layer 403. The element isolation layer 403 can be formed by a LOCOS (LOCal Oxidation of Silicon) method, an STI (Shallow Trench Isolation) method, or the like.

Here, in the transistor 441 illustrated in FIG. 23, the semiconductor region 447 has a projecting shape. Moreover, the conductive layer 443 is provided to cover the side surface and the top surface of the semiconductor region 447 with the insulating layer 445 therebetween. Note that FIG. 23 does not illustrate the state where the conductive layer 443 covers the side surface of the semiconductor region 447. A material adjusting the work function can be used for the conductive layer 443.

A transistor having a projecting semiconductor region, like the transistor 441, can be referred to as a fin-type transistor because a projecting portion of a semiconductor substrate is used. An insulating layer having a function of a mask for forming a projecting portion may be provided in contact with an upper portion of the projecting portion. Although FIG. 23 illustrates the structure in which the projecting portion is formed by processing part of the substrate 701, a semiconductor having a projecting shape may be formed by processing an SOI substrate.

Note that the structure of the transistor 441 illustrated in FIG. 23 is an example; the structure of the transistor 441 is not limited thereto and can be changed as appropriate in accordance with the circuit configuration, an operation method for the circuit, or the like. For example, the transistor 441 may be a planar transistor.

The transistor 601 can have a structure similar to that of the transistor 441.

An insulating layer 405, an insulating layer 407, an insulating layer 409, and an insulating layer 411 are provided over the substrate 701, in addition to the element isolation layer 403, the transistor 441, and the transistor 601. A conductive layer 451 is embedded in the insulating layer 405, the insulating layer 407, the insulating layer 409, and the insulating layer 411. Here, the top surface of the conductive layer 451 and the top surface of the insulating layer 411 can be substantially level with each other.

An insulating layer 421 and an insulating layer 214 are provided over the conductive layer 451 and the insulating layer 411. A conductive layer 453 is embedded in the insulating layer 421 and the insulating layer 214. Here, the top surface of the conductive layer 453 and the top surface of the insulating layer 214 can be substantially level with each other.

An insulating layer 216 is provided over the conductive layer 453 and the insulating layer 214. A conductive layer 455 is embedded in the insulating layer 216. Here, the top surface of the conductive layer 455 and the top surface of the insulating layer 216 can be substantially level with each other.

An insulating layer 222, an insulating layer 224, an insulating layer 254, an insulating layer 280, an insulating layer 274, and an insulating layer 281 are provided over the conductive layer 455 and the insulating layer 216. A conductive layer 305 is embedded in the insulating layer 222, the insulating layer 224, the insulating layer 254, the insulating layer 280, the insulating layer 274, and the insulating layer 281. Here, the top surface of the conductive layer 305 and the top surface of the insulating layer 281 can be substantially level with each other.

An insulating layer 361 is provided over the conductive layer 305 and the insulating layer 281. A conductive layer 317 and a conductive layer 337 are embedded in the insulating layer 361. Here, the top surface of the conductive layer 337 and the top surface of the insulating layer 361 can be substantially level with each other.

An insulating layer 363 is provided over the conductive layer 337 and the insulating layer 361. A conductive layer 347, a conductive layer 353, a conductive layer 355, and a conductive layer 357 are embedded in the insulating layer 363. Here, the top surfaces of the conductive layer 353, the conductive layer 355, and the conductive layer 357 and the top surface of the insulating layer 363 can be substantially level with each other.

A connection electrode 760 is provided over the conductive layer 353, the conductive layer 355, the conductive layer 357, and the insulating layer 363. An anisotropic conductive layer 780 is provided to be electrically connected to the connection electrode 760, and an FPC (Flexible Printed Circuit) 716 is provided to be electrically connected to the anisotropic conductive layer 780. A variety of signals and the like are supplied to the display device 10 from the outside of the display device 10 through the FPC 716.

As illustrated in FIG. 23, the low-resistance region 449b having a function of the other of the source region and the drain region of the transistor 441 is electrically connected to the FPC 716 through the conductive layer 451, the conductive layer 453, the conductive layer 455, the conductive layer 305, the conductive layer 317, the conductive layer 337, the conductive layer 347, the conductive layer 353, the conductive layer 355, the conductive layer 357, the connection electrode 760, and the anisotropic conductive layer 780. Although FIG. 23 illustrates three conductors, which are the conductive layer 353, the conductive layer 355, and the conductive layer 357, as conductive layers having a function of electrically connecting the connection electrode 760 and the conductive layer 347, one embodiment of the present invention is not limited thereto. The number of conductive layers having a function of electrically connecting the connection electrode 760 and the conductive layer 347 may be one, two, or four or more. Providing a plurality of conductive layers having a function of electrically connecting the connection electrode 760 and the conductive layer 347 can reduce the contact resistance.

A transistor 750 is provided over the insulating layer 214. The transistor 750 can be a transistor provided in the layer 30 described in Embodiment 1. For example, the transistor 750 can be the transistor provided in the pixel 33. An OS transistor can be suitably used as the transistor 750. The OS transistor has a feature of extremely low off-state current. Consequently, the retention time for image data or the like can be increased, so that the frequency of the refresh operation can be reduced. Thus, power consumption of the display device 10 can be reduced.

A conductive layer 301a and a conductive layer 301b are embedded in the insulating layer 254, the insulating layer 280, the insulating layer 274, and the insulating layer 281. The conductive layer 301a is electrically connected to one of a source and a drain of the transistor 750, and the conductive layer 301b is electrically connected to the other of the source and the drain of the transistor 750. Here, the top surfaces of the conductive layer 301a and the conductive layer 301b and the top surface of the insulating layer 281 can be substantially level with each other.

A conductive layer 311, a conductive layer 313, a conductive layer 331, a capacitor 790, a conductive layer 333, and a conductive layer 335 are embedded in the insulating layer 361. The conductive layer 311 and the conductive layer 313 are electrically connected to the transistor 750 and have a function of a wiring. The conductive layer 333 and the conductive layer 335 are electrically connected to the capacitor 790. Here, the top surfaces of the conductive layer 331, the conductive layer 333, and the conductive layer 335 and the top surface of the insulating layer 361 can be substantially level with each other.

A conductive layer 341, a conductive layer 343, and a conductive layer 351 are embedded in the insulating layer 363. Here, the top surface of the conductive layer 351 and the top surface of the insulating layer 363 can be substantially level with each other.

The insulating layer 405, the insulating layer 407, the insulating layer 409, the insulating layer 411, the insulating layer 421, the insulating layer 214, the insulating layer 280, the insulating layer 274, the insulating layer 281, the insulating layer 361, and the insulating layer 363 have a function of an interlayer film and may also have a function of a planarization film that covers unevenness thereunder. For example, the top surface of the insulating layer 363 may be planarized by planarization treatment using a chemical mechanical polishing (CMP) method or the like to have the increased planarity.

As illustrated in FIG. 23, the capacitor 790 includes a lower electrode 321 and an upper electrode 325. An insulating layer 323 is provided between the lower electrode 321 and the upper electrode 325. In other words, the capacitor 790 has a stacked-layer structure in which the insulating layer 323 functioning as a dielectric is sandwiched between the pair of electrodes. Although FIG. 23 illustrates the example in which the capacitor 790 is provided over the insulating layer 281, the capacitor 790 may be provided over an insulating layer different from the insulating layer 281.

In the example illustrated in FIG. 23, the conductive layer 301a, the conductive layer 301b, and the conductive layer 305 are formed in the same layer. In the illustrated example, the conductive layer 311, the conductive layer 313, the conductive layer 317, and the lower electrode 321 are formed in the same layer. In the illustrated example, the conductive layer 331, the conductive layer 333, the conductive layer 335, and the conductive layer 337 are formed in the same layer. In the illustrated example, the conductive layer 341, the conductive layer 343, and the conductive layer 347 are formed in the same layer. In the illustrated example, the conductive layer 351, the conductive layer 353, the conductive layer 355, and the conductive layer 357 are formed in the same layer. Forming a plurality of conductive layers in the same layer simplifies the manufacturing process of the display device 10 and thus the manufacturing cost of the display device 10 can be reduced. Note that these conductive layers may be formed in different layers or may contain different types of materials.

The display device 10 illustrated in FIG. 23 includes the light-emitting element 70. The light-emitting element 70 includes a conductive layer 772, an EL layer 786, and a conductive layer 788. The EL layer 786 contains an organic compound or an inorganic compound such as quantum dots.

Examples of materials that can be used as an organic compound include a fluorescent material and a phosphorescent material. Examples of materials that can be used as quantum dots include a colloidal quantum dot material, an alloyed quantum dot material, a core-shell quantum dot material, and a core quantum dot material.

The conductive layer 772 is electrically connected to the other of the source and the drain of the transistor 750 through the conductive layer 351, the conductive layer 341, the conductive layer 331, the conductive layer 313, and the conductive layer 301b. The conductive layer 772 is formed over the insulating layer 363 and has a function of a pixel electrode.

A material that transmits visible light or a material that reflects visible light can be used for the conductive layer 772. As a light-transmitting material, for example, an oxide material containing indium, zinc, tin, or the like is preferably used. As a reflective material, for example, a material containing aluminum, silver, or the like is preferably used.

Although not illustrated in FIG. 23, an optical member (optical substrate) such as a polarizing member, a retardation member, or an anti-reflection member can be provided in the display device 10, for example.

On the substrate 705 side, a light-blocking layer 738 and an insulating layer 734 that is in contact with them are provided. The light-blocking layer 738 has a function of blocking light emitted from adjacent regions. Alternatively, the light-blocking layer 738 has a function of preventing external light from reaching the transistor 750 or the like.

In the display device 10 illustrated in FIG. 23, an insulating layer 730 is provided over the insulating layer 363. Here, the insulating layer 730 can cover part of the conductive layer 772. The light-emitting element 70 includes the conductive layer 788 with a light-transmitting property, and thus can be a top-emission light-emitting element. Note that the light-emitting element 70 may have a bottom-emission structure in which light is emitted to the conductive layer 772 side or a dual-emission structure in which light is emitted towards both the conductive layer 772 and the conductive layer 788.

The light-blocking layer 738 is provided to have a region overlapping with the insulating layer 730. The light-blocking layer 738 is covered with the insulating layer 734. A space between the light-emitting element 70 and the insulating layer 734 is filled with a sealing layer 732.

A component 778 is provided between the insulating layer 730 and the EL layer 786. Moreover, the component 778 is provided between the insulating layer 730 and the insulating layer 734.

Figure 24:
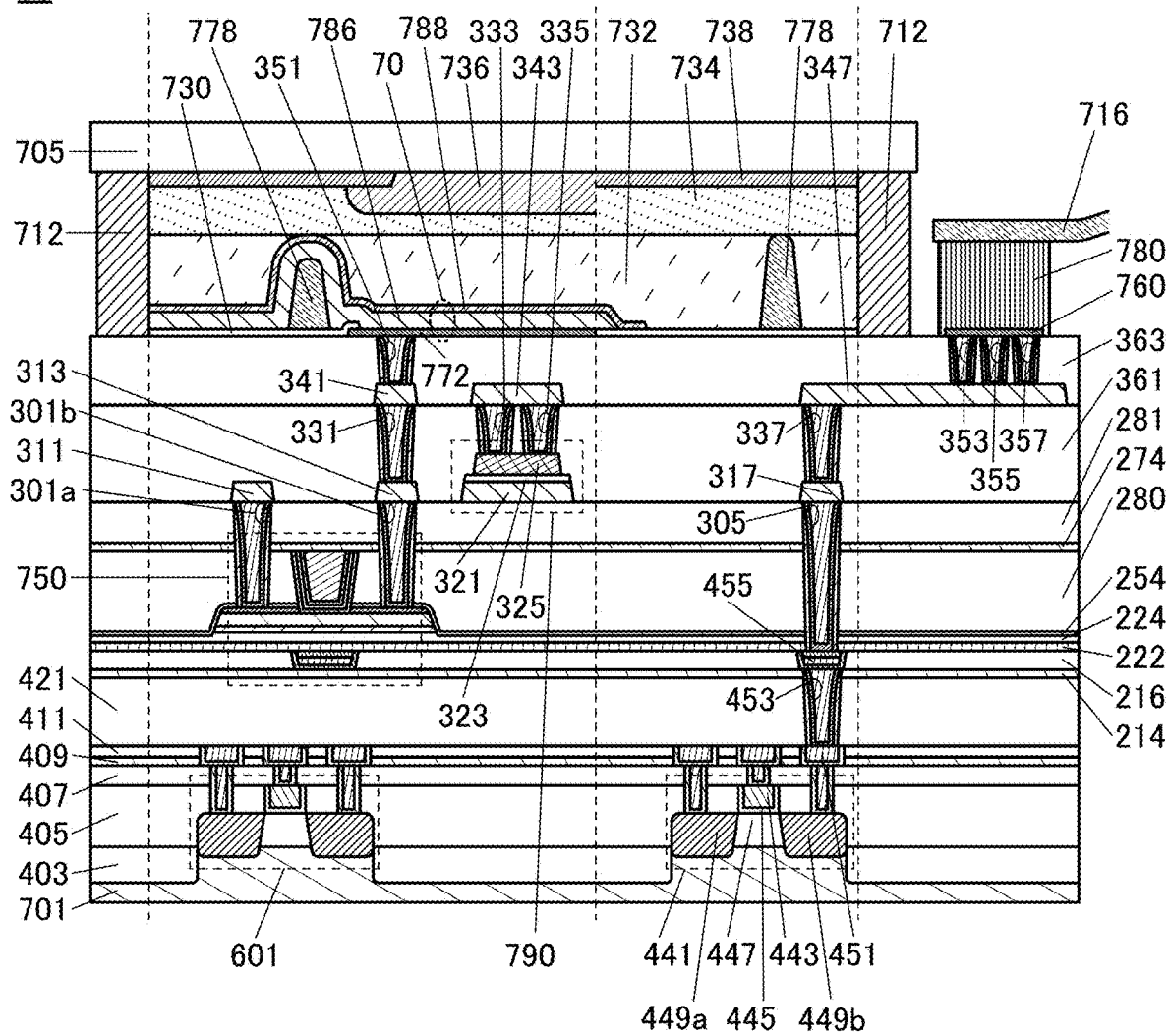
FIG. 24 is a cross-sectional view illustrating a structure example of a display device.

FIG. 24 illustrates a modification example of the display device 10 illustrated in FIG. 23. The display device 10 illustrated in FIG. 24 is different from the display device 10 illustrated in FIG. 23 in that a coloring layer 736 is provided. Note that the coloring layer 736 is provided to have a region overlapping with the light-emitting element 70. Providing the coloring layer 736 can improve the color purity of light extracted from the light-emitting element 70. Thus, the display device 10 can display high-quality images. Furthermore, all the light-emitting elements 70, for example, in the display device 10 can be light-emitting elements that emit white light; hence, the EL layers 786 are not necessarily formed separately for each color, leading to higher resolution of the display device 10.

The light-emitting element 70 can have a micro optical resonator (microcavity) structure. Thus, light of predetermined colors (e.g., RGB) can be extracted without a coloring layer, and the display device 10 can perform color display. The structure without a coloring layer can prevent light absorption by the coloring layer. As a result, the display device 10 can display high-luminance images, and the power consumption of the display device 10 can be reduced. Note that a structure in which a coloring layer is not provided can be employed even when the EL layer 786 is formed into an island shape for each pixel or into a stripe shape for each pixel column, i.e., the EL layers 786 are formed separately for each color.

Figure 25:
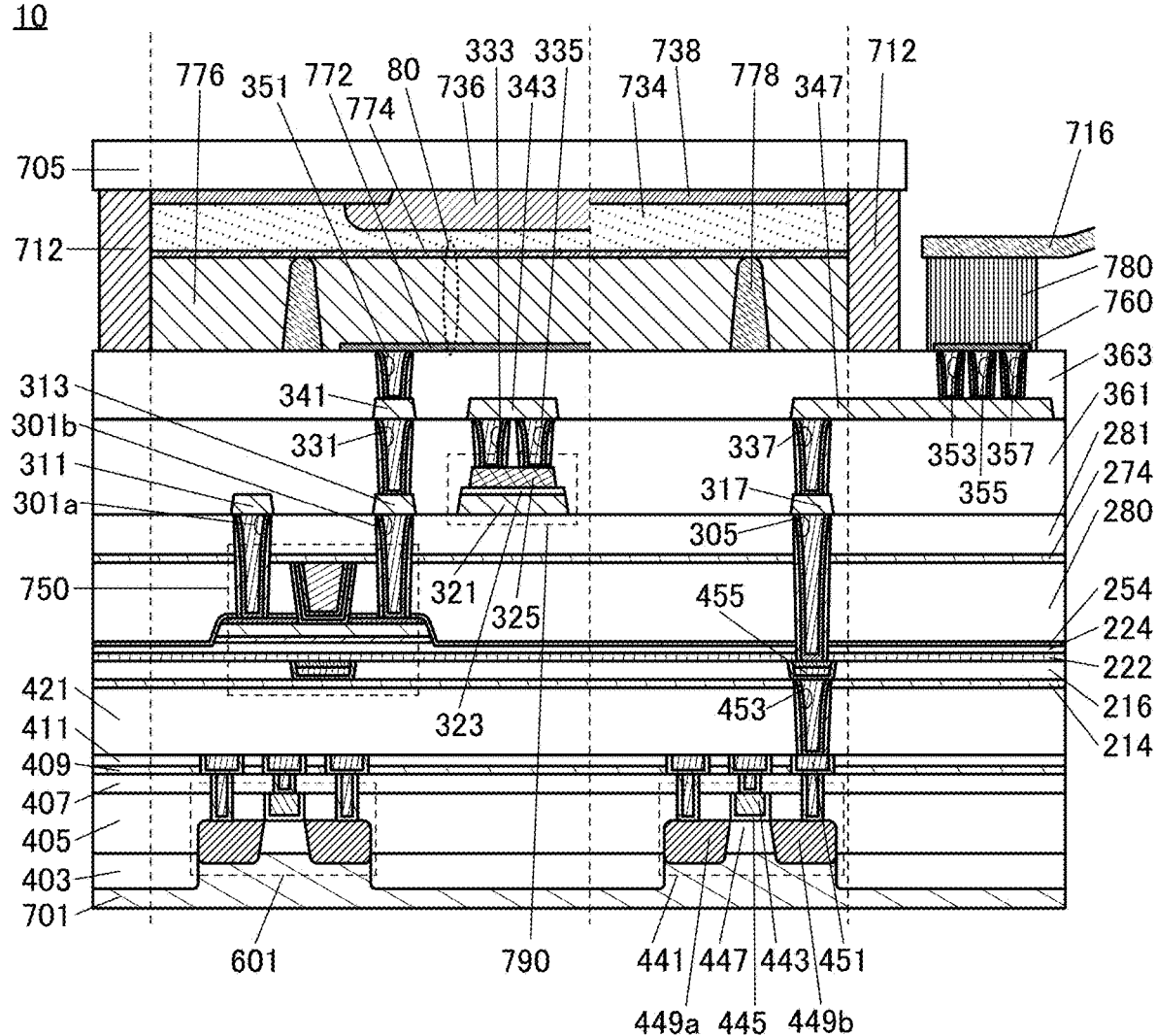
FIG. 25 is a cross-sectional view illustrating a structure example of a display device.

Although a light-emitting element is provided as a display element in the display device 10 in FIG. 23 and FIG. 24, a liquid crystal element may be provided as the display element, for example. FIG. 25 shows a modification example of the display device 10 illustrated in FIG. 24 and is different from the display device 10 illustrated in FIG. 24 in that a liquid crystal element 80 is provided instead of the light-emitting element 70.

The liquid crystal element 80 includes the conductive layer 772, a conductive layer 774, and a liquid crystal layer 776 positioned therebetween. The conductive layer 774 is provided on the substrate 705 side and has a function of a common electrode. The conductive layer 772 is electrically connected to the other of the source and the drain of the transistor 750 through the conductive layer 351, the conductive layer 341, the conductive layer 331, the conductive layer 313, and the conductive layer 301*b*. As in the light-emitting element 70, the conductive layer 772 is formed over the insulating layer 363 and has a function of a pixel electrode.

As in the light-emitting element 70, for the conductive layer 772, a material that transmits visible light or a material that reflects visible light can be used. When a reflective material is used for the conductive layer 772, the display device 10 is a reflective liquid crystal display device. By contrast, when a light-transmitting material is used for the conductive layer 772 and a light-transmitting material is also used for the substrate 701 and the like, the display device 10 is a transmissive liquid crystal display device. In the case where the display device 10 is a reflective liquid crystal display device, a polarizing plate is provided on the viewer side. On the other hand, in the case where the display device 10 is a transmissive liquid crystal display device, a pair of polarizing plates is provided such that the liquid crystal element 80 is positioned therebetween. Note that no polarizing plate is illustrated in FIG. 25.

In addition, although not illustrated in FIG. 25, an alignment film in contact with the liquid crystal layer 776 may be provided. Furthermore, an optical member (an optical substrate) such as a polarizing member, a retardation member, or an anti-reflection member and a light source such as a backlight or a side light can be provided as appropriate.

The component 778 is provided between the insulating layer 363 and the conductive layer 774. The component 778 is a columnar spacer and has a function of controlling the distance (cell gap) between the substrate 701 and the substrate 705. Note that a spherical spacer may be used as the component 778.

For the liquid crystal layer 776, a thermotropic liquid crystal, a low-molecular liquid crystal, a high-molecular liquid crystal, a polymer dispersed liquid crystal (PDLC), a polymer network liquid crystal (PNLC), a ferroelectric liquid crystal, an anti-ferroelectric liquid crystal, or the like can be used. In the case of employing a horizontal electric field mode, a liquid crystal exhibiting a blue phase for which an alignment film is not used may be used.

As the mode of the liquid crystal element, a TN (Twisted Nematic) mode, a VA (Vertical Alignment) mode, an IPS (In-Plane-Switching) mode, an FFS (Fringe Field Switching) mode, an ASM (Axially Symmetric aligned Micro-cell) mode, an OCB (Optically Compensated Birefringence) mode, an ECB (Electrically Controlled Birefringence) mode, a guest-host mode, or the like can be employed.

In addition, a scattering liquid crystal employing a polymer dispersed liquid crystal, a polymer network liquid crystal, or the like can be used for the liquid crystal layer 776. In this case, monochrome image display may be performed without providing the coloring layer 736, or color display may be performed using the coloring layer 736.

As a driving method of the liquid crystal element, a time-division display method (also referred to as a field-sequential driving method) by which color display is performed by a successive additive color mixing method may be used. In that case, a structure in which the coloring layer 736 is not provided can be employed. In the case where the time-division display method is employed, advantages such as an increase in the aperture ratio of pixels and an increase in resolution can be obtained because it is not necessary to provide pixels that exhibit R (red), G (green), and B (blue), for example.

Figure 26:
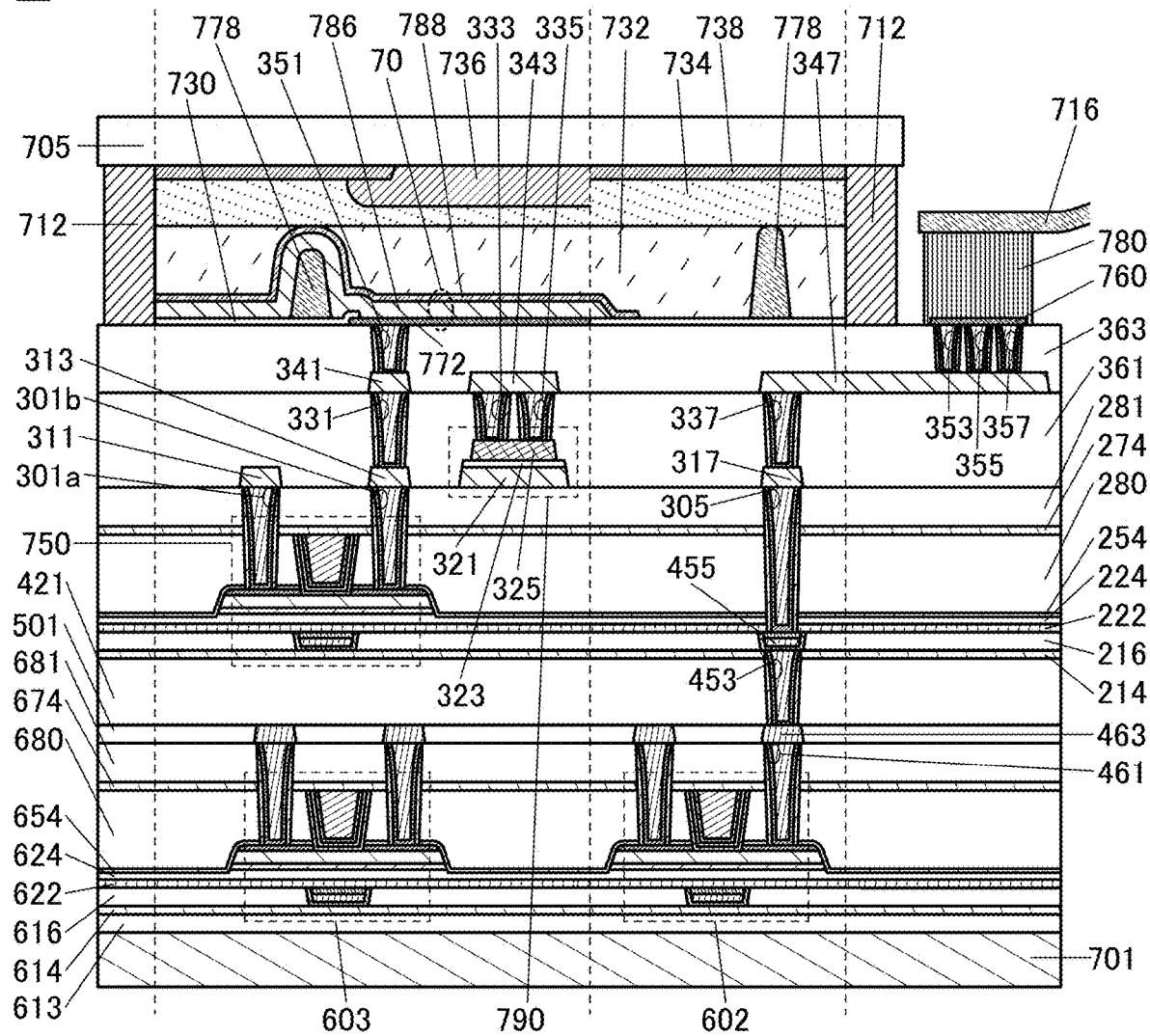
FIG. 26 is a cross-sectional view illustrating a structure example of a display device.

Although FIG. 23 to FIG. 25 each illustrate a structure in which the transistor 441 and the transistor 601 are provided such that their channel formation regions are formed inside the substrate 701 and the OS transistor is stacked over the transistor 441 and the transistor 601, one embodiment of the present invention is not limited thereto. FIG. 26 illustrates a modification example of FIG. 24. The display device 10 illustrated in FIG. 26 is different from the display device 10 illustrated in FIG. 24 mainly in that a transistor 602 and a transistor 603 that are OS transistors are provided in place of the transistor 441 and the transistor 601. An OS transistor can be used as the transistor 750. That is, the display device 10 illustrated in FIG. 26 includes a stack of OS transistors.

An insulating layer 613 and an insulating layer 614 are provided over the substrate 701, and the transistor 602 and the transistor 603 are provided over the insulating layer 614. Note that a transistor or the like may be provided between the substrate 701 and the insulating layer 613. For example, a transistor having a structure similar to those of the transistor 441 and the transistor 601 illustrated in FIG. 24 may be provided between the substrate 701 and the insulating layer 613.

The transistor 602 and the transistor 603 can be transistors provided in the layer 20 described in Embodiment 1.

The transistor 602 and the transistor 603 can be transistors having a structure similar to that of the transistor 750. Note that the transistor 602 and the transistor 603 may be OS transistors having a structure different from that of the transistor 750.

An insulating layer 616, an insulating layer 622, an insulating layer 624, an insulating layer 654, an insulating layer 680, an insulating layer 674, and an insulating layer 681 are provided over the insulating layer 614, in addition to the transistor 602 and the transistor 603. A conductive layer 461 is embedded in the insulating layer 654, the insulating layer 680, the insulating layer 674, and the insulating layer 681. Here, the top surface of the conductive layer 461 and the top surface of the insulating layer 681 can be substantially level with each other.

An insulating layer 501 is provided over the conductive layer 461 and the insulating layer 681. A conductive layer 463 is embedded in the insulating layer 501. Here, the top surface of the conductive layer 463 and the top surface of the insulating layer 501 can be substantially level with each other.

The insulating layer 421 and the insulating layer 214 are provided over the conductive layer 463 and the insulating layer 501. The conductive layer 453 is embedded in the insulating layer 421 and the insulating layer 214. Here, the top surface of the conductive layer 453 and the top surface of the insulating layer 214 can be substantially level with each other.

As illustrated in FIG. 26, one of a source and a drain of the transistor 602 is electrically connected to the FPC 716 through the conductive layer 461, the conductive layer 463, the conductive layer 453, the conductive layer 455, the conductive layer 305, the conductive layer 317, the conductive layer 337, the conductive layer 347, the conductive layer 353, the conductive layer 355, the conductive layer 357, the connection electrode 760, and the anisotropic conductive layer 780.

The insulating layer 613, the insulating layer 614, the insulating layer 680, the insulating layer 674, the insulating layer 681, and the insulating layer 501 have a function of an interlayer film and may also have a function of a planarization film that covers unevenness thereunder.

When the display device 10 has the structure illustrated in FIG. 26, all the transistors included in the display device 10 can be OS transistors while the bezel and size of the display device 10 are reduced. Accordingly, the transistors provided in the layer 20 described in Embodiment 1 and the transistors provided in the layer 30 described in Embodiment 1 can be manufactured using the same apparatus, for example. Consequently, the manufacturing cost of the display device 10 can be reduced, making the display device 10 inexpensive.

<Cross-Sectional Structure Example_2 of Display Device>

Figure 27:
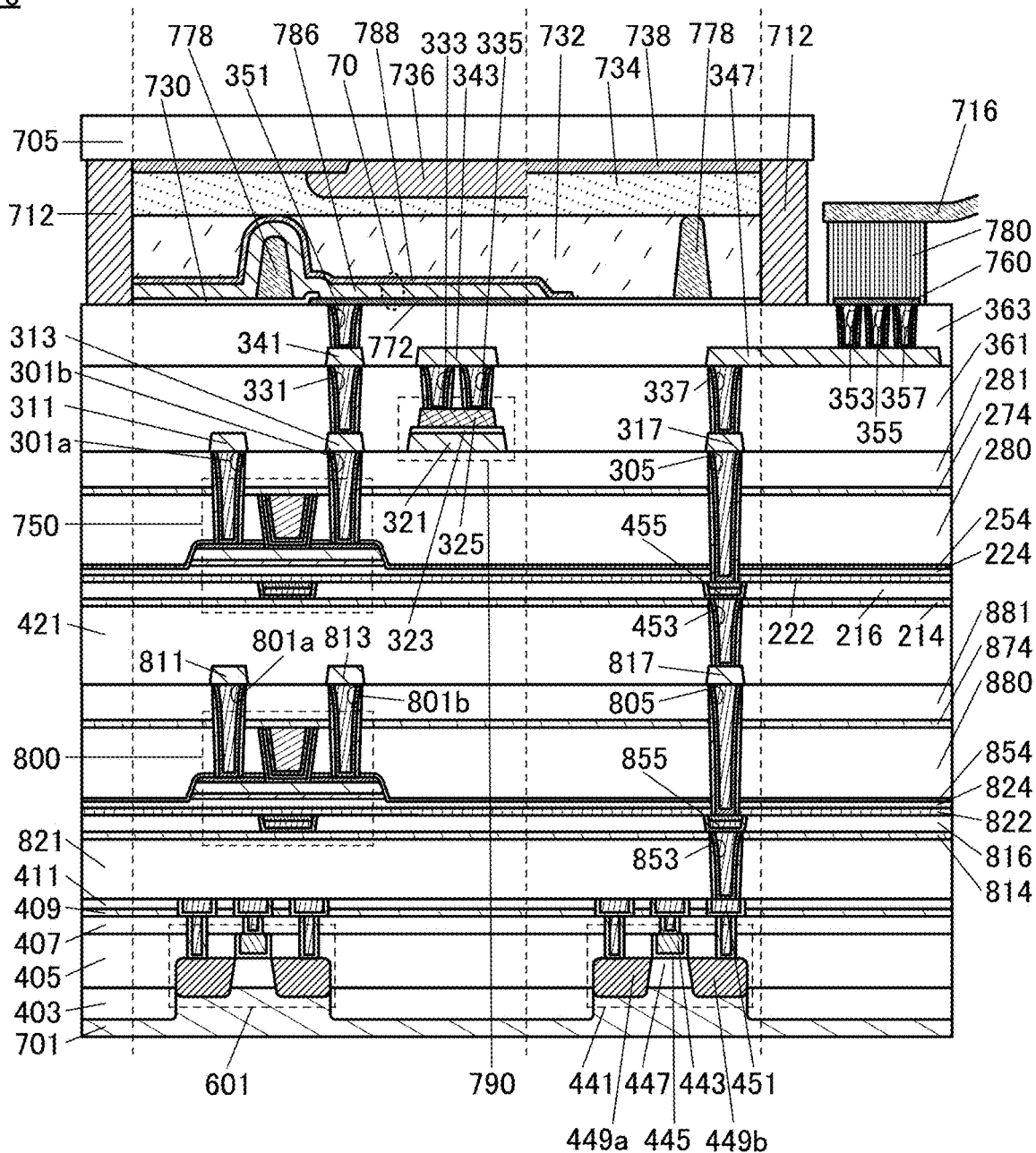
FIG. 27 is a cross-sectional view illustrating a structure example of a display device.

FIG. 27 is a cross-sectional view illustrating a structure example of the display device 10. The display device 10 in FIG. 27 is different from the display device 10 in FIG. 24 mainly in that a layer including a transistor 800 is interposed between the layer including the transistor 750 and the layer including the transistor 602 and the transistor 603. Although FIG. 27 illustrates a structure including a region where the transistor 601, the transistor 750, and the transistor 800 overlap with each other, one embodiment of the present invention is not limited thereto. For example, a structure may be employed in which a region where the transistor 601 and the transistor 750 overlap with each other is included and a region where the transistor 800 overlaps with each of the transistor 601 and the transistor 750 is not included. Alternatively, a structure may be employed in which a region where the transistor 601 and the transistor 800 overlap with each other is included and a region where the transistor 750 overlaps with each of the transistor 601 and the transistor 800 is not included.

The layer 20 described in Embodiment 1 can have a stacked-layer structure of a first circuit layer and a second circuit layer over the first circuit layer. For example, the transistor 601 and the transistor 603 can be transistors provided in the first circuit layer. The transistor 800 can be a transistor provided in the second circuit layer. The transistor 750 can be a transistor provided in the layer 30 described in Embodiment 1.

An insulating layer 821 and an insulating layer 814 are provided over the conductive layer 451 and the insulating layer 411. A conductive layer 853 is embedded in the insulating layer 821 and the insulating layer 814. Here, the top surface of the conductive layer 853 and the top surface of the insulating layer 814 can be substantially level with each other.

An insulating layer 816 is provided over the conductive layer 853 and the insulating layer 814. A conductive layer 855 is embedded in the insulating layer 816. Here, the top surface of the conductive layer 855 and the top surface of the insulating layer 816 can be substantially level with each other.

An insulating layer 822, an insulating layer 824, an insulating layer 854, an insulating layer 880, an insulating layer 874, and an insulating layer 881 are provided over the conductive layer 855 and the insulating layer 816. A conductive layer 805 is embedded in the insulating layer 822, the insulating layer 824, the insulating layer 854, the insulating layer 880, the insulating layer 874, and the insulating layer 881. Here, the top surface of the conductive layer 805 and the top surface of the insulating layer 881 can be substantially level with each other.

The insulating layer 421 and the insulating layer 214 are provided over the conductive layer 817 and the insulating layer 881.

As illustrated in FIG. 27, the low-resistance region 449b having a function of the other of the source region and the drain region of the transistor 441 is electrically connected to the FPC 716 through the conductive layer 451, the conductive layer 853, the conductive layer 855, the conductive layer 805, the conductive layer 817, the conductive layer 453, the conductive layer 455, the conductive layer 305, the conductive layer 317, the conductive layer 337, the conductive layer 347, the conductive layer 353, the conductive layer 355, the conductive layer 357, the connection electrode 760, and the anisotropic conductive layer 780.

The transistor 800 is provided over the insulating layer 814. The transistor 800 can be a transistor provided in the layer 30 described in Embodiment 1. The transistor 800 is preferably an OS transistor.

A conductive layer 801a and a conductive layer 801b are embedded in the insulating layer 854, the insulating layer 880, the insulating layer 874, and the insulating layer 881. The conductive layer 801a is electrically connected to one of a source and a drain of the transistor 800, and the conductive layer 801b is electrically connected to the other of the source and the drain of the transistor 800. Here, the top surfaces of the conductive layer 801a and the conductive layer 801b and the top surface of the insulating layer 881 can be substantially level with each other.

The transistor 750 can be a transistor provided in the layer 30 described in Embodiment 1. For example, the transistor 750 can be the transistor provided in the pixel 33. The transistor 750 is preferably an OS transistor.

Note that an OS transistor or the like may be provided between the layer where the transistor 441, the transistor 601, and the like are provided and the layer where the transistor 800 and the like are provided. In addition, an OS transistor or the like may be provided between the layer where the transistor 800 and the like are provided and the layer where the transistor 750 and the like are provided. Furthermore, an OS transistor or the like may be provided above the layer where the transistor 750 and the like are provided.

The insulating layer 405, the insulating layer 407, the insulating layer 409, the insulating layer 411, the insulating layer 821, the insulating layer 814, the insulating layer 880, the insulating layer 874, the insulating layer 881, the insulating layer 421, the insulating layer 214, the insulating layer 280, the insulating layer 274, the insulating layer 281, the insulating layer 361, and the insulating layer 363 have a function of an interlayer film and may also have a function of a planarization film that covers unevenness thereunder.

In the example illustrated in FIG. 27, the conductive layer 801a, the conductive layer 801b, and the conductive layer 805 are formed in the same layer. In the illustrated example, a conductive layer 811, a conductive layer 813, and the conductive layer 817 are formed in the same layer.

Figure 28:
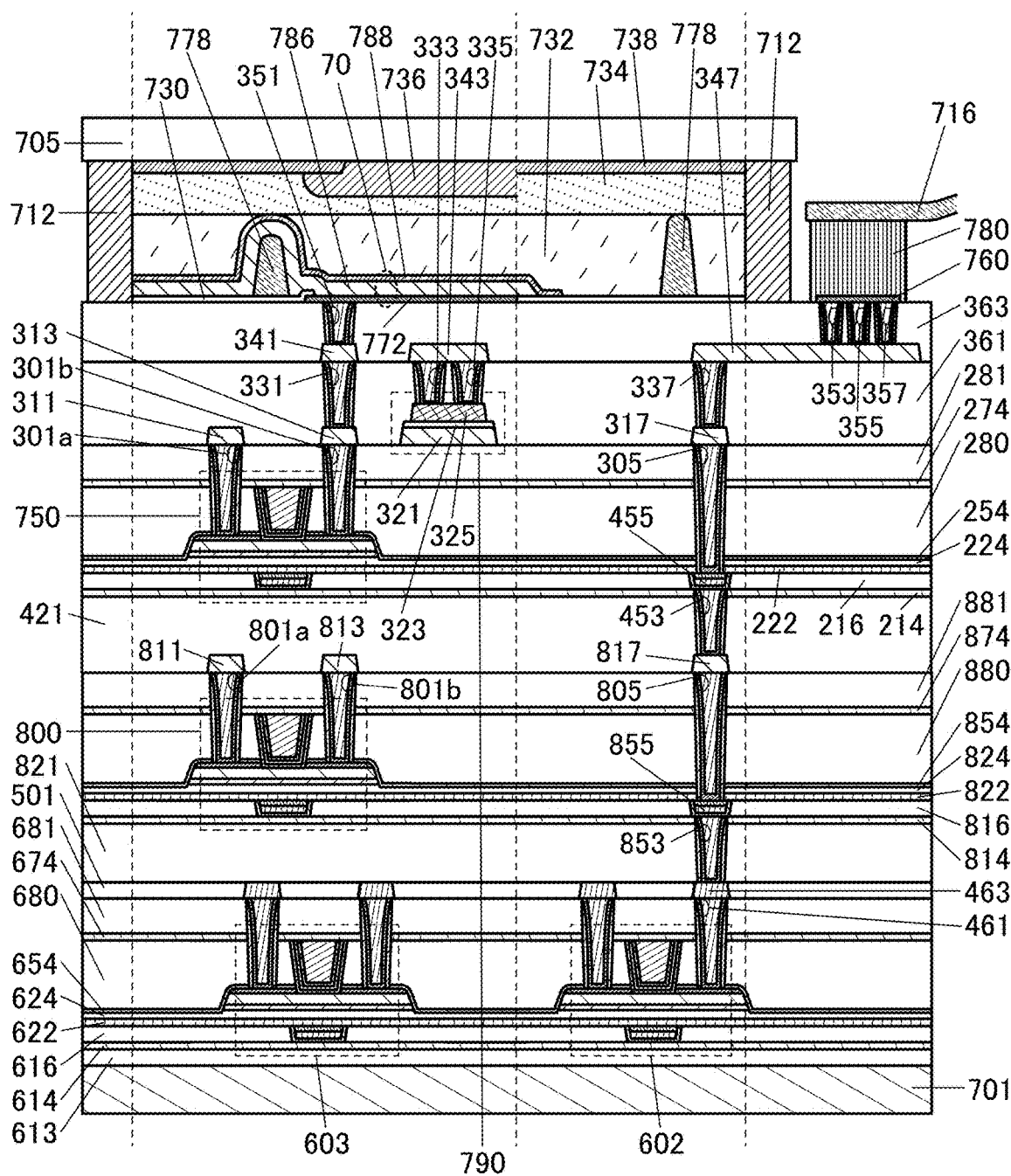
FIG. 28 is a cross-sectional view illustrating a structure example of a display device.

Although FIG. 27 illustrates a structure where the transistor 441 and the transistor 601 are provided such that their channel formation regions are formed inside the substrate 701 and the OS transistors are stacked over the transistor 441 and the transistor 601, one embodiment of the present invention is not limited thereto. FIG. 28 illustrates a modification example of FIG. 27. The display device 10 illustrated in FIG. 28 is different from the display device 10 illustrated in FIG. 27 in that the transistor 602 and the transistor 603 that are OS transistors are included in place of the transistor 441 and the transistor 601. That is, the display device 10 illustrated in FIG. 28 includes a three-layer stack of OS transistors.

An OS transistor or the like may be provided between the layer where the transistor 602, the transistor 603, and the like are provided and the layer where the transistor 800 and the like are provided. In addition, an OS transistor or the like may be provided between the layer where the transistor 800 and the like are provided and the layer where the transistor 750 or the transistor 750 and the like are provided. Furthermore, an OS transistor or the like may be provided above the layer where the transistor 750 and the like are provided.

For example, the transistor 602 and the transistor 603 can be transistors provided in the first circuit layer. The transistor 800 can be a transistor provided in the second circuit layer. The transistor 750 can be a transistor provided in the layer 30 described in Embodiment 1.

The insulating layer 821 and the insulating layer 814 are provided over the conductive layer 463 and the insulating layer 501. The conductive layer 853 is embedded in the insulating layer 821 and the insulating layer 814. Here, the top surface of the conductive layer 853 and the top surface of the insulating layer 814 can be substantially level with each other.

As illustrated in FIG. 28, the one of the source and the drain of the transistor 602 is electrically connected to the FPC 716 through the conductive layer 461, the conductive layer 463, the conductive layer 853, the conductive layer 855, the conductive layer 805, the conductive layer 817, the conductive layer 453, the conductive layer 455, the conductive layer 305, the conductive layer 317, the conductive layer 337, the conductive layer 347, the conductive layer 353, the conductive layer 355, the conductive layer 357, the connection electrode 760, and the anisotropic conductive layer 780.

When the display device 10 has the structure illustrated in FIG. 28, all the transistors in the display device 10 can be OS transistors while the bezel and size of the display device 10 are reduced. Consequently, different types of transistors do not need to be manufactured, whereby the manufacturing cost of the display device 10 can be reduced and thus the display device 10 can be inexpensive.

At least part of this embodiment can be implemented in combination with the other embodiments described in this specification as appropriate.

Embodiment 3

In this embodiment, transistors that can be used in the display device of one embodiment of the present invention are described.

<Structure Example_1 of Transistor>

Figures 29A, 29B, 29C:
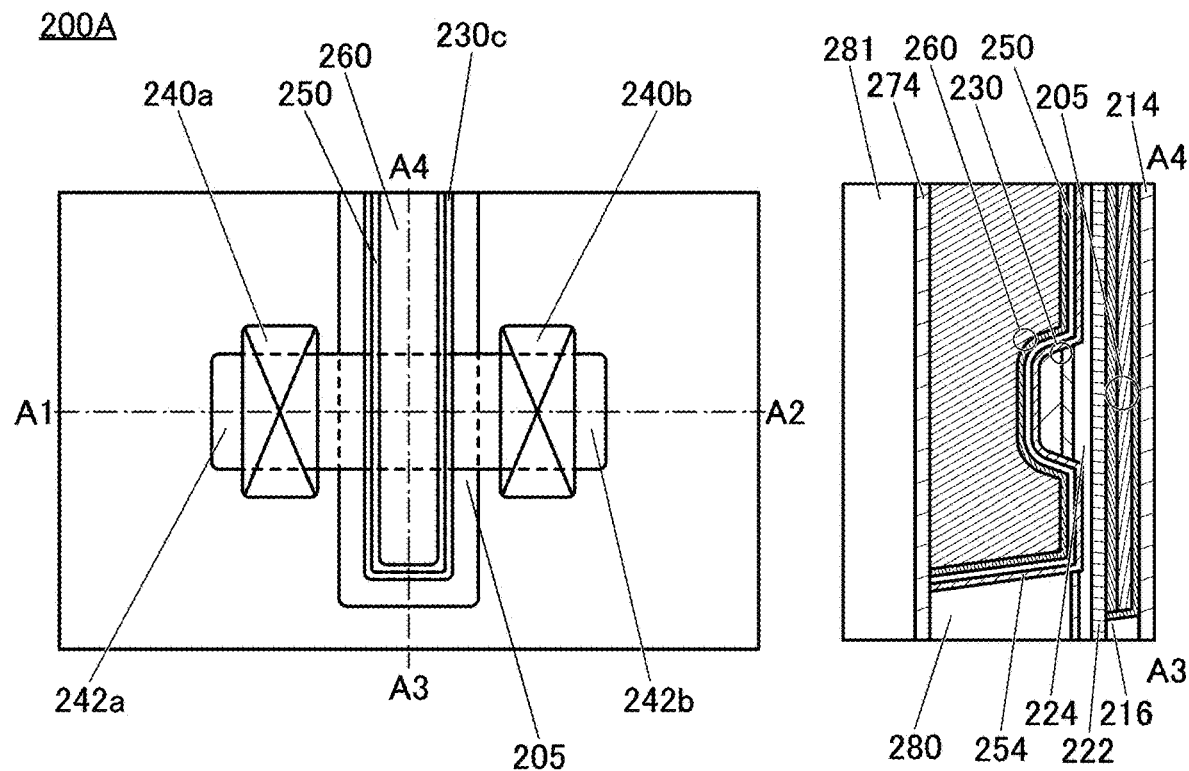
FIG. 29A is a top view illustrating a structure example of a transistor.
FIG. 29B and FIG. 29C are cross-sectional views illustrating the structure example of the transistor.

FIG. 29A, FIG. 29B, and FIG. 29C are a top view and cross-sectional views of a transistor 200A that can be used in the display device of one embodiment of the present invention and the periphery of the transistor 200A. The transistor 200A can be used in the display device of one embodiment of the present invention.

FIG. 29A is a top view of the transistor 200A. FIG. 29B and FIG. 29C are cross-sectional views of the transistor 200A. Here, FIG. 29B is a cross-sectional view of a portion indicated by dashed-dotted line A1-A2 in FIG. 29A and is a cross-sectional view of the transistor 200A in the channel length direction. FIG. 29C is a cross-sectional view of a portion indicated by dashed-dotted line A3-A4 in FIG. 29A and is a cross-sectional view of the transistor 200A in the channel width direction. Note that some components are omitted in the top view of FIG. 29A for clarity of the drawing.

As illustrated in FIG. 29, the transistor 200A includes a metal oxide 230a placed over a substrate (not illustrated); a metal oxide 230b placed over the metal oxide 230a; a conductive layer 242a and a conductive layer 242b that are placed apart from each other over the metal oxide 230b; the insulating layer 280 that is placed over the conductive layer 242a and the conductive layer 242b and has an opening between the conductive layer 242a and the conductive layer 242b; a conductive layer 260 placed in the opening; an insulating layer 250 placed between the conductive layer 260 and each of the metal oxide 230b, the conductive layer 242a, the conductive layer 242b, and the insulating layer 280; and a metal oxide 230c placed between the insulating layer 250 and each of the metal oxide 230b, the conductive layer 242a, the conductive layer 242b, and the insulating layer 280. Here, as illustrated in FIG. 29B and FIG. 29C, preferably, the top surface of the conductive layer 260 is substantially level with the top surfaces of the insulating layer 250, the insulating layer 254, the metal oxide 230c, and the insulating layer 280. Hereinafter, the metal oxide 230a, the metal oxide 230b, and the metal oxide 230c may be collectively referred to as a metal oxide 230. The conductive layer 242a and the conductive layer 242b may be collectively referred to as a conductive layer 242.

In the transistor 200A illustrated in FIG. 29, the side surfaces of the conductive layer 242a and the conductive layer 242b on the conductive layer 260 side are substantially perpendicular. Note that the transistor 200A illustrated in FIG. 29 is not limited thereto, and the angle formed between the side surfaces and the bottom surfaces of the conductive layer 242a and the conductive layer 242b may be greater than or equal to 10° and less than or equal to 80°, preferably greater than or equal to 30° and less than or equal to 60°. The side surfaces of the conductive layer 242a and the conductive layer 242b that face each other may have a plurality of surfaces.

As illustrated in FIG. 29, the insulating layer 254 is preferably placed between the insulating layer 280 and each of the insulating layer 224, the metal oxide 230a, the metal oxide 230b, the conductive layer 242a, the conductive layer 242b, and the metal oxide 230c. Here, as illustrated in FIG. 29B and FIG. 29C, the insulating layer 254 is preferably in contact with the side surface of the metal oxide 230c, the top surface and the side surface of the conductive layer 242a, the top surface and the side surface of the conductive layer 242b, the side surfaces of the metal oxide 230a and the metal oxide 230b, and the top surface of the insulating layer 224.

In the transistor 200A, three layers of the metal oxide 230a, the metal oxide 230b, and the metal oxide 230c are stacked in and around the region where the channel is formed (hereinafter also referred to as channel formation region); however, one embodiment of the present invention is not limited thereto. For example, a two-layer structure of the metal oxide 230b and the metal oxide 230c or a stacked-layer structure of four or more layers may be employed. Although the conductive layer 260 is illustrated to have a stacked-layer structure of two layers in the transistor 200A, one embodiment of the present invention is not limited thereto.

For example, the conductive layer 260 may have a single-layer structure or a stacked-layer structure of three or more layers. Furthermore, each of the metal oxide 230a, the metal oxide 230b, and the metal oxide 230c may have a stacked-layer structure of two or more layers.

For example, in the case where the metal oxide 230c has a stacked-layer structure including a first metal oxide and a second metal oxide over the first metal oxide, the first metal oxide preferably has a composition similar to that of the metal oxide 230b and the second metal oxide preferably has a composition similar to that of the metal oxide 230a.

Here, the conductive layer 260 functions as a gate electrode of the transistor, and the conductive layer 242a and the conductive layer 242b function as a source electrode and a drain electrode. As described above, the conductive layer 260 is formed to be embedded in the opening of the insulating layer 280 and the region interposed between the conductive layer 242a and the conductive layer 242b. Here, the positions of the conductive layer 260, the conductive layer 242a, and the conductive layer 242b are selected in a self-aligned manner with respect to the opening of the insulating layer 280. In other words, in the transistor 200A, the gate electrode can be placed between the source electrode and the drain electrode in a self-aligned manner. Thus, the conductive layer 260 can be formed without an alignment margin, resulting in a reduction in the area occupied by the transistor 200A. Accordingly, the display device can have higher resolution. In addition, the display device can have a narrow bezel.

As illustrated in FIG. 29, the conductive layer 260 preferably includes a conductive layer 260a provided on the inner side of the insulating layer 250 and a conductive layer 260b provided to be embedded on the inner side of the conductive layer 260a.

The transistor 200A preferably includes the insulating layer 214 placed over the substrate (not illustrated); the insulating layer 216 placed over the insulating layer 214; a conductive layer 205 placed to be embedded in the insulating layer 216; the insulating layer 222 placed over the insulating layer 216 and the conductive layer 205; and the insulating layer 224 placed over the insulating layer 222. The metal oxide 230a is preferably placed over the insulating layer 224.

The insulating layer 274 and the insulating layer 281 functioning as interlayer films are preferably placed over the transistor 200A. Here, the insulating layer 274 is preferably placed in contact with the top surfaces of the conductive layer 260, the insulating layer 250, the insulating layer 254, the metal oxide 230c, and the insulating layer 280.

The insulating layer 222, the insulating layer 254, and the insulating layer 274 preferably have a function of inhibiting diffusion of at least one of hydrogen (e.g., hydrogen atoms and hydrogen molecules). For example, the insulating layer 222, the insulating layer 254, and the insulating layer 274 preferably have a lower hydrogen permeability than the insulating layer 224, the insulating layer 250, and the insulating layer 280. Moreover, the insulating layer 222 and the insulating layer 254 preferably have a function of inhibiting diffusion of at least one of oxygen (e.g., oxygen atoms and oxygen molecules). For example, the insulating layer 222 and the insulating layer 254 preferably have a lower oxygen permeability than the insulating layer 224, the insulating layer 250, and the insulating layer 280.

Here, the insulating layer 224, the metal oxide 230, and the insulating layer 250 are separated from the insulating layer 280 and the insulating layer 281 by the insulating layer 254 and the insulating layer 274. This can inhibit entry of impurities such as hydrogen contained in the insulating layer 280 and the insulating layer 281 into the insulating layer 224, the metal oxide 230, and the insulating layer 250 and excess oxygen into the insulating layer 224, the metal oxide 230a, the metal oxide 230b, and the insulating layer 250.

A conductive layer 240 (a conductive layer 240a and a conductive layer 240b) that is electrically connected to the transistor 200A and functions as a plug is preferably provided. Note that an insulating layer 241 (an insulating layer 241a and an insulating layer 241b) is provided in contact with the side surface of the conductive layer 240 functioning as a plug. In other words, the insulating layer 241 is provided in contact with the inner wall of an opening in the insulating layer 254, the insulating layer 280, the insulating layer 274, and the insulating layer 281. In addition, a structure may be employed in which a first conductive layer of the conductive layer 240 is provided in contact with the side surface of the insulating layer 241 and a second conductive layer of the conductive layer 240 is provided on the inner side of the first conductive layer. Here, the top surface of the conductive layer 240 and the top surface of the insulating layer 281 can be substantially level with each other. Although the transistor 200A has a structure in which the first conductive layer of the conductive layer 240 and the second conductive layer of the conductive layer 240 are stacked, the present invention is not limited thereto. For example, the conductive layer 240 may have a single-layer structure or a stacked-layer structure of three or more layers. In the case where a component has a stacked-layer structure, layers may be distinguished by ordinal numbers corresponding to the formation order.

In the transistor 200A, a metal oxide functioning as an oxide semiconductor (hereinafter also referred to as an oxide semiconductor) is preferably used as the metal oxide 230 including the channel formation region (the metal oxide 230a, the metal oxide 230b, and the metal oxide 230c). For example, it is preferable to use a metal oxide having a band gap of 2 eV or more, preferably 2.5 eV or more as the metal oxide to be the channel formation region of the metal oxide 230.

The metal oxide preferably contains at least indium (In) or zinc (Zn). In particular, the metal oxide preferably contains indium (In) and zinc (Zn). In addition to them, the element M is preferably contained. As the element M, one or more of aluminum (Al), gallium (Ga), yttrium (Y), tin (Sn), boron (B), titanium (Ti), iron (Fe), nickel (Ni), germanium (Ge), zirconium (Zr), molybdenum (Mo), lanthanum (La), cerium (Ce), neodymium (Nd), hafnium (Hf), tantalum (Ta), tungsten (W), magnesium (Mg), and cobalt (Co) can be used. In particular, the element M is preferably one or more of aluminum (Al), gallium (Ga), yttrium (Y), and tin (Sn). Furthermore, the element M preferably contains one or both of Ga and Sn.

As illustrated in FIG. 29B, the metal oxide 230b in a region that does not overlap with the conductive layer 242 sometimes has a smaller thickness than the metal oxide 230b in a region that overlaps with the conductive layer 242. The thin region is formed when part of the top surface of the metal oxide 230b is removed at the time of forming the conductive layer 242a and the conductive layer 242b. When a conductive film to be the conductive layer 242 is formed, a low-resistance region is sometimes formed on the top surface of the metal oxide 230b in the vicinity of the interface with the conductive film. Removing the low-resistance region positioned between the conductive layer 242a and the conductive layer 242b on the top surface of the metal oxide 230b in the above manner can prevent formation of the channel in the region.

According to one embodiment of the present invention, a display device that includes small-size transistors and has high resolution can be provided. A display device that includes a transistor with a high on-state current and has high luminance can be provided. A display device that includes a transistor operating at high speed and thus operates at high speed can be provided. A display device that includes a transistor having stable electrical characteristics and is highly reliable can be provided. A display device that includes a transistor with a low off-state current and has low power consumption can be provided.

The structure of the transistor 200A that can be used in the display device of one embodiment of the present invention is described in detail.

The conductive layer 205 is placed to include a region overlapping with the metal oxide 230 and the conductive layer 260. Furthermore, the conductive layer 205 is preferably provided to be embedded in the insulating layer 216.

The conductive layer 205 includes the conductive layer 205a, the conductive layer 205b, and the conductive layer 205c. The conductive layer 205a is provided in contact with the bottom surface and the side wall of the opening provided in the insulating layer 216. The conductive layer 205b is provided to be embedded in a recessed portion formed in the conductive layer 205a. Here, the top surface of the conductive layer 205b is lower in level than the top surface of the conductive layer 205a and the top surface of the insulating layer 216. The conductive layer 205c is provided in contact with the top surface of the conductive layer 205b and the side surface of the conductive layer 205a. Here, the top surface of the conductive layer 205c is substantially level with the top surface of the conductive layer 205a and the top surface of the insulating layer 216. That is, the conductive layer 205b is surrounded by the conductive layer 205a and the conductive layer 205c.

Here, for the conductive layer 205a and the conductive layer 205c, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, or the like), and a copper atom. Alternatively, it is preferable to use a conductive material having a function of inhibiting diffusion of oxygen (e.g., at least one of an oxygen atom and an oxygen molecule).

When the conductive layer 205a and the conductive layer 205c are formed using a conductive material having a function of inhibiting diffusion of hydrogen, impurities such as hydrogen contained in the conductive layer 205b can be inhibited from diffusing into the metal oxide 230 through the insulating layer 224 and the like. When the conductive layer 205a and the conductive layer 205c are formed using a conductive material having a function of inhibiting diffusion of oxygen, the conductivity of the conductive layer 205b can be inhibited from being lowered because of oxidation. As the conductive material having a function of inhibiting diffusion of oxygen, for example, titanium, titanium nitride, tantalum, tantalum nitride, ruthenium, or ruthenium oxide is preferably used. Thus, the conductive layer 205a is a single layer or a stack of the above conductive materials. For example, titanium nitride is used for the conductive layer 205a.

For the conductive layer 205b, a conductive material containing tungsten, copper, or aluminum as its main component is preferably used. For example, tungsten is used for the conductive layer 205b.

The conductive layer 260 sometimes functions as a first gate (also referred to as top gate) electrode. The conductive layer 205 sometimes functions as a second gate (also referred to as bottom gate) electrode. In that case, by changing a potential applied to the conductive layer 205 not in synchronization with but independently of a potential applied to the conductive layer 260, Vth of the transistor 200A can be controlled. In particular, by applying a negative potential to the conductive layer 205, Vth of the transistor 200A can be higher than 0 V and the off-state current can be made small. Thus, a drain current at the time when a potential applied to the conductive layer 260 is 0 V can be lower in the case where a negative potential is applied to the conductive layer 205 than in the case where the negative potential is not applied to the conductive layer 205.

The conductive layer 205 is preferably provided to be larger than the channel formation region in the metal oxide 230. In particular, it is preferable that the conductive layer 205 extend beyond an end portion of the metal oxide 230 that intersects with the channel width direction, as illustrated in FIG. 29C. In other words, the conductive layer 205 and the conductive layer 260 preferably overlap with each other with the insulating layer placed therebetween, in a region outside the side surface of the metal oxide 230 in the channel width direction.

With the above structure, the channel formation region of the metal oxide 230 can be electrically surrounded by electric fields of the conductive layer 260 functioning as the first gate electrode and electric fields of the conductive layer 205 functioning as the second gate electrode.

Furthermore, as illustrated in FIG. 29C, the conductive layer 205 extends to function as a wiring as well. However, without limitation to this structure, a structure in which a conductive layer functioning as a wiring is provided below the conductive layer 205 may be employed.

The insulating layer 214 preferably functions as a barrier insulating film that inhibits entry of impurities such as water or hydrogen to the transistor 200A from the substrate side. Accordingly, it is preferable to use, for the insulating layer 214, an insulating material having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom (an insulating material through which the impurities are less likely to pass). Alternatively, it is preferable to use an insulating material having a function of inhibiting diffusion of at least one of oxygen (e.g., an oxygen atom or an oxygen molecule) (an insulating material through which the oxygen is less likely to pass).

For example, aluminum oxide or silicon nitride is preferably used for the insulating layer 214. Accordingly, it is possible to inhibit diffusion of impurities such as water or hydrogen to the transistor 200A side from the substrate side through the insulating layer 214. Alternatively, it is possible to inhibit diffusion of oxygen contained in the insulating layer 224 and the like to the substrate side through the insulating layer 214.

The permittivity of each of the insulating layer 216, the insulating layer 280, and the insulating layer 281 functioning as an interlayer film is preferably lower than that of the insulating layer 214. When a material with a low permittivity is used for an interlayer film, the parasitic capacitance generated between wirings can be reduced. For the insulating layer 216, the insulating layer 280, and the insulating layer 281, for example, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like can be used as appropriate.

The insulating layer 222 and the insulating layer 224 function as a gate insulating layer.

Here, the insulating layer 224 in contact with the metal oxide 230 preferably releases oxygen by heating. In this specification, oxygen that is released by heating is referred to as excess oxygen in some cases. For example, silicon oxide, silicon oxynitride, or the like can be used as appropriate for the insulating layer 224. When an insulating layer containing oxygen is provided in contact with the metal oxide 230, oxygen vacancies in the metal oxide 230 can be reduced, leading to improved reliability of the transistor 200A.

Specifically, an oxide material that releases part of oxygen by heating is preferably used for the insulating layer 224. An oxide that releases oxygen by heating is an oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in TDS (Thermal Desorption Spectroscopy) analysis. Note that the temperature of the film surface in the TDS analysis is preferably in the range of 100° C. to 700° C., inclusive or 100° C. to 400° C., inclusive.

As illustrated in FIG. 29C, the insulating layer 224 is sometimes thinner in a region overlapping with neither the insulating layer 254 nor the metal oxide 230b than in the other regions. In the insulating layer 224, the region overlapping with neither the insulating layer 254 nor the metal oxide 230b preferably has a thickness with which the above oxygen can be adequately diffused.

Like the insulating layer 214 and the like, the insulating layer 222 preferably functions as a barrier insulating film that inhibits entry of impurities such as water or hydrogen into the transistor 200A from the substrate side. For example, the insulating layer 222 preferably has a lower hydrogen permeability than the insulating layer 224. When the insulating layer 224, the metal oxide 230, the insulating layer 250, and the like are surrounded by the insulating layer 222, the insulating layer 254, and the insulating layer 274, entry of impurities such as water or hydrogen into the transistor 200A from the outside can be inhibited.

Furthermore, it is preferable that the insulating layer 222 have a function of inhibiting diffusion of at least one of oxygen (e.g., an oxygen atom and an oxygen molecule) (it is preferable that the oxygen be less likely to pass through the insulating layer 222). For example, the insulating layer 222 preferably has a lower oxygen permeability than the insulating layer 224. The insulating layer 222 preferably has a function of inhibiting diffusion of oxygen and impurities, in which case oxygen contained in the metal oxide 230 is less likely to diffuse to the substrate side. Moreover, the conductive layer 205 can be inhibited from reacting with oxygen contained in the insulating layer 224 and the metal oxide 230.

As the insulating layer 222, an insulating layer containing an oxide of one or both of aluminum and hafnium, which is an insulating material, is preferably used. As the insulating layer containing an oxide of one or both of aluminum and hafnium, aluminum oxide, hafnium oxide, an oxide containing aluminum and hafnium (hafnium aluminate), or the like is preferably used. In the case where the insulating layer 222 is formed using such a material, the insulating layer 222 functions as a layer inhibiting release of oxygen from the metal oxide 230 and entry of impurities such as hydrogen into the metal oxide 230 from the periphery of the transistor 200A.

Alternatively, aluminum oxide, bismuth oxide, germanium oxide, niobium oxide, silicon oxide, titanium oxide, tungsten oxide, yttrium oxide, or zirconium oxide may be added to these insulating layers, for example. Alternatively, these insulating layers may be subjected to nitriding treatment. Silicon oxide, silicon oxynitride, or silicon nitride may be stacked over the above insulating layer.

The insulating layer 222 may be a single layer or a stacked layer using an insulating layer containing a high-k material such as aluminum oxide, hafnium oxide, tantalum oxide, zirconium oxide, lead zirconate titanate (PZT), strontium titanate ($SrTiO_3$), or $(Ba,Sr)TiO_3$ (BST). With further miniaturization and higher integration of a transistor, a problem such as generation of leakage current might arise because of a thinned gate insulating layer. When a high-k material is used for the insulating layer functioning as a gate insulating layer, a gate potential at the time of operation of the transistor can be reduced while the physical thickness is maintained.

Note that the insulating layer 222 and the insulating layer 224 may each have a stacked-layer structure of two or more layers. In that case, without limitation to a stacked-layer structure formed of the same material, a stacked-layer structure formed of different materials may be employed. For example, an insulating layer similar to the insulating layer 224 may be provided below the insulating layer 222.

The metal oxide 230 includes the metal oxide 230a, the metal oxide 230b over the metal oxide 230a, and the metal oxide 230c over the metal oxide 230b. When the metal oxide 230 includes the metal oxide 230a under the metal oxide 230b, it is possible to inhibit diffusion of impurities into the metal oxide 230b from the components formed below the metal oxide 230a. Moreover, when the metal oxide 230 includes the metal oxide 230c over the metal oxide 230b, it is possible to inhibit diffusion of impurities into the metal oxide 230b from the components formed above the metal oxide 230c.

Note that the metal oxide 230 preferably has a stacked-layer structure of a plurality of oxide layers that differ in the atomic ratio of metal atoms. For example, in the case where the metal oxide 230 contains at least indium (In) and the element M, the proportion of the number of atoms of the element M contained in the metal oxide 230a to the number of atoms of all elements that constitute the metal oxide 230a is preferably higher than the proportion of the number of atoms of the element M contained in the metal oxide 230b to the number of atoms of all elements that constitute the metal oxide 230b. In addition, the atomic ratio of the element M to In in the metal oxide 230a is preferably greater than the atomic ratio of the element M to In in the metal oxide 230b. Here, a metal oxide that can be used as the metal oxide 230a or the metal oxide 230b can be used as the metal oxide 230c.

The energy of the conduction band minimum of each of the metal oxide 230a and the metal oxide 230c is preferably higher than the energy of the conduction band minimum of the metal oxide 230b. In other words, the electron affinity of each of the metal oxide 230a and the metal oxide 230c is preferably smaller than the electron affinity of the metal oxide 230b. In this case, a metal oxide that can be used as the metal oxide 230a is preferably used as the metal oxide 230c. Specifically, the proportion of the number of atoms of the element M contained in the metal oxide 230c to the number of atoms of all elements that constitute the metal oxide 230c is preferably higher than the proportion of the number of atoms of the element M contained in the metal oxide 230b to the number of atoms of all elements that constitute the metal oxide 230b. In addition, the atomic ratio of the element M to In in the metal oxide 230c is preferably greater than the atomic ratio of the element M to In in the metal oxide 230b.

Here, the energy level of the conduction band minimum gently changes at junction portions between the metal oxide 230a, the metal oxide 230b, and the metal oxide 230c. In other words, the energy levels of the conduction band minimum at junction portions between the metal oxide 230a, the metal oxide 230b, and the metal oxide 230c continuously vary or are continuously connected. This can be achieved by decreasing the density of defect states in a mixed layer formed at the interface between the metal oxide 230a and the metal oxide 230b and the interface between the metal oxide 230b and the metal oxide 230c.

Specifically, when the metal oxide 230a and the metal oxide 230b or the metal oxide 230b and the metal oxide 230c contain the same element (as a main component) in addition to oxygen, a mixed layer with a low density of defect states can be formed. For example, an In—Ga—Zn oxide, a Ga—Zn oxide, gallium oxide, or the like may be used as the metal oxide 230a and the metal oxide 230c, in the case where the metal oxide 230b is an In—Ga—Zn oxide. The metal oxide 230c may have a stacked-layer structure. For example, a stacked-layer structure of an In—Ga—Zn oxide and a Ga—Zn oxide over the In—Ga—Zn oxide or a stacked-layer structure of an In—Ga—Zn oxide and gallium oxide over the In—Ga—Zn oxide can be employed. In other words, the metal oxide 230c may have a stacked-layer structure of an In—Ga—Zn oxide and an oxide that does not contain In.

Specifically, as the metal oxide 230a, a metal oxide with In:Ga:Zn=1:3:4 [atomic ratio] or 1:1:0.5 [atomic ratio] can be used. As the metal oxide 230b, a metal oxide with In:Ga:Zn=4:2:3 [atomic ratio] or 3:1:2 [atomic ratio] can be used. As the metal oxide 230c, a metal oxide with In:Ga:Zn=1:3:4 [atomic ratio], In:Ga:Zn=4:2:3 [atomic ratio], Ga:Zn=2:1 [atomic ratio], or Ga:Zn=2:5 [atomic ratio] can be used. Specific examples of a stacked-layer structure of the metal oxide 230c include a stacked-layer structure of a layer with In:Ga:Zn=4:2:3 [atomic ratio] and a layer with Ga:Zn=2:1 [atomic ratio], a stacked-layer structure of a layer with In:Ga:Zn=4:2:3 [atomic ratio] and a layer with Ga:Zn=2:5 [atomic ratio], and a stacked-layer structure of a layer with In:Ga:Zn=4:2:3 [atomic ratio] and a layer of gallium oxide.

At this time, the metal oxide 230b serves as a main carrier path. When the metal oxide 230a and the metal oxide 230c have the above structure, the density of defect states at the interface between the metal oxide 230a and the metal oxide 230b and the interface between the metal oxide 230b and the metal oxide 230c can be made low. This reduces the influence of interface scattering on carrier conduction, and the transistor 200A can have a high on-state current and high frequency characteristics. Note that in the case where the metal oxide 230c has a stacked-layer structure, not only the effect of reducing the density of defect states at the interface between the metal oxide 230b and the metal oxide 230c, but also the effect of inhibiting diffusion of the constituent element contained in the metal oxide 230c to the insulating layer 250 side can be expected. Specifically, the metal oxide 230c has a stacked-layer structure in which the upper layer is an oxide that does not contain In, whereby the diffusion of In to the insulating layer 250 side can be inhibited. Since the insulating layer 250 functions as a gate insulating layer, the transistor has defects in characteristics when In diffuses. Thus, the metal oxide 230c having a stacked-layer structure allows a highly reliable display device to be provided.

The conductive layer 242 (the conductive layer 242a and the conductive layer 242b) functioning as the source electrode and the drain electrode is provided over the metal oxide 230b. For the conductive layer 242, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that maintain their conductivity even after absorbing oxygen.

When the conductive layer 242 is provided in contact with the metal oxide 230, the oxygen concentration of the metal oxide 230 in the vicinity of the conductive layer 242 sometimes decreases. In addition, a metal compound layer that contains the metal contained in the conductive layer 242 and the component of the metal oxide 230 is sometimes formed in the metal oxide 230 in the vicinity of the conductive layer 242. In such cases, the carrier density of the region in the metal oxide 230 in the vicinity of the conductive layer 242 increases, and the region becomes a low-resistance region.

Here, the region between the conductive layer 242a and the conductive layer 242b is formed to overlap with the opening of the insulating layer 280. Accordingly, the conductive layer 260 can be formed in a self-aligned manner between the conductive layer 242a and the conductive layer 242b.

The insulating layer 250 functions as a gate insulating layer. The insulating layer 250 is preferably placed in contact with the top surface of the metal oxide 230c. For the insulating layer 250, silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride, which are thermally stable, are preferable.

As in the insulating layer 224, the concentration of impurities such as water or hydrogen in the insulating layer 250 is preferably reduced. The thickness of the insulating layer 250 is preferably greater than or equal to 1 nm and less than or equal to 20 nm.

A metal oxide may be provided between the insulating layer 250 and the conductive layer 260. The metal oxide preferably inhibits oxygen diffusion from the insulating layer 250 into the conductive layer 260. Accordingly, oxidation of the conductive layer 260 due to oxygen in the insulating layer 250 can be inhibited.

The metal oxide functions as part of the gate insulating layer in some cases. Therefore, when silicon oxide, silicon oxynitride, or the like is used for the insulating layer 250, a metal oxide that is a high-k material with a high dielectric constant is preferably used as the metal oxide. When the gate insulating layer has a stacked-layer structure of the insulating layer 250 and the metal oxide, the stacked-layer structure can be thermally stable and have a high dielectric constant. Accordingly, a gate potential applied during operation of the transistor can be lowered while the physical thickness of the gate insulating layer is maintained. In addition, the equivalent oxide thickness (EOT) of the insulating layer functioning as the gate insulating layer can be reduced.

Specifically, a metal oxide containing one kind or two or more kinds selected from hafnium, aluminum, gallium, yttrium, zirconium, tungsten, titanium, tantalum, nickel, germanium, magnesium, and the like can be used. It is preferable to use an insulating layer containing an oxide of one or both of aluminum and hafnium, such as aluminum oxide, hafnium oxide, or an oxide containing aluminum and hafnium (hafnium aluminate), in particular.

Although the conductive layer 260 is illustrated to have a two-layer structure in FIG. 29, the conductive layer 260 may have a single-layer structure or a stacked-layer structure of three or more layers.

The conductive layer 260a is preferably formed using the aforementioned conductive material having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom. Alternatively, it is preferable to use a conductive material having a function of inhibiting diffusion of at least one of oxygen (e.g., an oxygen atom and an oxygen molecule).

When the conductive layer 260a has a function of inhibiting diffusion of oxygen, it is possible to inhibit reduction of the conductivity due to oxidation of the conductive layer 260b by oxygen contained in the insulating layer 250. As a conductive material having a function of inhibiting oxygen diffusion, for example, tantalum, tantalum nitride, ruthenium, ruthenium oxide, or the like is preferably used.

A conductive material containing tungsten, copper, or aluminum as its main component is preferably used for the conductive layer 260b. The conductive layer 260 also functions as a wiring and thus is preferably formed using a material having high conductivity. For example, a conductive material containing tungsten, copper, or aluminum as its main component can be used. The conductive layer 260b may have a stacked-layer structure, for example, a stacked-layer structure of titanium or titanium nitride and the above conductive material.

As illustrated in FIG. 29A and FIG. 29C, the side surface of the metal oxide 230 is covered with the conductive layer 260 in a region where the metal oxide 230b does not overlap with the conductive layer 242, that is, the channel formation region of the metal oxide 230. Accordingly, electric fields of the conductive layer 260 functioning as the first gate electrode are likely to act on the side surface of the metal oxide 230. Thus, the on-state current of the transistor 200A can be increased and the frequency characteristics can be improved.

The insulating layer 254, like the insulating layer 214 and the like, preferably functions as a barrier insulating film that inhibits entry of impurities such as water or hydrogen into the transistor 200A from the insulating layer 280 side. The insulating layer 254 preferably has lower hydrogen permeability than the insulating layer 224, for example. Furthermore, as illustrated in FIG. 29B and FIG. 29C, the insulating layer 254 is preferably in contact with the side surface of the metal oxide 230c, the top and side surfaces of the conductive layer 242a, the top and side surfaces of the conductive layer 242b, the side surfaces of the metal oxide 230a and the metal oxide 230b, and the top surface of the insulating layer 224. Such a structure can inhibit entry of hydrogen contained in the insulating layer 280 into the metal oxide 230 through the top surfaces or side surfaces of the conductive layer 242a, the conductive layer 242b, the metal oxide 230a, the metal oxide 230b, and the insulating layer 224.

Furthermore, it is preferable that the insulating layer 254 have a function of inhibiting diffusion of at least one of oxygen (e.g., an oxygen atom and an oxygen molecule) (it is preferable that the oxygen be less likely to pass through the insulating layer 254). For example, the insulating layer 254 preferably has lower oxygen permeability than the insulating layer 280 or the insulating layer 224.

The insulating layer 254 is preferably formed by a sputtering method. When the insulating layer 254 is formed by a sputtering method in an oxygen-containing atmosphere, oxygen can be added to the vicinity of a region of the insulating layer 224 that is in contact with the insulating layer 254. Thus, oxygen can be supplied from the region to the metal oxide 230 through the insulating layer 224. Here, with the insulating layer 254 having a function of inhibiting upward diffusion of oxygen, oxygen can be prevented from diffusing from the metal oxide 230 into the insulating layer 280. Moreover, with the insulating layer 222 having a function of inhibiting downward diffusion of oxygen, oxygen can be prevented from diffusing from the metal oxide 230 to the substrate side. In the above manner, oxygen is supplied to the channel formation region of the metal oxide 230. Accordingly, oxygen vacancies in the metal oxide 230 can be reduced, so that the transistor can be prevented from having normally-on characteristics.

As the insulating layer 254, an insulating layer containing an oxide of one or both of aluminum and hafnium is preferably formed, for example. Note that for the insulating layer containing an oxide of one or both of aluminum and hafnium, aluminum oxide, hafnium oxide, an oxide containing aluminum and hafnium (hafnium aluminate), or the like is preferably used.

The insulating layer 224, the insulating layer 250, and the metal oxide 230 are covered with the insulating layer 254 having a barrier property against hydrogen, whereby the insulating layer 280 is isolated from the insulating layer 224, the metal oxide 230, and the insulating layer 250 by the insulating layer 254. This can inhibit entry of impurities such as hydrogen from the outside of the transistor 200A, resulting in favorable electrical characteristics and high reliability of the transistor 200A.

The insulating layer 280 is provided over the insulating layer 224, the metal oxide 230, and the conductive layer 242 with the insulating layer 254 therebetween. The insulating layer 280 preferably includes, for example, silicon oxide, silicon oxynitride, silicon nitride oxide, silicon oxide to which fluorine is added, silicon oxide to which carbon is added, silicon oxide to which carbon and nitrogen are added, or porous silicon oxide. In particular, silicon oxide and silicon oxynitride are preferable because they are thermally stable. In particular, materials such as silicon oxide, silicon oxynitride, and porous silicon oxide are preferably used, in which case a region containing oxygen to be released by heating can be easily formed.

The concentration of impurities such as water or hydrogen in the insulating layer 280 is preferably reduced. In addition, the top surface of the insulating layer 280 may be planarized.

Like the insulating layer 214 and the like, the insulating layer 274 preferably functions as a barrier insulating film that inhibits entry of impurities such as water or hydrogen into the insulating layer 280 from the above. As the insulating layer 274, for example, the insulating layer that can be used as the insulating layer 214, the insulating layer 254, and the like can be used.

The insulating layer 281 functioning as an interlayer film is preferably provided over the insulating layer 274. As in the insulating layer 224 and the like, the concentration of impurities such as water or hydrogen in the insulating layer 281 is preferably reduced.

The conductive layer 240a and the conductive layer 240b are placed in openings formed in the insulating layer 281, the insulating layer 274, the insulating layer 280, and the insulating layer 254. The conductive layer 240a and the conductive layer 240b are placed to face each other with the conductive layer 260 therebetween. Note that the top surfaces of the conductive layer 240a and the conductive layer 240b may be on the same plane as the top surface of the insulating layer 281.

The insulating layer 241a is provided in contact with the inner wall of the opening in the insulating layer 281, the insulating layer 274, the insulating layer 280, and the insulating layer 254, and the first conductive layer of the conductive layer 240a is formed in contact with the side surface of the insulating layer 241a. The conductive layer 242a is positioned on at least part of the bottom portion of the opening, and the conductive layer 240a is in contact with the conductive layer 242a. Similarly, the insulating layer 241b is provided in contact with the inner wall of the opening in the insulating layer 281, the insulating layer 274, the insulating layer 280, and the insulating layer 254, and the first conductive layer of the conductive layer 240b is formed in contact with the side surface of the insulating layer 241b. The conductive layer 242b is positioned on at least part of the bottom portion of the opening, and the conductive layer 240b is in contact with the conductive layer 242b.

The conductive layer 240a and the conductive layer 240b are preferably formed using a conductive material containing tungsten, copper, or aluminum as its main component. The conductive layer 240a and the conductive layer 240b may have a stacked-layer structure.

In the case where the conductive layer 240 has a stacked-layer structure, the aforementioned material having a function of inhibiting diffusion of impurities such as water or hydrogen is preferably used for the conductive layer in contact with the metal oxide 230a, the metal oxide 230b, the conductive layer 242, the insulating layer 254, the insulating layer 280, the insulating layer 274, and the insulating layer 281. For example, tantalum, tantalum nitride, titanium, titanium nitride, ruthenium, ruthenium oxide, or the like is preferably used. The conductive material having a function of inhibiting diffusion of impurities such as water or hydrogen can be used as a single layer or stacked layers. The use of the conductive material can inhibit oxygen added to the insulating layer 280 from being absorbed by the conductive layer 240a and the conductive layer 240b. Moreover, impurities such as water or hydrogen can be inhibited from entering the metal oxide 230 through the conductive layer 240a and the conductive layer 240b from a layer above the insulating layer 281.

As the insulating layer 241a and the insulating layer 241b, for example, the insulating layer that can be used as the insulating layer 254 and the like can be used. Since the insulating layer 241a and the insulating layer 241b are provided in contact with the insulating layer 254, impurities such as water or hydrogen in the insulating layer 280 or the like can be inhibited from entering the metal oxide 230 through the conductive layer 240a and the conductive layer 240b. Furthermore, oxygen contained in the insulating layer 280 can be inhibited from being absorbed by the conductive layer 240a and the conductive layer 240b.

Although not illustrated, a conductive layer functioning as a wiring may be placed in contact with the top surface of the conductive layer 240a and the top surface of the conductive layer 240b. For the conductive layer functioning as a wiring, a conductive material containing tungsten, copper, or aluminum as its main component is preferably used. Furthermore, the conductive layer may have a stacked-layer structure and may be a stack of titanium or titanium nitride and the above conductive material, for example. Note that the conductive layer may be formed to be embedded in an opening provided in an insulating layer.

<Structure Example_2 of Transistor>

Figures 30A, 30B, 30C:
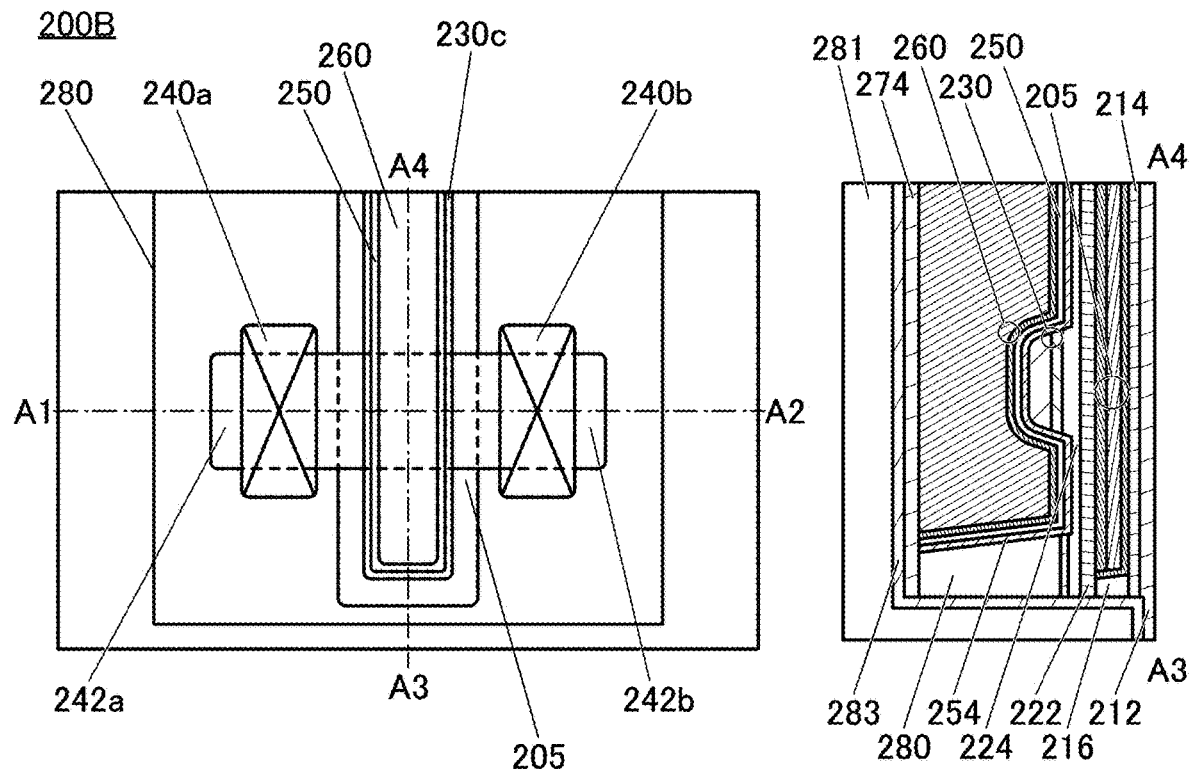
FIG. 30A is a top view illustrating a structure example of a transistor.
FIG. 30B and FIG. 30C are cross-sectional views illustrating the structure example of the transistor.

FIG. 30A, FIG. 30B, and FIG. 30C are a top view and cross-sectional views of a transistor 200B that can be used in the display device of one embodiment of the present invention and the periphery of the transistor 200B. The transistor 200B is a modification example of the transistor 200A.

FIG. 30A is a top view of the transistor 200B. FIG. 30B and FIG. 30C are cross-sectional views of the transistor 200B. Here, FIG. 30B is a cross-sectional view of a portion indicated by dashed-dotted line A1-A2 in FIG. 30A, and is also a cross-sectional view of the transistor 200B in the channel length direction. FIG. 30C is a cross-sectional view of a portion indicated by dashed-dotted line A3-A4 in FIG. 30A, and is also a cross-sectional view of the transistor 200A in the channel width direction. Note that some components are omitted in the top view of FIG. 30A for clarity of the drawing.

The transistor 200B is different from the transistor 200A in including an insulating layer 212 and an insulating layer 283.

In the transistor 200B, the insulating layer 212 is provided over a substrate (not illustrated). In addition, the insulating layer 283 is provided over the insulating layer 212 and an insulating layer 271.

The transistor 200B has a structure in which the insulating layer 283 covers the insulating layer 214, the insulating layer 216, the insulating layer 222, the insulating layer 224, the insulating layer 280, and the insulating layer 274. The insulating layer 283 is in contact with the top surface of the insulating layer 274, the side surface of the insulating layer 274, the side surface of the insulating layer 280, the side surface of the insulating layer 224, the side surface of the insulating layer 222, the side surface of the insulating layer 216, the side surface of the insulating layer 214, and the top surface of the insulating layer 212. Thus, the metal oxide 230 and the like are isolated from the outside by the insulating layer 283 and the insulating layer 212.

The insulating layer 283 and the insulating layer 212 preferably have high capability of inhibiting diffusion of hydrogen (e.g., at least one of a hydrogen atom, a hydrogen molecule, and the like) or a water molecule. For example, the insulating layer 281 and the insulating layer 212 are preferably formed using silicon nitride or silicon nitride oxide that is a material having a high hydrogen barrier property. This can inhibit diffusion of hydrogen or the like into the metal oxide 230, thereby suppressing the degradation of the characteristics of the transistor 200B. Consequently, the reliability of the semiconductor device of one embodiment of the present invention can be increased.

For example, silicon nitride can be used for the insulating layer 283. When the insulating layer 283 is formed using silicon nitride by a sputtering method, a high-density silicon nitride film where a void or the like is less likely to be formed can be obtained. To obtain the insulating layer 283, silicon nitride deposited by an ALD method may be stacked over silicon nitride deposited by a sputtering method. Such a structure is preferable because even when a defect such as a void is generated in silicon nitride deposited by a sputtering method, the void can be filled with silicon nitride deposited by an ALD method achieving good coverage, so that sealing capability can be increased. For the insulating layer 212, any of the materials that can be used for the insulating layer 214 can be used. For example, silicon nitride can be used for the insulating layer 212 and aluminum oxide can be used for the insulating layer 214.

<Structure Example_3 of Transistor>

Figure 31A:
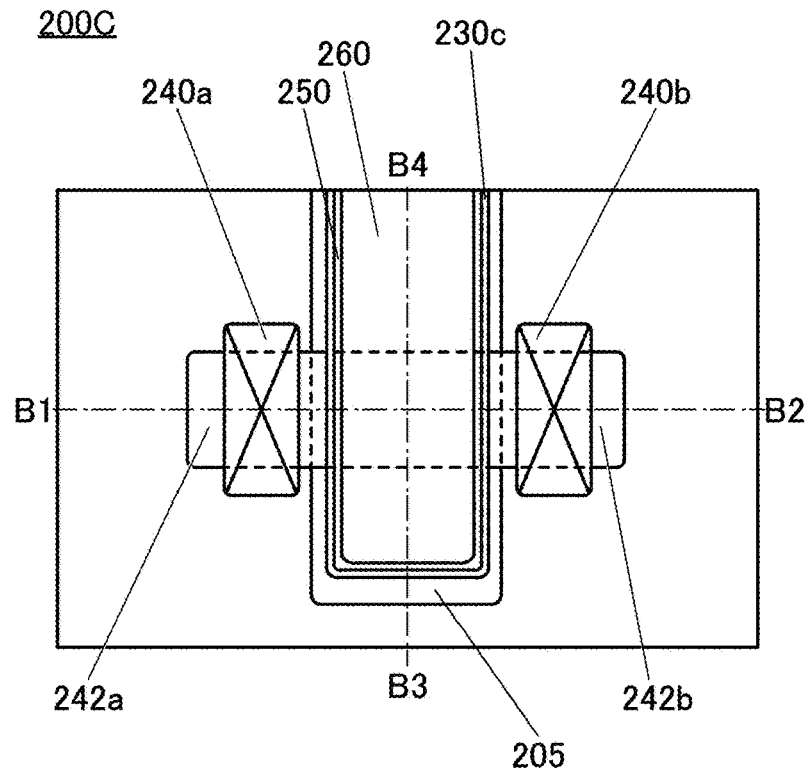
FIG. 31A is a top view illustrating a structure example of a transistor.
Figure 31C:
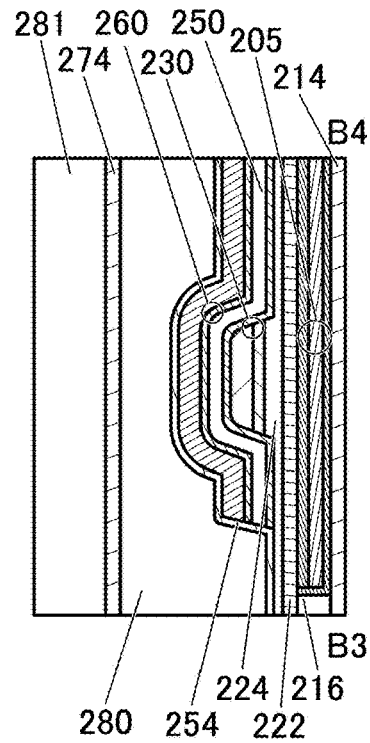
FIG. 31B and FIG. 31C are cross-sectional views illustrating the structure example of the transistor.
Figure 31B:
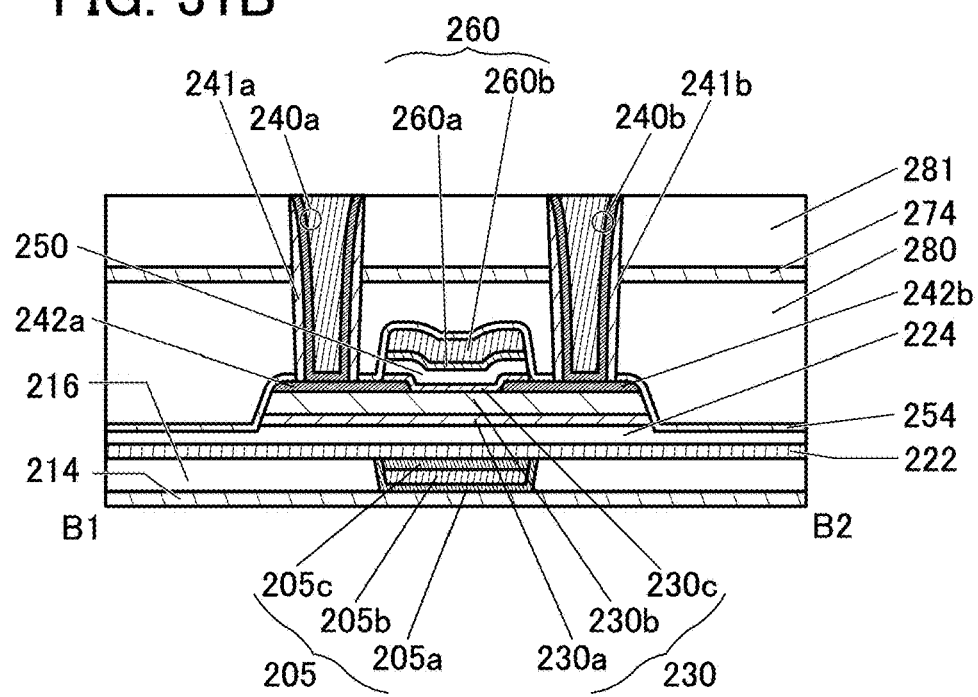

FIG. 31A, FIG. 31B, and FIG. 31C are a top view and cross-sectional views of a transistor 200C that can be used in the display device of one embodiment of the present invention and the periphery of the transistor 200C. The transistor 200C is a modification example of the transistor 200A.

FIG. 31A is a top view of the transistor 200C. FIG. 31B and FIG. 31C are cross-sectional views of the transistor 200C. Here, FIG. 31B is a cross-sectional view of a portion indicated by dashed-dotted line B1-B2 in FIG. 31A and is also a cross-sectional view of the transistor 200C in the channel length direction. FIG. 31C is a cross-sectional view of a portion indicated by dashed-dotted line B3-B4 in FIG. 31A and is also a cross-sectional view of the transistor 200C in the channel width direction. Note that some components are omitted in the top view of FIG. 31A for clarity of the drawing.

In the transistor 200C, the conductive layer 242a and the conductive layer 242b each have a region overlapping with the metal oxide 230c, the insulating layer 250, and the conductive layer 260. This enables the transistor 200C to have a high on-state current. This also enables the transistor 200C to be a transistor that is easy to control.

The conductive layer 260 functioning as a gate electrode includes the conductive layer 260a and the conductive layer 260b over the conductive layer 260a. For the conductive layer 260a, a conductive material having a function of inhibiting diffusion of impurities such as a hydrogen atom, a hydrogen molecule, a water molecule, and a copper atom is preferably used. Alternatively, it is preferable to use a conductive material having a function of inhibiting diffusion of oxygen (e.g., at least one of an oxygen atom, an oxygen molecule, and the like).

When the conductive layer 260a has a function of inhibiting oxygen diffusion, the range of choices for the material of the conductive layer 260b can be expanded. In other words, the conductive layer 260a inhibits oxidation of the conductive layer 260b, thereby preventing a decrease in conductivity.

The insulating layer 254 is preferably provided to cover the top surface and side surface of the conductive layer 260, the side surface of the insulating layer 250, and the side surface of the metal oxide 230c. Note that an insulating material having a function of inhibiting diffusion of oxygen and impurities such as water or hydrogen is preferably used for the insulating layer 254.

Providing the insulating layer 254 can inhibit oxidation of the conductive layer 260. Moreover, the insulating layer 254 can inhibit diffusion of impurities such as water or hydrogen contained in the insulating layer 280 into the transistor 200C.

<Structure Example_4 of Transistor>

Figure 32A:
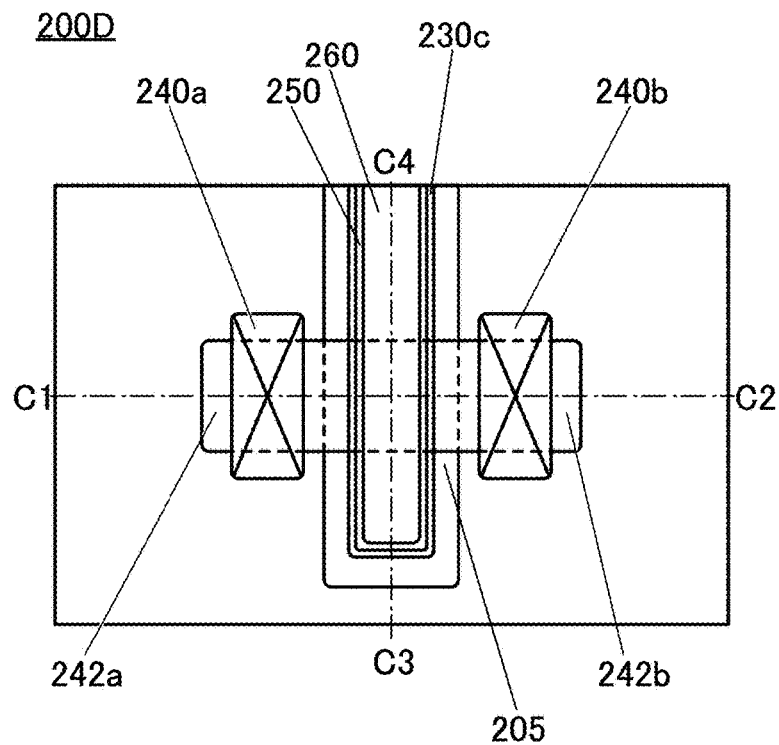
FIG. 32A is a top view illustrating a structure example of a transistor.
Figure 32C:
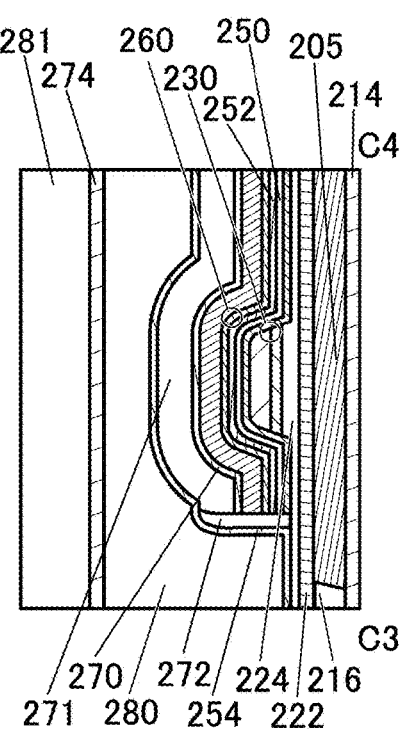
FIG. 32B and FIG. 32C are cross-sectional views illustrating the structure example of the transistor.
Figure 32B:
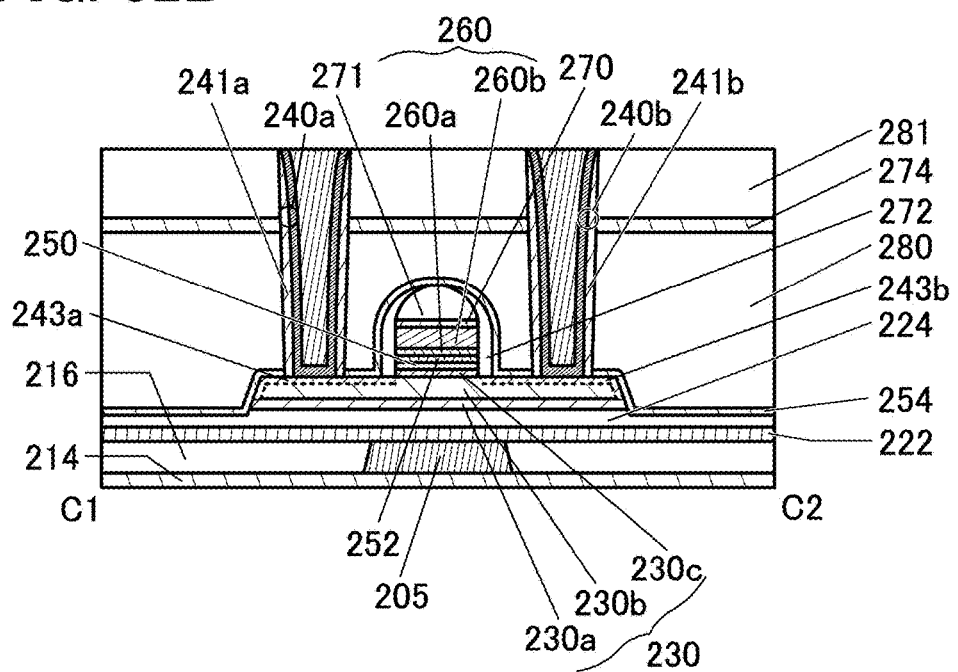

FIG. 32A, FIG. 32B, and FIG. 32C are a top view and cross-sectional views of a transistor 200D that can be used in the display device of one embodiment of the present invention and the periphery of the transistor 200D. The transistor 200D is a modification example of the transistor 200A.

FIG. 32A is a top view of the transistor 200D. FIG. 32B and FIG. 32C are cross-sectional views of the transistor 200D. Here, FIG. 32B is a cross-sectional view of a portion indicated by dashed-dotted line C1-C2 in FIG. 32A and is also a cross-sectional view of the transistor 200D in the channel length direction. FIG. 32C is a cross-sectional view of a portion indicated by dashed-dotted line C3-C4 in FIG. 32A and is also a cross-sectional view of the transistor 200D in the channel width direction. Note that some components are omitted in the top view of FIG. 32A for clarity of the drawing.

The transistor 200D includes the insulating layer 250 over the metal oxide 230c and a metal oxide 252 over the insulating layer 250. The conductive layer 260 is provided over the metal oxide 252, and an insulating layer 270 is provided over the conductive layer 260. The insulating layer 271 is provided over the insulating layer 270.

The metal oxide 252 preferably has a function of inhibiting oxygen diffusion. When the metal oxide 252 that inhibits oxygen diffusion is provided between the insulating layer 250 and the conductive layer 260, oxygen diffusion into the conductive layer 260 is inhibited. In other words, a reduction in the amount of oxygen supplied to the metal oxide 230 can be inhibited. Moreover, oxidization of the conductive layer 260 due to oxygen can be inhibited.

Note that the metal oxide 252 may function as part of a gate electrode. For example, an oxide semiconductor that can be used for the metal oxide 230 can be used for the metal oxide 252. In that case, when the conductive layer 260 is formed by a sputtering method, the metal oxide 252 can have a reduced electric resistance value and become a conductive layer. Such a conductive layer can be referred to as an OC (Oxide Conductor) electrode.

Note that the metal oxide 252 may function as part of a gate insulating layer. Thus, when silicon oxide, silicon oxynitride, or the like is used for the insulating layer 250, a metal oxide that is a high-k material with a high dielectric constant is preferably used for the metal oxide 252. Such a stacked-layer structure can be thermally stable and can have a high dielectric constant. Accordingly, a gate potential applied at the time of operation of the transistor can be lowered while the physical thickness is maintained. In addition, the equivalent oxide thickness (EOT) of an insulating layer functioning as a gate insulating layer can be reduced.

Although the metal oxide 252 in the transistor 200D is illustrated as a single layer, the metal oxide 252 may have a stacked-layer structure of two or more layers. For example, a metal oxide functioning as part of a gate electrode and a metal oxide functioning as part of a gate insulating layer may be stacked.

With the metal oxide 252 functioning as a gate electrode, the on-state current of the transistor 200D can be increased without a reduction in the influence of the electric field from the conductive layer 260. With the metal oxide 252 functioning as a gate insulating layer, the distance between the conductive layer 260 and the metal oxide 230 is kept by the physical thicknesses of the insulating layer 250 and the metal oxide 252, so that leakage current between the conductive layer 260 and the metal oxide 230 can be reduced. Thus, the stacked-layer structure of the insulating layer 250 and the metal oxide 252 makes it easy to adjust the physical distance between the conductive layer 260 and the metal oxide 230 and the intensity of electric fields applied from the conductive layer 260 to the metal oxide 230.

Specifically, for the metal oxide 252, a material obtained by reducing the resistance of an oxide semiconductor that can be used for the metal oxide 230 can be used. Alternatively, a metal oxide containing one or more of hafnium, aluminum, gallium, yttrium, zirconium, tungsten, titanium, tantalum, nickel, germanium, magnesium, and the like can be used.

In particular, it is preferable to use an insulating layer containing an oxide of one or both of aluminum and hafnium, such as aluminum oxide, hafnium oxide, or an oxide containing aluminum and hafnium (hafnium aluminate). In particular, hafnium aluminate has higher heat resistance than hafnium oxide. Therefore, hafnium aluminate is preferable because it is less likely to be crystallized by heat treatment in a later step. Note that the metal oxide 252 is not an essential component. Design is appropriately determined in consideration of required transistor characteristics.

For the insulating layer 270, an insulating material having a function of inhibiting passage of oxygen and impurities such as water or hydrogen is preferably used. For example, aluminum oxide or hafnium oxide is preferably used. Thus, oxidization of the conductive layer 260 due to oxygen from above the insulating layer 270 can be inhibited. Moreover, entry of impurities such as water or hydrogen from above the insulating layer 270 into the metal oxide 230 through the conductive layer 260 and the insulating layer 250 can be inhibited.

The insulating layer 271 functions as a hard mask. By providing the insulating layer 271, the conductive layer 260 can be processed such that the side surface of the conductive layer 260 is substantially perpendicular; specifically, an angle formed by the side surface of the conductive layer 260 and a surface of the substrate can be greater than or equal to 75° and less than or equal to 100°, preferably greater than or equal to 80° and less than or equal to 95°.

Note that the insulating layer 271 may be formed using an insulating material having a function of inhibiting passage of oxygen and impurities such as water or hydrogen so that the insulating layer 271 also functions as a barrier layer. In that case, it is not necessary to provide the insulating layer 270.

Parts of the insulating layer 270, the conductive layer 260, the metal oxide 252, the insulating layer 250, and the metal oxide 230c are selectively removed using the insulating layer 271 as a hard mask, whereby their side surfaces can be substantially aligned with each other and the surface of the metal oxide 230b can be partly exposed.

The transistor 200D includes a region 243a and a region 243b on part of the exposed surface of the metal oxide 230b. One of the region 243a and the region 243b functions as a source region, and the other of the region 243a and the region 243b functions as a drain region.

The region 243a and the region 243b can be formed by adding an impurity element such as phosphorus or boron to the exposed surface of the metal oxide 230b by an ion implantation method, an ion doping method, a plasma immersion ion implantation method, or plasma treatment, for example. In this embodiment and the like, an "impurity element" refers to an element other than main constituent elements.

The region 243a and the region 243b can also be formed in such a manner that, after part of the surface of the metal oxide 230b is exposed, a metal film is formed and then heat treatment is performed so that the element contained in the metal film is diffused into the metal oxide 230b.

The electrical resistivity of the regions of the metal oxide 230b to which the impurity element is added decreases. For that reason, the region 243a and the region 243b are sometimes referred to as "impurity regions" or "low-resistance regions".

The region 243a and the region 243b can be formed in a self-aligned manner by using the insulating layer 271 and/or the conductive layer 260 as a mask. Accordingly, the conductive layer 260 does not overlap with the region 243a and/or the region 243b, so that the parasitic capacitance can be reduced. Moreover, an offset region is not formed between the channel formation region and the source/drain region (the region 243a or the region 243b). The formation of the region 243a and the region 243b in a self-aligned manner achieves a higher on-state current, a lower threshold voltage, and a higher operating frequency, for example.

The transistor 200D includes an insulating layer 272 on the side surfaces of the insulating layer 271, the insulating layer 270, the conductive layer 260, the metal oxide 252, the insulating layer 250, and the metal oxide 230c. The insulating layer 272 is preferably an insulating layer having a low dielectric constant. For example, the insulating layer 272 is preferably silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or a resin. In particular, silicon oxide, silicon oxynitride, silicon nitride oxide, or porous silicon oxide is preferably used for the insulating layer 272, in which case an excess oxygen region can be easily formed in the insulating layer 272 in a later step. Silicon oxide and silicon oxynitride are preferable because they are thermally stable. The insulating layer 272 preferably has a function of diffusing oxygen.

Note that an offset region may be provided between the channel formation region and the source/drain region in order to further reduce the off-state current. The offset region is a region where the electrical resistivity is high and a region where the above-described addition of the impurity element is not performed. The offset region can be formed in such a manner that the insulating layer 272 is formed and then the above-described addition of the impurity element is performed. In that case, the insulating layer 272 also serves as a mask, like the insulating layer 271 or the like. Thus, the impurity element is not added to a region of the metal oxide 230b overlapping with the insulating layer 272, so that the electrical resistivity of the region can be kept high.

The transistor 200D includes the insulating layer 254 over the insulating layer 272 and the metal oxide 230. The insulating layer 254 is preferably formed by a sputtering method. By a sputtering method, an insulating layer containing few impurities such as water or hydrogen can be formed.

Note that an oxide film formed by a sputtering method may extract hydrogen from a component over which the oxide film is formed. For that reason, the hydrogen concentrations in the metal oxide 230 and the insulating layer 272 can be reduced when the insulating layer 254 absorbs hydrogen and water from the metal oxide 230 and the insulating layer 272.

<Materials for Transistor>

Materials that can be used for the transistor will be described.

[Substrate]

As a substrate where the transistor 200A to the transistor 200D are formed, an insulator substrate, a semiconductor substrate, or a conductor substrate can be used, for example. Examples of the insulator substrate include a glass substrate, a quartz substrate, a sapphire substrate, a stabilized zirconia substrate (e.g., an yttria-stabilized zirconia substrate), and a resin substrate. Examples of the semiconductor substrate include a semiconductor substrate of silicon, germanium, or the like and a compound semiconductor substrate of silicon carbide, silicon germanium, gallium arsenide, indium phosphide, zinc oxide, or gallium oxide. Another example is a semiconductor substrate in which an insulator region is included in the semiconductor substrate, e.g., an SOI (Silicon On Insulator) substrate. Examples of the conductor substrate include a graphite substrate, a metal substrate, an alloy substrate, and a conductive resin substrate. Other examples include a substrate including a metal nitride and a substrate including a metal oxide. Other examples include an insulator substrate provided with a conductive layer or a semiconductor layer, a semiconductor substrate provided with a conductive layer or an insulating layer, and a conductor substrate provided with a semiconductor layer or an insulating layer. Alternatively, these substrates provided with elements may be used. Examples of the elements provided for the substrates include a capacitor, a resistor, a switching element, a light-emitting element, and a memory element.

[Insulating Layer]

Examples of an insulating layer include an oxide, a nitride, an oxynitride, a nitride oxide, a metal oxide, a metal oxynitride, and a metal nitride oxide, each of which has an insulating property.

With further miniaturization and higher integration of a transistor, for example, a problem such as generation of leakage current may arise because of a thinned gate insulating layer. When a high-k material is used for the insulating layer functioning as a gate insulating layer, the voltage at the time of operation of the transistor can be reduced while the physical thickness is maintained. By contrast, when a material with a low dielectric constant is used for the insulating layer functioning as an interlayer film, parasitic capacitance generated between wirings can be reduced. Thus, a material is preferably selected depending on the function of an insulating layer.

Examples of the insulating layer having a high dielectric constant include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Examples of the insulating layer having a low dielectric constant include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

When a transistor including an oxide semiconductor is surrounded by insulating layers having a function of inhibiting passage of oxygen and impurities such as hydrogen (e.g., the insulating layer 214, the insulating layer 222, the insulating layer 254, and the insulating layer 274), the electrical characteristics of the transistor can be stable. An insulating layer having a function of inhibiting passage of oxygen and impurities such as hydrogen can be formed to have a single layer or a stacked layer including an insulating layer containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. Specifically, for the insulating layer having a function of inhibiting passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide or a metal nitride such as aluminum nitride, aluminum titanium nitride, titanium nitride, silicon nitride oxide, or silicon nitride can be used.

An insulating layer functioning as a gate insulating layer is preferably an insulating layer including a region containing oxygen to be released by heating. For example, when a structure is employed in which silicon oxide or silicon oxynitride that includes a region containing oxygen to be released by heating is provided in contact with the metal oxide 230, oxygen vacancies in the metal oxide 230 can be filled.

[Conductive Layer]

For a conductive layer, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, lanthanum, and the like; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that maintain their conductivity even after absorbing oxygen. A semiconductor having high electrical conductivity, typified by polycrystalline silicon containing an impurity element such as phosphorus, or silicide such as nickel silicide may be used.

A plurality of conductive layers formed using any of the above materials may be stacked. For example, a stacked-layer structure combining a material containing the above metal element and a conductive material containing oxygen may be employed. In addition, a stacked-layer structure combining a material containing the above metal element and a conductive material containing nitrogen may be employed. Furthermore, a stacked-layer structure combining a material containing the above metal element, a conductive material containing oxygen, and a conductive material containing nitrogen may be employed.

In the case where a metal oxide is used for the channel formation region of the transistor, the conductive layer functioning as the gate electrode preferably employs a stacked-layer structure combining a material containing the above metal element and a conductive material containing oxygen. In that case, the conductive material containing oxygen is preferably provided on the channel formation region side. When the conductive material containing oxygen is provided on the channel formation region side, oxygen released from the conductive material is easily supplied to the channel formation region.

It is particularly preferable to use, for the conductive layer functioning as the gate electrode, a conductive material containing oxygen and a metal element contained in the metal oxide where the channel is formed. A conductive material containing the above metal element and nitrogen may be used. For example, a conductive material containing nitrogen such as titanium nitride or tantalum nitride may be used. Indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Indium gallium zinc oxide containing nitrogen may be used. With the use of such a material, hydrogen contained in the metal oxide where the channel is formed can be captured in some cases. Alternatively, hydrogen entering from an external insulating layer or the like can be captured in some cases.

At least part of this embodiment can be implemented in combination with the other embodiments described in this specification as appropriate.

Embodiment 4

Described in this embodiment is a metal oxide (hereinafter also referred to as an oxide semiconductor) that can be used in the OS transistor described in the above embodiment.

<Classification of Crystal Structures>

First, the classification of the crystal structures of an oxide semiconductor is described with reference to FIG. 33A. FIG. 33A is a diagram showing the classification of the crystal structures of an oxide semiconductor, typically IGZO (a metal oxide containing In, Ga, and Zn).

As shown in FIG. 33A, an oxide semiconductor is roughly classified into "Amorphous", "Crystalline", and "Crystal". The term "Amorphous" includes a completely amorphous structure. The term "Crystalline" includes CAAC (c-axis-aligned crystalline), nc (nanocrystalline), and CAC (cloud-aligned composite) structures (excluding single crystal and poly crystal). Note that the term "Crystalline" excludes single crystal, poly crystal, and completely amorphous structures. The term "Crystal" includes single crystal and poly crystal structures.

Note that the structures in the thick frame shown in FIG. 33A are in an intermediate state between "Amorphous" and "Crystal", and belong to a new crystalline phase. That is, these structures are completely different from "Amorphous", which is energetically unstable, and "Crystal".

A crystal structure of a film or a substrate can be analyzed with an X-ray diffraction (XRD) spectrum. FIG. 33B shows an XRD spectrum, which is obtained by GIXD (Grazing-Incidence XRD) measurement, of a CAAC-IGZO film classified into "Crystalline". Note that a GIXD method is also referred to as a thin film method or a Seemann-Bohlin method. The XRD spectrum that is shown in FIG. 33B and obtained by GIXD measurement is hereinafter simply referred to as an XRD spectrum. The CAAC-IGZO film in FIG. 33B has a composition of In:Ga:Zn=4:2:3 [atomic ratio] or the neighborhood thereof. The CAAC-IGZO film in FIG. 33B has a thickness of 500 nm.

As shown in FIG. 33B, a clear peak indicating crystallinity is observed in the XRD spectrum of the CAAC-IGZO film. Specifically, a peak indicating c-axis alignment is observed at 2θ of around 31° in the XRD spectrum of the CAAC-IGZO film. As shown in FIG. 33B, the peak at 2θ of around 31° is asymmetric with the angle at which the peak intensity is observed as the axis.

A crystal structure of a film or a substrate can also be evaluated with a diffraction pattern obtained by a nanobeam electron diffraction (NBED) method (such a pattern is also referred to as a nanobeam electron diffraction pattern). FIG. 33C shows a diffraction pattern of the CAAC-IGZO film. FIG. 33C shows a diffraction pattern obtained by the NBED method in which an electron beam is incident in the direction parallel to the substrate. The CAAC-IGZO film in FIG. 33C has a composition of In:Ga:Zn=4:2:3 [atomic ratio] or the neighborhood thereof. In the nanobeam electron diffraction method, electron diffraction is performed with a probe diameter of 1 nm.

As shown in FIG. 33C, a plurality of spots indicating c-axis alignment are observed in the diffraction pattern of the CAAC-IGZO film.

[Structure of Oxide Semiconductor]

Oxide semiconductors might be classified in a manner different from the one in FIG. 33A when classified in terms of the crystal structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Next, the CAAC-OS, nc-OS, and a-like OS will be described in detail.

[CAAC-05]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more minute crystals (crystals each of which has a maximum diameter of less than 10 nm). In the case where the crystal region is formed of one minute crystal, the maximum diameter of the crystal region is less than 10 nm. In the case where the crystal region is formed of a large number of minute crystals, the size of the crystal region may be approximately several tens of nanometers.

In the case of an In-M-Zn oxide (the element M is one or more of aluminum, gallium, yttrium, tin, titanium, and the like), the CAAC-OS tends to have a layered crystal structure (also referred to as a layered structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM image, for example.

When the CAAC-OS film is subjected to structural analysis by out-of-plane XRD measurement with an XRD apparatus using θ/2θ scanning, for example, a peak indicating c-axis alignment is detected at or around 2θ of 31°. Note that the position of the peak indicating c-axis alignment (the value of 2θ may change depending on the kind, composition, or the like of the metal elements contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear grain boundary cannot be observed even in the vicinity of the distortion in the CAAC-OS. That is, formation of a grain boundary is inhibited by the distortion of a lattice arrangement. This is probably because the CAAC-OS can tolerate distortion owing to a low density of arrangement of oxygen atoms in the a-b plane direction, an interatomic bond distance changed by substitution of a metal atom, and the like.

A crystal structure in which a clear grain boundary is observed is what is called a polycrystal structure. It is highly probable that the grain boundary becomes a recombination center and traps carriers and thus decreases the on-state current and field-effect mobility of a transistor, for example. Thus, the CAAC-OS in which no clear grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a grain boundary as compared with an In oxide.

The CAAC-OS is an oxide semiconductor with high crystallinity in which no clear grain boundary is observed. Thus, in the CAAC-OS, a reduction in electron mobility due to the grain boundary is less likely to occur. Entry of impurities, formation of defects, or the like might decrease the crystallinity of an oxide semiconductor. This means that the CAAC-OS can be referred to as an oxide semiconductor having small amounts of impurities and defects (e.g., oxygen vacancies). Therefore, an oxide semiconductor including the CAAC-OS is physically stable. Accordingly, the oxide semiconductor including the CAAC-OS is resistant to heat and has high reliability. In addition, the CAAC-OS is stable with respect to high temperatures in the manufacturing process (what is called thermal budget). Accordingly, the use of the CAAC-OS for the OS transistor can extend a degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a minute crystal. Note that the size of the minute crystal is, for example, greater than or equal to 1 nm and less than or equal to 10 nm, particularly greater than or equal to 1 nm and less than or equal to 3 nm; thus, the minute crystal is also referred to as a nanocrystal. There is no regularity of crystal orientation between different nanocrystals in the nc-OS. Hence, the orientation in the whole film is not observed. Accordingly, in some cases, the nc-OS cannot be distinguished from an a-like OS or an amorphous oxide semiconductor, depending on an analysis method. For example, when an nc-OS film is subjected to structural analysis by out-of-plane XRD measurement with an XRD apparatus using θ/2θ scanning, a peak indicating crystallinity is not observed. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., larger than or equal to 1 nm and smaller than or equal to 30 nm).

[a-Like OS]

The a-like OS is an oxide semiconductor having a structure between those of the nc-OS and the amorphous oxide semiconductor. The a-like OS has a void or a low-density region. That is, the a-like OS has lower crystallinity than the nc-OS and the CAAC-OS. Moreover, the a-like OS has higher hydrogen concentration in the film than the nc-OS and the CAAC-OS.

[Composition of Oxide Semiconductor]

Next, the CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Note that the atomic ratios of In, Ga, and Zn to the metal elements contained in the CAC-OS in an In—Ga—Zn oxide are denoted by [In], [Ga], and [Zn], respectively. For example, the first region in the CAC-OS in the In—Ga—Zn oxide has [In] higher than [In] in the composition of the CAC-OS film. Moreover, the second region has [Ga] higher than [Ga] in the composition of the CAC-OS film. Alternatively, for example, the first region has [In] higher than [In] in the second region and [Ga] lower than [Ga] in the second region. Moreover, the second region has [Ga] higher than [Ga] in the first region and [In] lower than [In] in the first region.

Specifically, the first region contains indium oxide, indium zinc oxide, or the like as its main component. The second region contains gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

For example, in EDX mapping obtained by energy dispersive X-ray spectroscopy (EDX), it is confirmed that the CAC-OS in the In—Ga—Zn oxide has a structure in which the region containing In as its main component (the first region) and the region containing Ga as its main component (the second region) are unevenly distributed and mixed.

In the case where the CAC-OS is used for a transistor, a switching function (on/off switching function) can be given to the CAC-OS owing to the complementary action of the conductivity derived from the first region and the insulating property derived from the second region. That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current ($I_{on}$), high field-effect mobility ($\mu$) and excellent switching operation can be achieved.

An oxide semiconductor can have any of various structures that show various different properties. Two or more of the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, a case where the oxide semiconductor is used for a transistor is described.

When the oxide semiconductor is used for a transistor, the transistor can have high field-effect mobility. In addition, the transistor can have high reliability.

An oxide semiconductor having a low carrier concentration is preferably used for the transistor. For example, the carrier concentration of an oxide semiconductor is lower than or equal to $1\times10^{17}$ cm$^{-3}$, preferably lower than or equal to $1\times10^{15}$ cm$^{-2}$, further preferably lower than or equal to $1\times10^{13}$ cm$^{-3}$, still further preferably lower than or equal to $1\times10^{11}$ cm$^{-3}$, yet further preferably lower than $1\times10^{10}$ cm$^{-3}$ and higher than or equal to $1\times10^{-9}$ cm$^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and accordingly has a low density of trap states in some cases.

Charges trapped by the trap states in an oxide semiconductor take a long time to be released and may behave like fixed charges. A transistor whose channel formation region is formed in an oxide semiconductor having a high density of trap states has unstable electrical characteristics in some cases.

In order to obtain stable electrical characteristics of the transistor, it is effective to reduce the impurity concentration in the oxide semiconductor. In order to reduce the impurity concentration in the oxide semiconductor, the impurity concentration in an adjacent film is preferably reduced. Examples of impurities include hydrogen, nitrogen, alkali metal, alkaline earth metal, iron, nickel, and silicon.

<Impurity>

The influence of impurities in the oxide semiconductor is described.

When silicon or carbon, which is a Group 14 element, is contained in an oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by SIMS) are each set lower than or equal to $2\times10^{18}$ atoms/cm$^3$, preferably lower than or equal to $2\times10^{17}$ atoms/cm$^3$.

When the oxide semiconductor contains alkali metal or alkaline earth metal, defect states are formed and carriers are generated in some cases. Accordingly, a transistor including an oxide semiconductor that contains alkali metal or alkaline earth metal tends to have normally-on characteristics. Thus, the concentration of alkali metal or alkaline earth metal in the oxide semiconductor, which is obtained by SIMS, is set lower than or equal to $1\times10^{18}$ atoms/cm$^3$, preferably lower than or equal to $2\times10^{16}$ atoms/cm$^3$.

An oxide semiconductor containing nitrogen easily becomes n-type by generation of electrons serving as carriers and an increase in carrier concentration. A transistor including, as a semiconductor, an oxide semiconductor containing nitrogen tends to have normally-on characteristics. When nitrogen is contained in the oxide semiconductor, a trap state is sometimes formed. This might make the electrical characteristics of the transistor unstable. Thus, the nitrogen concentration in the oxide semiconductor, which is obtained by SIMS, is set lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in an oxide semiconductor reacts with oxygen bonded to a metal atom to be water, and thus causes an oxygen vacancy in some cases. Entry of hydrogen into the oxygen vacancy generates an electron serving as a carrier in some cases. Furthermore, in some cases, bonding of part of hydrogen to oxygen bonded to a metal atom causes generation of an electron serving as a carrier. Thus, a transistor including an oxide semiconductor containing hydrogen tends to have normally-on characteristics. For this reason, hydrogen in the oxide semiconductor is preferably reduced as much as possible. Specifically, the hydrogen concentration in the oxide semiconductor, which is obtained by SIMS, is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurities is used for a channel formation region in a transistor, stable electrical characteristics can be given.

At least part of this embodiment can be implemented in combination with the other embodiments described in this specification as appropriate.

Embodiment 5

In this embodiment, electronic devices each including a display device of one embodiment of the present invention are described.

Figure 34A:
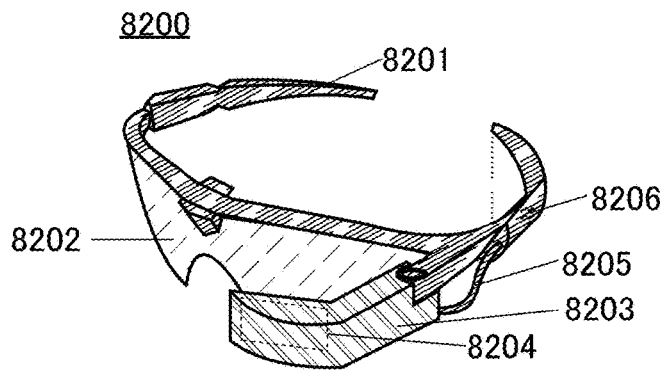
FIG. 34A to FIG. 34D are diagrams illustrating examples of electronic devices.

FIG. 34A is a diagram illustrating the appearance of a head-mounted display 8200.

The head-mounted display 8200 includes a mounting portion 8201, a lens 8202, a main body 8203, a display portion 8204, a cable 8205, and the like. A battery 8206 is incorporated in the mounting portion 8201.

The cable 8205 supplies electric power from the battery 8206 to the main body 8203. The main body 8203 includes a wireless receiver or the like and can display an image corresponding to the received image data or the like on the display portion 8204. The movement of the eyeball or the eyelid of the user is captured by a camera provided in the main body 8203 and then coordinates of the sight line of the user are calculated using the information to utilize the sight line of the user as an input means.

A plurality of electrodes may be provided in the mounting portion 8201 at a position in contact with the user. The main body 8203 may have a function of sensing current flowing through the electrodes along with the movement of the user's eyeball to recognize the user's sight line. The main body 8203 may have a function of sensing current flowing through the electrodes to monitor the user's pulse. The mounting portion 8201 may include various sensors such as a temperature sensor, a pressure sensor, and an acceleration sensor to have a function of displaying the user's biological information on the display portion 8204. The main body 8203 may sense the movement of the user's head or the like to change an image displayed on the display portion 8204 in synchronization with the movement.

The display device of one embodiment of the present invention can be used for the display portion 8204. Thus, power consumption of the head-mounted display 8200 can be reduced, so that the head-mounted display 8200 can be used continuously for a long time. The reduction in power consumption of the head-mounted display 8200 allows the battery 8206 to be downsized and get lighter, and accordingly allows the head-mounted display 8200 to be downsized and get lighter. Thus, a burden of the user of the head-mounted display 8200 can be reduced, and thus the user can be less likely to feel fatigue.

Figure 34B:
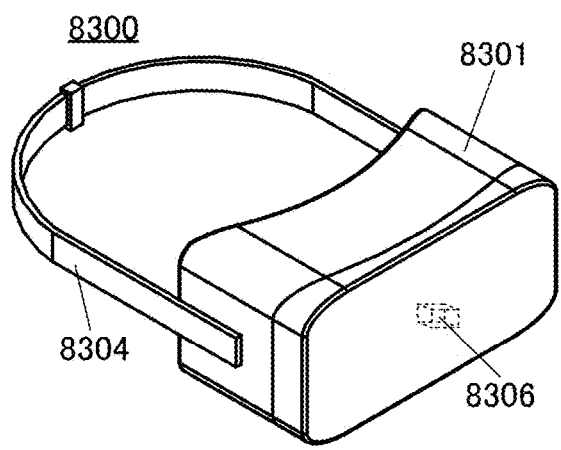
Figure 34C:
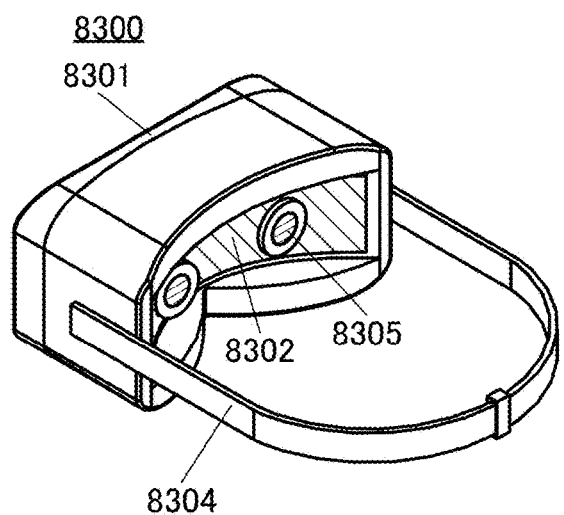
Figure 34D:
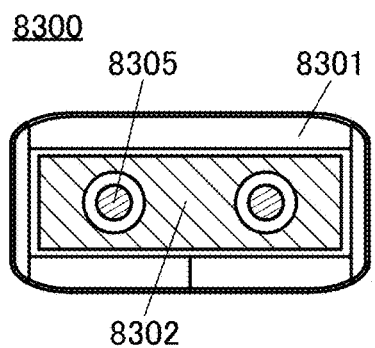

FIG. 34B, FIG. 34C, and FIG. 34D are diagrams illustrating the appearance of a head-mounted display 8300. The head-mounted display 8300 includes a housing 8301, a display portion 8302, a band-shaped fixing unit 8304, and a pair of lenses 8305. A battery 8306 is incorporated in the housing 8301, and electric power can be supplied from the battery 8306 to the display portion 8302 or the like.

The user can see display on the display portion 8302 through the lenses 8305. It is suitable that the display portion 8302 be curved and placed. When the display portion 8302 is curved and placed, the user can feel a high realistic sensation. Note that although the structure in which one display portion 8302 is provided is described in this embodiment as an example, the structure is not limited thereto, and a structure in which two display portions 8302 are provided may also be employed. In that case, one display portion is placed for one eye of the user, so that three-dimensional display using parallax or the like is possible.

Note that the display device of one embodiment of the present invention can be used for the display portion 8302. Thus, power consumption of the head-mounted display 8300 can be reduced, so that the head-mounted display 8300 can be used continuously for a long time. The reduction in power consumption of the head-mounted display 8300 allows the battery 8306 to be downsized and get lighter, and accordingly allows the head-mounted display 8300 to be downsized and get lighter. Thus, a burden of the user of the head-mounted display 8300 can be reduced, and thus the user can be less likely to feel fatigue.

Next, FIG. 35A to FIG. 35F illustrate examples of electronic devices that are different from the electronic devices illustrated in FIG. 34A to FIG. 34D.

Electronic devices illustrated in FIG. 35A to FIG. 35F include a housing 9000, a display portion 9001, a speaker 9003, an operation key 9005 (including a power switch or an operation switch), a connection terminal 9006, a sensor 9007 (having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a battery 9009, and the like.

The electronic devices illustrated in FIG. 35A to FIG. 35F have a variety of functions. Examples include a function of displaying a variety of information (a still image, a moving image, a text image, and the like) on the display portion, a touch panel function, a function of displaying a calendar, date, time, and the like, a function of controlling processing with a variety of software (programs), a wireless communication function, a function of being connected to a variety of computer networks with a wireless communication function, a function of transmitting and receiving a variety of data with a wireless communication function, and a function of reading out a program or data stored in a memory medium and displaying it on the display portion. Note that functions of the electronic devices illustrated in FIG. 35A to FIG. 35F are not limited thereto, and the electronic devices can have a variety of functions. Although not illustrated in FIG. 35A to FIG. 35F, the electronic devices may each include a plurality of display portions. The electronic devices may each include a camera and the like and have a function of taking a still image, a function of taking a moving image, a function of storing the taken image in a memory medium (external or incorporated in the camera), a function of displaying the taken image on the display portion, and the like.

The details of the electronic devices illustrated in FIG. 35A to FIG. 35F are described below.

Figure 35A:
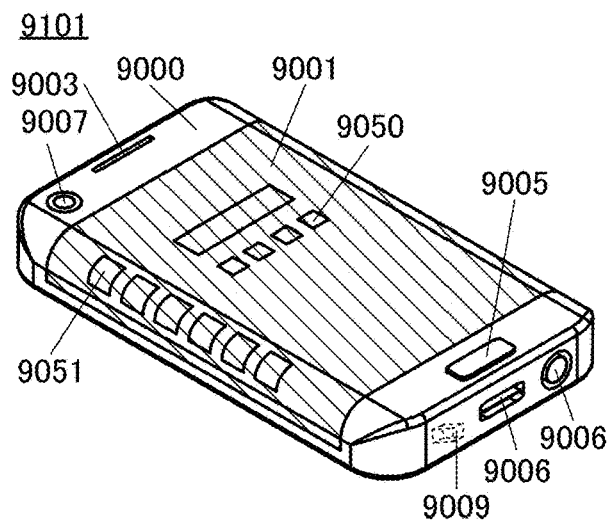
FIG. 35A to FIG. 35F are drawings illustrating examples of electronic devices.

FIG. 35A is a perspective view illustrating a portable information terminal 9101. The portable information terminal 9101 has one or more functions selected from a telephone set, a notebook, an information browsing device, and the like, for example. Specifically, the portable information terminal 9101 can be used as a smartphone. The portable information terminal 9101 can display characters or an image on its plurality of surfaces. For example, an operation button 9050 (also referred to as an operation icon, or simply an icon) can be displayed on one surface of the display portion 9001. Information 9051 can be displayed on another surface of the display portion 9001. Note that examples of the information 9051 include display indicating reception of an e-mail, an SNS (social networking service), a telephone call, and the like, the title of an e-mail, an SNS, or the like, the sender of an e-mail, an SNS, or the like, date, time, remaining battery, and reception strength of an antenna. Alternatively, the operation buttons 9050 or the like may be displayed on the position where the information 9051 is displayed, in place of the information 9051.

The display device of one embodiment of the present invention can be used for the portable information terminal 9101. Thus, power consumption of the portable information terminal 9101 can be reduced, so that the portable information terminal 9101 can be used continuously for a long time. The reduction in power consumption of the portable information terminal 9101 allows the battery 9009 to be downsized and get lighter, and accordingly allows the portable information terminal 9101 to be downsized and get lighter. Thus, portability of the portable information terminal 9101 can be increased.

Figure 35B:
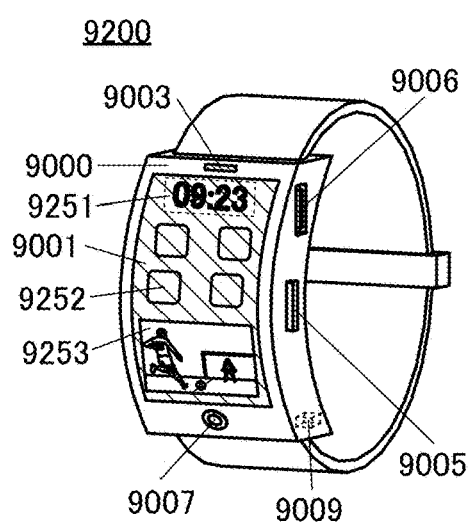

FIG. 35B is a perspective view illustrating a watch-type portable information terminal 9200. The portable information terminal 9200 is capable of executing a variety of applications such as mobile phone calls, e-mailing, reading and editing texts, music reproduction, Internet communication, and computer games. The display surface of the display portion 9001 is curved and provided, and display can be performed along the curved display surface. FIG. 35B illustrates an example in which time 9251, operation buttons 9252 (also referred to as operation icons or simply icons), and a content 9253 are displayed on the display portion 9001. The content 9253 can be a moving image, for example.

The portable information terminal 9200 can perform near field communication conformable to a communication standard. For example, mutual communication between the portable information terminal 9200 and a headset capable of wireless communication enables hands-free calling. The portable information terminal 9200 includes the connection terminal 9006, and data can be directly transmitted to and received from another information terminal via a connector. Power charging through the connection terminal 9006 is also possible. Note that the charging operation may be performed by wireless power feeding without through the connection terminal 9006.

The display device of one embodiment of the present invention can be used for the portable information terminal 9200. Thus, power consumption of the portable information terminal 9200 can be reduced, so that the portable information terminal 9200 can be used continuously for a long time. The reduction in power consumption of the portable information terminal 9200 allows the battery 9009 to be downsized and get lighter, and accordingly allows the portable information terminal 9200 to be downsized and get lighter. Thus, portability of the portable information terminal 9200 can be increased.

Figure 35C:
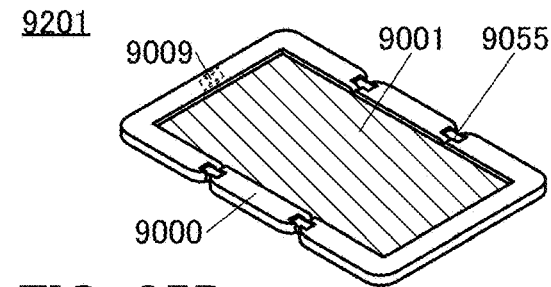
Figure 35D:
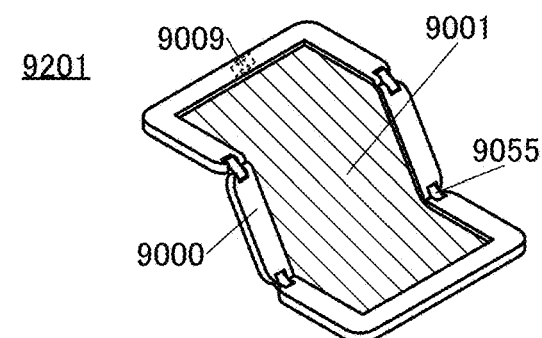
Figure 35E:
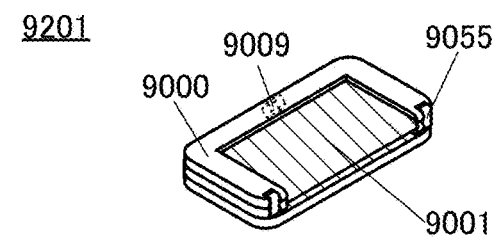

FIG. 35C, FIG. 35D, and FIG. 35E are perspective views illustrating a foldable portable information terminal 9201. FIG. 35C is a perspective view of the portable information terminal 9201 in the opened state, FIG. 35D is a perspective view of the portable information terminal 9201 that is shifted from one of the opened state and the folded state to the other, and FIG. 35E is a perspective view of the portable information terminal 9201 in the folded state. The portable information terminal 9201 is highly portable in the folded state and is highly browsable in the opened state because of a seamless large display region. The display portion 9001 of the portable information terminal 9201 is supported by three housings 9000 joined by hinges 9055. By being folded at the hinges 9055 between two housings 9000, the portable information terminal 9201 can be reversibly changed in shape from the opened state to the folded state. For example, the portable information terminal 9201 can be bent with a radius of curvature of greater than or equal to 1 mm and less than or equal to 150 mm.

The display device of one embodiment of the present invention can be used for the portable information terminal 9201. Thus, power consumption of the portable information terminal 9201 can be reduced, so that the portable information terminal 9201 can be used continuously for a long time. The reduction in power consumption of the portable information terminal 9201 allows the battery 9009 to be downsized and get lighter, and accordingly allows the portable information terminal 9201 to be downsized and get lighter. Thus, portability of the portable information terminal 9201 can be increased.

Figure 35F:
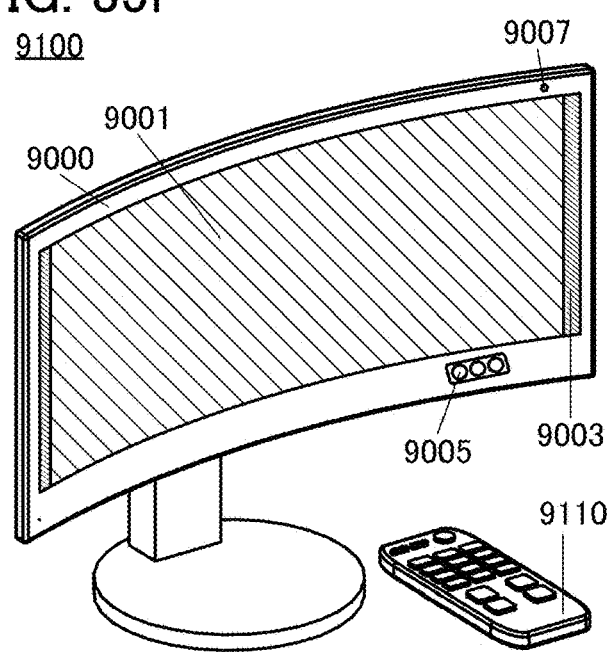

FIG. 35F is a perspective view illustrating a television device 9100. The television device 9100 can include the display portion 9001 having a large screen size of, for example, 50 inches or more, or 100 inches or more. The television device 9100 can be operated with a separate remote controller 9110 as well as the operation keys 9005. Alternatively, the display portion 9001 may include a touch sensor, and the television device 9100 may be operated by a touch on the display portion 9001 with a finger or the like. The remote controller 9110 may include a display portion for displaying data output from the remote controller 9110. With operation keys or a touch panel provided in the remote controller 9110, channels and volume can be controlled and videos displayed on the display portion 9001 can be controlled.

The display device of one embodiment of the present invention can be used for the television device 9100. Thus, power consumption of the television device 9100 can be reduced.

At least part of this embodiment can be implemented in combination with the other embodiments described in this specification as appropriate.

REFERENCE NUMERALS

10: display device, 20: layer, 21: circuit, 22: potential generation circuit, 23: potential supply circuit, 23L: potential supply circuit, 23R: potential supply circuit, 24: data driver circuit, 24a: data driver circuit, 24b: data driver circuit, 24L: data driver circuit, 24R: data driver circuit, 25: circuit, 25a: circuit, 25b: circuit, 25L: circuit, 25R: circuit, 26: wiring, 27: wiring, 28: amplifier circuit, 29: amplifier circuit, 30: layer, 31: gate driver circuit, 31a: gate driver circuit, 31b: gate driver circuit, 31L: gate driver circuit, 31R: gate driver circuit, 32: display portion, 32L: display portion, 32R: display portion, 33: pixel, 33L: pixel, 33R: pixel, 34: wiring, 40: D/A converter circuit, 41: shift register circuit, 42: register circuit, 43: latch circuit, 44: level shifter circuit, 45: pass transistor logic circuit, 50: addition circuit, 51: amplifier circuit, 52: transistor, 53: capacitor, 54: wiring, 55: transistor, 56: transistor, 57: transistor, 58: wiring, 59: wiring, 60: circuit, 61: transistor, 70: light-emitting element, 71: transistor, 73: capacitor, 74: wiring, 75: wiring, 80: liquid crystal element, 81: capacitor, 82: wiring, 83: wiring, 91: comparator circuit, 92: wiring, 93: control circuit, 94: retention circuit, 96: transistor, 97: wiring, 98: transistor, 100: resistor string, 101: resistor, 102: wiring, 103: wiring, 104: selection circuit, 105: region, 200A: transistor, 200B: transistor, 200C: transistor, 200D: transistor, 205: conductive layer, 205a: conductive layer, 205b: conductive layer, 205c: conductive layer, 212: insulating layer, 214: insulating layer, 216: insulating layer, 222: insulating layer, 224: insulating layer, 230: metal oxide, 230a: metal oxide, 230b: metal oxide, 230c: metal oxide, 240: conductive layer, 240a: conductive layer, 240b: conductive layer, 241: insulating layer, 241a: insulating layer, 241b: insulating layer, 242: conductive layer, 242a: conductive layer, 242b: conductive layer, 243a: region, 243b: region, 250: insulating layer, 252: metal oxide, 254: insulating layer, 260: conductive layer, 260a: conductive layer, 260b: conductive layer, 270: insulating layer, 271: insulating layer, 272: insulating layer, 274: insulating layer, 280: insulating layer, 281: insulating layer, 283: insulating layer, 301a: conductive layer, 301b: conductive layer, 305: conductive layer, 311: conductive layer, 313: conductive layer, 317: conductive layer, 321: lower electrode, 323: insulating layer, 325: upper electrode, 331: conductive layer, 333: conductive layer, 335: conductive layer, 337: conductive layer, 341: conductive layer, 343: conductive layer, 347: conductive layer, 351: conductive layer, 353: conductive layer, 355: conductive layer, 357: conductive layer, 361: insulating layer, 363: insulating layer, 403: element isolation layer, 405: insulating layer, 407: insulating layer, 409: insulating layer, 411: insulating layer, 421: insulating layer, 441: transistor, 443: conductive layer, 445: insulating layer, 447: semiconductor region, 449a: low-resistance region, 449b: low-resistance region, 451: conductive layer, 453: conductive layer, 455: conductive layer, 461: conductive layer, 463: conductive layer, 501: insulating layer, 601: transistor, 602: transistor, 603: transistor, 613: insulating layer, 614: insulating layer, 616: insulating layer, 622: insulating layer, 624: insulating layer, 654: insulating layer, 674: insulating layer, 680: insulating layer, 681: insulating layer, 701: substrate, 705: substrate, 712: sealant, 716: FPC, 730: insulating layer, 732: sealing layer, 734: insulating layer, 736: coloring layer, 738: light-blocking layer, 750: transistor, 760: connection electrode, 772: conductive layer, 774: conductive layer, 776: liquid crystal layer, 778: component, 780: anisotropic conductive layer, 786: EL layer, 788: conductive layer, 790: capacitor, 800: transistor, 801a: conductive layer, 801b: conductive layer, 805: conductive layer, 811: conductive layer, 813: conductive layer, 814: insulating layer, 816: insulating layer, 817: conductive layer, 821: insulating layer, 822: insulating layer, 824: insulating layer, 853: conductive layer, 854: insulating layer, 855: conductive layer, 874: insulating layer, 880: insulating layer, 881: insulating layer, 8200: head-mounted display, 8201: mounting portion, 8202: lens, 8203: main body, 8204: display portion, 8205: cable, 8206: battery, 8300: head-mounted display, 8301: housing, 8302: display portion, 8304: fixing unit, 8305: lens, 8306: battery, 9000: housing, 9001: display portion, 9003: speaker, 9005: operation key, 9006: connection terminal, 9007: sensor, 9009: battery, 9050: operation button, 9051: information, 9055: hinge, 9100: television device, 9101: portable information terminal, 9110: remote controller, 9200: portable information terminal, 9201: portable information terminal, 9251: time, 9252: operation button, 9253: content.

The invention claimed is:
1. A display device comprising a first layer and a second layer that are stacked,
   wherein the first layer comprises a potential supply circuit, a data driver circuit, and an addition circuit,
   wherein the data driver circuit comprises a pass transistor logic circuit,
   wherein the second layer comprises a display portion in which pixels are arranged in a matrix,
   wherein the display portion comprises a region overlapping with the data driver circuit and the addition circuit,
   wherein an output terminal of the pass transistor logic circuit is directly connected to an input terminal of the addition circuit,
   wherein an output terminal of the addition circuit is directly connected to the pixel,
   wherein the potential supply circuit is configured to supply a plurality of kinds of potentials to the pass transistor logic circuit,
   wherein the pass transistor logic circuit is configured to output any one of the plurality of kinds of potentials as analog data on the basis of digital data input to the pass transistor logic circuit,
   wherein the addition circuit is configured to generate third analog data by adding second analog data output in response to input of second digital data to the pass transistor logic circuit, to first analog data output in response to input of first digital data to the pass transistor logic circuit,
   wherein the addition circuit comprises a first switch, a second switch, a third switch, and a capacitor, wherein the output terminal of the pass transistor logic circuit is directly connected to one terminal of the first switch, wherein the one terminal of the first switch is electrically connected to one terminal of the second switch, wherein the other terminal of the first switch is directly connected to the pixel, wherein one terminal of the capacitor is electrically connected to the pixel, and wherein the other terminal of the capacitor is electrically connected to the other terminal of the second switch and one terminal of the third switch.

2. The display device according to claim 1,
wherein the third analog data corresponds to data obtained by converting, into analog data, digital data that has a high-order bit that is a digital value included in the first digital data and a low-order bit that is a digital value included in the second digital data.

3. The display device according to claim 1,
wherein the potential supply circuit comprises a plurality of amplifier circuits, and
wherein the plurality of amplifier circuits output different potentials to the potential supply circuit.

4. The display device according to claim 1,
wherein the pixel comprises a transistor comprising a metal oxide in a channel formation region, and
wherein the metal oxide comprises In, an element M (M is Al, Ga, Y, or Sn), and Zn.

5. An electronic device comprising:
the display device according to claim 1; and
a battery.

6. A display device comprising a first layer and a second layer that are stacked,
wherein the first layer comprises a potential supply circuit, a data driver circuit, and an addition circuit,
wherein the data driver circuit comprises a pass transistor logic circuit,
wherein the addition circuit comprises a first switch, a second switch, a third switch, a fourth switch, a fifth switch, a sixth switch, a first capacitor, a second capacitor, a comparator circuit, a control circuit, and a retention circuit,
wherein the second layer comprises a display portion in which pixels are arranged in a matrix,
wherein the display portion comprises a region overlapping with the data driver circuit and the addition circuit,
wherein an output terminal of the pass transistor logic circuit is directly connected to one terminal of the first switch,
wherein the one terminal of the first switch is electrically connected to one terminal of the second switch,
wherein the other terminal of the second switch is electrically connected to one terminal of the third switch,
wherein the other terminal of the first switch is directly connected to the pixel,
wherein the other terminal of the first switch is electrically connected to one terminal of the fourth switch, one terminal of the fifth switch, and one terminal of the sixth switch,
wherein the other terminal of the fifth switch is electrically connected to one terminal of the first capacitor,
wherein the other terminal of the sixth switch is electrically connected to one terminal of the second capacitor,
wherein the other terminal of the first capacitor and the other terminal of the second capacitor are electrically connected to the one terminal of the third switch,
wherein the other terminal of the fourth switch is electrically connected to one of a non-inverting input terminal and an inverting input terminal of the comparator circuit,
wherein the potential supply circuit is configured to supply a plurality of kinds of potentials to the pass transistor logic circuit,
wherein the pass transistor logic circuit is configured to output any one of the plurality of kinds of potentials as analog data on the basis of digital data input to the pass transistor logic circuit,
wherein the addition circuit is configured to generate and retain third analog data by adding second analog data output in response to input of second digital data to the pass transistor logic circuit, to first analog data output in response to input of first digital data to the pass transistor logic circuit,
wherein the control circuit is configured to generate a digital signal for controlling on and off of the fifth switch and on and off of the sixth switch,
wherein the control circuit is configured to update or determine a digital value of the digital signal on the basis of a signal output from the comparator circuit, in the case where the addition circuit retains the third analog data, and
wherein the retention circuit is configured to retain a determined digital value of the digital signal.

7. The display device according to claim 6,
wherein a constant potential is supplied to the other terminal of the third switch,
wherein the first analog data is written to the addition circuit when the first and third switches are turned on and the second switch is turned off, and
wherein the second analog data is written to the addition circuit and the third analog data is generated when the second switch is turned on and the first and third switches are turned off after the first analog data is written to the addition circuit.

8. The display device according to claim 6,
wherein the third analog data corresponds to data obtained by converting, into analog data, digital data that has a high-order bit that is a digital value included in the first digital data and a low-order bit that is a digital value included in the second digital data.

9. The display device according to claim 6,
wherein the potential supply circuit comprises a plurality of amplifier circuits, and
wherein the plurality of amplifier circuits output different potentials to the potential supply circuit.

10. The display device according to claim 6,
wherein the pixel comprises a transistor comprising a metal oxide in a channel formation region, and
wherein the metal oxide comprises In, an element M (M is Al, Ga, Y, or Sn), and Zn.

11. An electronic device comprising:
the display device according to claim 6; and
a battery.

12. A display device comprising a first layer and a second layer that are stacked,
wherein the first layer comprises a potential supply circuit, a data driver circuit, and an addition circuit,
wherein the data driver circuit comprises a pass transistor logic circuit,
wherein the second layer comprises a gate driver circuit and a display portion in which pixels are arranged in a matrix, wherein the display portion comprises a region overlapping with the data driver circuit and the addition circuit, wherein an output terminal of the pass transistor logic circuit is directly connected to an input terminal of the addition circuit, wherein the potential supply circuit is electrically connected to the pass transistor logic circuit, wherein the pass transistor logic circuit is configured to output any one of a plurality of kinds of potentials as analog data on the basis of digital data input to the pass transistor logic circuit, wherein the pixel is electrically connected to the gate driver circuit through a gate line and electrically connected to an output terminal of the addition circuit through a data line, and wherein the gate driver circuit and the potential supply circuit overlap with each other.

13. The display device according to claim 12, wherein the addition circuit comprises a first switch, a second switch, a third switch, and a capacitor, wherein the output terminal of the pass transistor logic circuit is directly connected to one terminal of the first switch, wherein the one terminal of the first switch is electrically connected to one terminal of the second switch, wherein the other terminal of the first switch is directly connected to the pixel, wherein one terminal of the capacitor is electrically connected to the pixel, and wherein the other terminal of the capacitor is electrically connected to the other terminal of the second switch and one terminal of the third switch.

* * * * *